United States Patent
Arzt et al.

(10) Patent No.: US 10,005,103 B2
(45) Date of Patent: Jun. 26, 2018

(54) METHOD FOR PRODUCING FINELY STRUCTURED SURFACES

(75) Inventors: Eduard Arzt, Saarbruecken (DE); Elmar Kroner, Saarbruecken (DE); Peter William de Oliveira, Saarbruecken (DE); Ebru Devrim Sam, Sahrayicedit-Istanbul (TR); Florian Buesch, Speyer (DE); Dieter Urban, Speyer (DE); Reinhold Schwalm, Wachenheim (DE); Benedikt Blaesi, Freiburg (DE); Michael Nitsche, Merzhausen (DE); Hannes Spiecker, Berlin (DE); Claas Mueller, Freiburg (DE)

(73) Assignee: Leibniz-Institut fuer Neue Materialien gemeinnuetzige GmbH, Saarbruecken (DE)

(*) Notice: Subject to any disclaimer, the term of this patent is extended or adjusted under 35 U.S.C. 154(b) by 0 days. days.

(21) Appl. No.: 13/808,105

(22) PCT Filed: Jul. 6, 2011

(86) PCT No.: PCT/EP2011/061440
§ 371 (c)(1),
(2), (4) Date: Jan. 3, 2013

(87) PCT Pub. No.: WO2012/004319
PCT Pub. Date: Jan. 12, 2012

(65) Prior Publication Data
US 2013/0101796 A1    Apr. 25, 2013

(30) Foreign Application Priority Data
Jul. 7, 2010  (DE) ........................ 10 2010 026 490

(51) Int. Cl.
*B05D 3/12* (2006.01)
*B82Y 10/00* (2011.01)
(Continued)

(52) U.S. Cl.
CPC ................ *B05D 3/12* (2013.01); *B82Y 10/00* (2013.01); *B82Y 40/00* (2013.01); *C09J 7/00* (2013.01);
(Continued)

(58) Field of Classification Search
CPC ....... B82Y 10/00; B82Y 40/00; G03F 7/0035; G03F 7/0002; Y10T 428/24479; B05D 3/12; C09J 7/00; C09J 2201/626
(Continued)

(56) References Cited

U.S. PATENT DOCUMENTS 4,066,494 A  1/1978  Scharf et al.
4,421,602 A  12/1983  Brunnmueller et al.
(Continued)

FOREIGN PATENT DOCUMENTS

DE  2434816 A1  2/1976
DE  19618720 A1  11/1996
(Continued)

OTHER PUBLICATIONS

English abstract of WO2003099951 A2.
(Continued)

*Primary Examiner* — Robert S Walters, Jr.
(74) *Attorney, Agent, or Firm* — Cahn & Samuels, LLP

(57) ABSTRACT

A method for producing finely structured surfaces, in particular in plastics, includes a) applying at least one coating compound on at least one substrate; b) forming a fine structure by a die, which has the negative of a fine structure, c) curing the resultant finely structured coating compound, obtaining a substantially cured coating; and d) separating the
(Continued)

finely structured coating from the die, wherein steps d) and e) can also be carried out in the reverse order.

17 Claims, 25 Drawing Sheets

(51) Int. Cl.
| | | |
|---|---|---|
| *B82Y 40/00* | (2011.01) | |
| *G03F 7/00* | (2006.01) | |
| *C09J 7/00* | (2018.01) | |

(52) U.S. Cl.
CPC .......... *G03F 7/0002* (2013.01); *G03F 7/0035* (2013.01); *C09J 2201/626* (2013.01); *Y10T 428/24479* (2015.01)

(58) Field of Classification Search
USPC ........................................................ 427/510
See application file for complete search history.

(56) References Cited

U.S. PATENT DOCUMENTS

| | | | |
|---|---|---|---|
| 4,710,523 | A | 12/1987 | Koeckert, Jr. |
| 5,015,524 | A | 5/1991 | Kobayashi et al. |
| 5,225,088 | A | 7/1993 | Moench et al. |
| 5,650,215 | A | 7/1997 | Mazurek et al. |
| 6,500,878 | B1 * | 12/2002 | Reich et al. .................. 522/100 |
| 2002/0100691 | A1 | 8/2002 | Bonivert et al. |
| 2005/0085085 | A1 | 4/2005 | Borodovsky |
| 2005/0271869 | A1 | 12/2005 | Jackson |
| 2006/0078725 | A1 | 4/2006 | Fearing |
| 2007/0166548 | A1 * | 7/2007 | Gruber et al. ............. 428/411.1 |
| 2009/0114618 | A1 | 5/2009 | Zhang et al. |
| 2009/0256287 | A1 * | 10/2009 | Fu et al. ....................... 264/447 |

FOREIGN PATENT DOCUMENTS

| | | |
|---|---|---|
| DE | 19803787 A1 | 8/1999 |
| DE | 19826712 A1 | 12/1999 |
| DE | 19913353 A1 | 9/2000 |
| DE | 10003187 A1 | 2/2001 |
| DE | 19957900 A1 | 6/2001 |
| DE | 10001135 A1 | 7/2001 |
| DE | 10003186 A1 | 8/2001 |
| DE | 10013186 A1 | 9/2001 |
| DE | 10013187 A1 | 10/2001 |
| DE | 112004001942 T5 | 8/2006 |
| DE | 102007021249 A1 | 11/2008 |
| EP | 0007508 A2 | 2/1980 |
| EP | 0057474 A2 | 8/1982 |
| EP | 0071050 A1 | 2/1983 |
| EP | 0092269 A1 | 10/1983 |
| EP | 0411400 A2 | 2/1991 |
| EP | 0495751 A1 | 7/1992 |
| EP | 0615980 A2 | 9/1994 |
| GB | 1509967 A | 5/1978 |
| JP | H03135501 A | 6/1991 |
| JP | 2006274279 A | 10/2006 |
| JP | 2007118442 A | 5/2007 |
| JP | 2009283093 A | 12/2009 |
| JP | 2010018644 A | 1/2010 |
| WO | 9402560 A1 | 2/1994 |
| WO | 94/12560 A1 | 6/1994 |
| WO | 9414873 A1 | 7/1994 |
| WO | 95/11945 A1 | 5/1995 |
| WO | 9725367 A1 | 7/1997 |
| WO | 9833761 A1 | 8/1998 |
| WO | 200149776 A2 | 7/2001 |
| WO | 2003099951 A2 | 12/2003 |
| WO | 2008076390 A1 | 6/2008 |
| WO | 2008124180 A1 | 10/2008 |
| WO | 2009002644 A1 | 12/2008 |
| WO | 2009053714 A1 | 4/2009 |
| WO | 2009128946 A1 | 10/2009 |
| WO | 2009158631 A1 | 12/2009 |

OTHER PUBLICATIONS

English abstract of DE10001135 A1.
English abstract of DE102007021249 A1.
English abstract of DE10003186 A1.
English abstract of DE10003187 A1.
International application No. PCT/EP2011/061440, English translation of International Preliminary Report on Patentability, dated Jan. 8, 2013.
English Abstract of EP 1513904A2 (equivalent of WO 2003099951).
English Abstract of EP0071050A1.
English Abstract of EP0411400A2.
English Abstract of WO9414873A1.
English Abstract of WO9725367A1.
English Abstract of EP0007508A2.
English Abstract of EP0057474A2.
English Abstract of DE 19618720A1.
English Abstract of EP 0615980A2.
English Abstract of DE 19826712A1.
English Abstract of DE 19913353A1.
English Abstract of WO 9833761A1.
English Abstract of DE 19957900A1.
English Abstract of EP 0092269A1.
Wicks et al., "Multistep Chemistry in Thin Films; The Challenges of Blocked Isocyanates," Progress in Organic Coatings, 2001, vol. 43., pp. 131-140.
Wicks et al., "Blocked Isocyanates III: Part A. Mechanisms and Chemistry," Progress in Organic Coatings, 1999, vol. 36, pp. 148-172.
Cantow et al., "Advances in Polymer Science," 1974, vol. 14, Springer Berlin.
Coyle et al., "The Fluid Dynamics of Reverse Roll Coating," AIChE Journal, Feb. 1990, vol. 36, No. 2, pp. 161-174.
Masson, "Decomposition Rates of Organic Free Radical Initiators," Polymer Handbook, 1989.
Dietliker, KK., "Chemistry & Technology of UV & EB Formulation for Coatings, Inks & Paints," 1991, vol. 3.
Keller et al., "Photography", Ullmanns Encyclopedia of Industrial Chemistry, 2005, vol. 26.
Wicks et al., "Blocked Isocyanates III: Part B. Uses and applications of blocked isocyanates," Progress in Organic Coatings, 2001, vol. 41, pp. 1-83.
English Abstract of DE 10013186.
English Abstract of DE 10013187.
English Abstract of WO 94/12560.
English Abstract of EP0495751.
English Abstract of DE19803787.
English translation of Japanese Office Action in JP 2013-517380, dated Apr. 16, 2015.
English Abstract of JP 2007118442.
English Abstract of JP 2009283093.
Notice of Reasons for Revocation, Japanese Patent Office, Opposition 2016-70081 in Patent JP 5889294, dated Dec. 14, 2016.
Experimental Data submitted in Opposition 2016-70081 in Patent JP 5889294, dated 2015.
Partial English translation of Experimental Data submitted in Opposition 2016-70081 in Patent JP 5889294.
English Abstract of JP2006274279 (A).
English Abstract of JP2010018644 (A).
English Abstract of JPH03135501 (A).
Product brochure, http://www.shin-nakamura.com/products/monomer-oligomer.htmil, printed on Sep. 14, 2016.
Product brochure, FANCRYL, Hitachi Chemical: Working on Wonders, pp. 1-24, 2011.

* cited by examiner

METHOD FOR PRODUCING FINELY STRUCTURED SURFACES

This patent application is a U.S. national stage application of PCT international application PCT/EP2011/061440 filed on 6 Jul. 2011 and claims priority of German patent document 10 2010 026 490.3 filed on 7 Jul. 2010, the entirety of which is incorporated herein by reference.

BACKGROUND OF THE INVENTION

The present invention relates to a method for producing finely structured surfaces, in particular for influencing adhesion, the coatings produced in this way and the use thereof, and a method for producing dies for producing said surfaces.

It is known that finely structured surfaces possess increased adhesive capacity. Such structures and methods for producing them are described for example in EP 1 513 904 B1, WO 01/49776 A2 or WO 2009/053714 A1.

A particular capacity of such surfaces is their dry adhesiveness. Dry adhesiveness means, in the context of this text, the development of adhesive forces between surfaces without adhesion-promoting substances, such as adhesives. These adhesive joints are characterized by the fact that they can be removed again without residues.

Adhesive systems of this kind are often based on structuring of the surface. However, it is necessary to distinguish between systems that require a special counter-structure, e.g. hooks and eyes, and systems that can develop adhesive forces with any surfaces.

Adhesive systems of this kind are for example also known in nature, e.g. in the case of gecko feet, or insects (see also WO 01/49776 A2). It is assumed that in such systems the adhesive forces are based on van der Waals forces. The structuring of the surface leads, on contact, to a very marked increase in contact area, and therefore also in the strength of the adhesive forces that develop on contact.

Such surfaces are generally finely structured. This means that they have depressions or projections with a structuring of less than a millimeter. Advantageously they are microstructured surfaces. This means that the structure of the surface, i.e. the projections and/or depressions, have at least one dimension in the region of at least 100 nm, preferably at least 150 nm, especially preferably at least 200 nm, quite especially preferably at least 250 nm and under 1 mm, preferably under 750 µm, especially preferably under 500 µm, quite especially preferably under 250 µm, especially under 100 µm, in particular under 50 µm, even under 30 µm and quite particularly under 20 µm. Advantageously they have at least two dimensions each independent of one another in this range.

These finely structured surfaces can be produced simply and economically using a die for forming polymers or polymer blends.

The polymer blend must fulfill the following properties/requirements:
1. low viscosity of the polymer blend, to permit rapid, complete and uniform flow into the die;
2. preferably a radiation-curing polymer, for immediate and particularly quick curing. With the planned contact times between substrate and structure master (die), thermal or chemical curing is less preferable, if conceivable at all;
3. high molding fidelity and low shrinkage of the material from the state before to the state after radiation curing, as precise structure duplication (i.e. duplication of the structure of the die) is particularly important for the final properties of the substrate surface structure;
4. hardness and elasticity of the cured polymer material, in order to obtain an optimal dry-adhesive surface structure.

It is therefore a question of a balance between the viscosity of the polymer blend during application of the polymer blend and the elasticity of the cured polymer blend.

However, it must be borne in mind that low viscosity is mostly achieved with low-molecular polymerizable compounds. However, these have a high density of polymerizable groups, and thus lead to a high degree of crosslinking in the polymer, which produces a high hardness, which as a rule corresponds to high brittleness, so that structures cured in this way can no longer be separated from the die, or during separation break away from the fine structures of the die.

However, lowering the density of polymerizable groups, and thus increasing the molar weight, leads to an increase in viscosity, with the following disadvantages:

A method is known from DE 100 01 135 A1 for producing finely structured surfaces, in which a fine structure is embossed in a radiation-curing thixotropic coating compound with a viscosity above 30 Pas, the embossed surface is detached from the embossing device and is radiation-cured.

A disadvantage is that with these high-viscosity coating compounds, fine structures cannot be filled completely, so that only flat structures are formed by a die.

This can be seen from the structure depicted in FIG. 1 of DE 100 01 135 A1, which with a base diameter of about 1.4 µm only has a height of about 150 nm, and thus an aspect ratio (AR; ratio of the height of the structure to the diameter) of only 0.11.

A method is known from DE 10 2007 021249 A1 for producing structured surfaces, in which a coating compound is cured with radiation, wherein a layer with a thickness of about 1 µm remains uncured on the surface owing to oxygen inhibition, and this is then structured by impressing a die and can be finally cured in a second step.

A disadvantage with this method is that, despite the oxygen inhibition, the uppermost layer is not uncured, but is at least partially cured. This causes an increase in viscosity of the coating compound in this uppermost layer, with all the disadvantages already described above for DE 100 01 135 A1.

The problem to be solved by the invention is to provide a method by which finely structured surfaces with high aspect ratios can be produced simply and economically. In addition, a method is to be provided that makes it possible for the dies for producing these structures to be obtained simply, also in particular for producing hierarchic dies.

SUMMARY OF INVENTION

The problem is solved by the invention with the features of the independent claims. Advantageous further embodiments of the invention are characterized in the subclaims. The wording of all claims is hereby made by reference to the contents of this description.

The invention also comprises all sensible and especially all mentioned combinations of independent and/or dependent claims.

Individual steps of the method are described in more detail in the following. The steps need not necessarily be carried out in the order given, and the method to be described can also have other steps that are not mentioned.

The problem is solved by a method for producing finely structured coated surfaces, preferably with an aspect ratio of at least 0.5, for influencing adhesion comprising the steps:

a) applying at least one coating compound on at least one substrate;

b) forming a fine structure by means of a die, which has the negative of a fine structure, wherein b1) the die is pressed against the coating compound on the substrate or b2) the substrate from step a) contains the die;

c) curing the resultant finely structured coating compound, obtaining a substantially cured coating;

d) separating the finely structured coating from the die, wherein steps d) and c) can also be carried out in the reverse order, and wherein the coating compound, in the solvent-free state before application on the substrate, has a viscosity [rotary viscosimetry according to DIN 53018-1 with plate/cone geometry at 25° C.; temperature control: Peltier; measuring device: HC 60/1 at a shear rate (shear gradient) D between 10 and 1000, preferably 400 $1*s^{-1}$] under 10 Pas, preferably under 1 Pas, especially preferably between 20 mPas and 1 Pas, and the cured coating has an elastic modulus [indentation with Berkovich tip, load between 0.1 and 1 mN depending on modulus of the test specimen; indentation time: 10 s; holding time 30 s and retraction time 10 s, calibration on polycarbonate] of at least 1 and up to 2000, preferably 1 to 1000, especially preferably 2 to 100 MPa.

In another embodiment of the invention the viscosities of the coating compounds in the solvent-free state in the range from 10 mPas to 600 mPas, preferably up to 500 mPas, especially preferably up to 400 mPas, quite especially preferably up to 300 mPas and especially up to 250 mPas and the elastic modulus of the cured coating compound is between 2 and 20 MPa.

These coating compounds make it possible for the die to be filled completely, retaining the structure on separating from the die. Otherwise there is a risk of the structure collapsing or flowing.

With the aforementioned viscosities of the solvent-free coating compounds and elastic moduli of the cured coating compounds, it is possible for the first time to obtain microstructures with the required aspect ratios preferred according to the invention of at least 0.5, preferably at least 0.7, especially preferably at least 0.9, quite especially preferably at least 1, especially at least 1.3 and in particular at least 1.5.

The upper limit for the aspect ratio is, independently of that, preferably 100, 50, 20, 10 or 5. In the case of hierarchic structures the aspect ratio shows the aspect ratio of the largest step in the hierarchy.

A coating compound means, in the context of this text, a substantially unpolymerized liquid compound or mixture of compounds with a further specified viscosity, which can be polymerized by any mechanism, for example by an initiator contained in the coating compound or by an external influence. The polymerization can be for example a polycondensation or ionic or radical, preferably cationic or radical, especially preferably radical polymerization. Polymerization means in this case a multiplication of the average molecular weight of the compound.

A coating means, in the context of this text, the polymer obtainable from a coating compound by polymerization, as a rule having an average molecular weight of at least ten times, preferably at least twenty times, especially preferably at least fifty times that of the compound used.

Viscosity means, in the context of this text, unless stated otherwise, the result of measurement according to DIN 53018-1 [rotary viscosimetry with plate/cone geometry at 25° C.; temperature control: Peltier; measuring device: HC 60/1 at a shear gradient D of 10-1000 $1*s^{-1}$]. During determination of the viscosity, it is necessary to ensure that any solvent that might be contained in the coating compound is substantially removed, i.e. any solvent possibly contained in the coating compound is removed to at least 90 wt %, preferably to at least 95 wt %, especially preferably to at least 98 wt % and quite especially preferably to at least 99 wt %. Solvents are the highly volatile constituents of a coating compound, which are not incorporated in the polymer after the polymerization mechanism and can essentially be removed by drying the coating compound at temperatures of up to 100° C. for a period up to 1 hour.

Elastic modulus means, in the context of this text, an indentation with the Berkovich tip, load between 0.1 and 1 mN depending on the modulus of the test specimen. The elastic modulus is determined on an unstructured specimen of the material that is to be used for the structuring.

In a preferred embodiment of the present invention, the cured coating has a glass transition temperature (determined according to ASTM standard D3418-03 with a heating rate of 20° C./min) of at least room temperature, preferably at least 25° C., especially preferably at least 30° C., quite especially preferably at least 35° C. and in particular at least 40° C.

The coating compound applied in step a) according to the invention can be curable by any curing mechanism, for example it can be physically curing, thermally curing, chemically curing or radiation-curing, preferably the coating compound is chemically curing or radiation-curing, especially preferably radiation-curing.

Physical curing, which is the least preferred, means simple solvent evaporation with formation of the coating.

Thermal curing means a curing mechanism that can be attributed to a temperature above room temperature. This can for example be the formation of radicals or ions, preferably radicals from an initiator, which decomposes at the elevated temperatures and thus initiates radical or ionic polymerization. Examples of these thermally activatable initiators are those that have a half-life at 80° C. of less than 100 hours, as described in "Polymer Handbook", 2nd ed., Wiley & Sons, New York.

Chemical curing means the reaction of various components with complementary reactive groups, for example in the sense of a polycondensation.

Preferred coating compounds curing by this mechanism are single-component or two-component coating compounds from polyisocyanates, which can optionally be blocked, and polyols and siloxane structures.

Examples of the latter are silicone, polydimethylsiloxane (PDMS), e.g. Sylgard® 184 from the company Dow Corning, and polyvinylsiloxane.

Examples of polyisocyanates in the former are as a rule characterized as follows:

The average NCO functionality of such compounds is as a rule at least 1.8 and can be up to 8, preferably 2 to 5 and especially preferably 2.4 to 4.

The content of isocyanate groups after oligomerization, calculated as NCO=42 g/mol, is, unless stated otherwise, as a rule from 5 to 25 wt %.

Preferably the polyisocyanates are the following compounds:

1) Polyisocyanates of aromatic, aliphatic and/or cycloaliphatic diisocyanates having isocyanurate groups. The corresponding aliphatic and/or cycloaliphatic isocyanato-isocyanurates and especially those based on hexamethylene diisocyanate and isophorone diisocyanate are especially preferred. The isocyanurates present are in particular tris-isocyanatoalkyl or tris-isocyanatocycloalkyl isocyanurates, which are cyclic trimers of the diisocyanates, or mixtures with their higher homologs having more than one isocyanurate ring. The isocyanato-isocyanurates generally have an NCO content from 10 to 30 wt %, especially 15 to 25 wt % and an average NCO functionality from 2.6 to 8.

2) Polyisocyanates having uretdione groups with aromatically, aliphatically and/or cycloaliphatically bound isocyanate groups, preferably aliphatically and/or cycloaliphatically bound and especially those derived from hexamethylene diisocyanate or isophorone diisocyanate. Uretdione diisocyanates are cyclic dimerization products of diisocyanates.

The polyisocyanates having uretdione groups are, in the context of this invention, obtained mixed with other polyisocyanates, especially those stated under 1). For this, the diisocyanates can be reacted under reaction conditions in which both uretdione groups and the other polyisocyanates are formed, or the uretdione groups are formed first and these are then converted to the other polyisocyanates or the diisocyanates are converted first to the other polyisocyanates and these are then converted to products containing uretdione groups.

3) Polyisocyanates having biuret groups with aromatically, cycloaliphatically or aliphatically bound, preferably cycloaliphatically or aliphatically bound isocyanate groups, especially tris-(6-isocyanatohexyl)biuret or its mixtures with its higher homologs. These polyisocyanates having biuret groups generally have an NCO content from 18 to 22 wt % and an average NCO functionality from 2.8 to 6.

4) Polyisocyanates having urethane and/or allophanate groups with aromatically, aliphatically or cycloaliphatically bound, preferably aliphatically or cycloaliphatically bound isocyanate groups, such as for example by reaction of excess amounts of diisocyanate, for example hexamethylene diisocyanate or isophorone diisocyanate, with mono- or polyhydric alcohols. These polyisocyanates having urethane and/or allophanate groups generally have an NCO content from 12 to 24 wt % and an average NCO functionality from 2.5 to 4.5. These polyisocyanates having urethane and/or allophanate groups can be produced uncatalyzed or preferably in the presence of catalysts, for example ammonium carboxylates or hydroxides, or allophanatization catalysts, e.g. Zn(II) compounds in each case in the presence of mono-, di- or polyhydric, preferably monohydric alcohols.

5) Polyisocyanates containing oxadiazinetrione groups, preferably derived from hexamethylene diisocyanate or isophorone diisocyanate. These polyisocyanates containing oxadiazinetrione groups can be obtained from diisocyanate and carbon dioxide.

6) Polyisocyanates containing iminooxadiazinedione groups, preferably derived from hexamethylene diisocyanate or isophorone diisocyanate. These polyisocyanates containing iminooxadiazinedione groups can be produced from diisocyanates using special catalysts.

7) Uretonimine-modified polyisocyanates.

8) Carbodiimide-modified polyisocyanates.

9) Hyperbranched polyisocyanates, such as are known for example from DE 100 13 186 A1 or DE 100 13 187 A1.

10) Polyurethane-polyisocyanate prepolymers, from di- and/or polyisocyanates with alcohols.

11) Polyurea-polyisocyanate prepolymers.

12) After they have been prepared, polyisocyanates 1)-11), preferably 1), 3), 4) and 6) can be transformed into polyisocyanates having biuret groups or urethane/allophanate groups with aromatically, cycloaliphatically or aliphatically bound, preferably (cyclo)aliphatically bound isocyanate groups. Biuret groups are formed for example by adding water or by reacting with amines. Urethane and/or allophanate groups are formed by reaction with mono-, di- or polyhydric, preferably monohydric alcohols, optionally in the presence of suitable catalysts. These polyisocyanates having biuret or urethane/allophanate groups generally have an NCO content from 18 to 22 wt % and an average NCO functionality from 2.8 to 6.

13) Hydrophilically modified polyisocyanates, i.e. polyisocyanates which, in addition to the groups described under 1-12, contain those that are formed formally by adding molecules with NCO-reactive groups and hydrophilizing groups onto the isocyanate groups of the above molecules. The latter are nonionic groups such as alkyl-polyethylene oxide and/or ionic groups that are derived from phosphoric acid, phosphonic acid, sulfuric acid or sulfonic acid, or salts thereof.

14) Modified polyisocyanates for Dual Cure applications, i.e. polyisocyanates which, in addition to the groups described under 1-12, contain those that are formed formally by adding molecules with NCO-reactive groups and groups crosslinkable by UV or actinic radiation onto the isocyanate groups of the above molecules. These molecules are for example hydroxyalkyl(meth)acrylates and other hydroxy-vinyl compounds.

The diisocyanates or polyisocyanates listed above can also be in at least partially blocked form.

Classes of compounds used for blocking are described in D. A. Wicks, Z. W. Wicks, Progress in Organic Coatings, 36, 148-172 (1999), 41, 1-83 (2001) and 43, 131-140 (2001).

Examples of classes of compounds used for blocking are phenols, imidazoles, triazoles, pyrazoles, oximes, N-hydroxyimides, hydroxybenzoic acid esters, secondary amines, lactams, CH-acid cyclic ketones, malonic acid esters or alkyl acetoacetates.

In a preferred embodiment of the present invention the polyisocyanate is selected from the group consisting of isocyanurates, biurets, urethanes and allophanates, preferably from the group consisting of isocyanurates, urethanes and allophanates, especially preferably from the group consisting of isocyanurates and allophanates, and in particular it is a polyisocyanate containing isocyanurate groups.

The polyols can be for example polyacrylate polyols, polyester polyols, polyether polyols, polyurethane polyols; polyurea polyols; polyester-polyacrylate polyols; polyester-polyurethane polyols; polyurethane-polyacrylate polyols, polyurethane-modified alkyd resins; fatty acid-modified polyester-polyurethane polyols, copolymers with allyl ethers, graft polymers from the stated groups of substances with e.g. different glass transition temperatures, and mixtures of the stated polyols. Polyacrylate polyols, polyester polyols and polyether polyols are preferred.

Preferred OH numbers, measured according to DIN 53240-2, are 40-350 mg KOH/g solid resin for polyesters, preferably 80-180 mg KOH/g solid resin, and 15-250 mg KOH/g solid resin for polyacrylatols, preferably 80-160 mg KOH/g.

In addition, the polyols can have an acid number according to DIN EN ISO 3682 of up to 200 mg KOH/g, preferably up to 150 and especially preferably up to 100 mg KOH/g.

Polyacrylate polyols preferably have a molecular weight $M_n$ of at least 1000, especially preferably at least 2000 and quite especially preferably at least 5000 g/mol.

The molecular weight $M_n$ can in principle have no upper limit, and is preferably up to 200 000, especially preferably up to 100 000, quite especially preferably up to 80 000 and especially up to 50 000 g/mol.

The hydroxyl number is essentially due to incorporation of monomers bearing hydroxyl groups by polymerization.

These can be for example monoesters of α,β-unsaturated carboxylic acids, such as acrylic acid, methacrylic acid (for which the abbreviated designation "(meth)acrylic acid" is used in this text), with diols or polyols, which preferably have 2 to 20 carbon atoms and at least two hydroxyl groups, such as ethylene glycol, diethylene glycol, triethylene glycol, 1,2-propylene glycol, 1,3-propylene glycol, 1,1-dimethyl-1,2-ethanediol, dipropylene glycol, triethylene glycol, tetraethylene glycol, pentaethylene glycol, tripropylene glycol, 1,4-butanediol, 1,5-pentanediol, neopentyl glycol, hydroxypivalic acid neopentyl glycol ester, 2-ethyl-1,3-propanediol, 2-methyl-1,3-propanediol, 2-butyl-2-ethyl-1,3-propanediol, 1,6-hexanediol, 2-methyl-1,5-pentanediol, 2-ethyl-1,4-butanediol, 2-ethyl-1,3-hexanediol, 2,4-diethyl-octane-1,3-diol, 2,2-bis(4-hydroxycyclohexyl)propane, 1,1-, 1,2-, 1,3- and 1,4-bis(hydroxymethyl)cyclohexane, 1,2-, 1,3- or 1,4-cyclohexanediol, glycerol, trimethylolethane, trimethylolpropane, trimethylolbutane, pentaerythritol, ditrimethylolpropane, dipentaerythritol, sorbitol, mannitol, diglycerol, threitol, erythritol, adonite (ribitol), arabitol (lyxitol), xylitol, dulcitol (galactitol), maltitol, isomalt, poly-THF with a molar weight between 162 and 4500, preferably 250 to 2000, poly-1,3-propanediol or polypropylene glycol with a molar weight between 134 and 2000 or polyethylene glycol with a molar weight between 238 and 2000.

2-Hydroxyethyl acrylate, 2-hydroxyethyl methacrylate, 2- or 3-hydroxypropyl acrylate, 1,4-butanediolmonoacrylate or 3-(acryloyloxy)-2-hydroxypropyl acrylate and especially preferably 2-hydroxyethyl acrylate and/or 2-hydroxyethyl methacrylate are preferred.

The monomers bearing hydroxyl groups are used in the copolymerization mixed with other polymerizable, preferably radically polymerizable monomers, preferably those that consist to more than 50 wt % of $C_1$-$C_{20}$-, preferably $C_1$- to $C_4$-alkyl(meth)acrylate, (meth)acrylic acid, vinyl aromatics with up to 20 carbon atoms, vinyl esters of carboxylic acids containing up to 20 carbon atoms, vinyl halides, nonaromatic hydrocarbons with 4 to 8 carbon atoms and 1 or 2 double bonds, unsaturated nitriles and mixtures thereof. Polymers that consist to more than 60 wt % of $C_1$-$C_{10}$-alkyl (meth)acrylates, styrene and its derivatives, vinylimidazole or mixtures thereof are especially preferred.

Furthermore, the polymers can optionally contain further monomers, e.g. (meth)acrylic acid glycidyl epoxy esters, ethylenically unsaturated acids, especially carboxylic acids, acid anhydrides or acid amides.

Other polyols are for example polyesterols, such as can be obtained by condensation of polycarboxylic acids, especially dicarboxylic acids with polyols, especially diols. In order to ensure a functionality of the polyester polyols that is suitable for the polymerization, triols, tetrols etc., as well as tri-acids, etc., are also used partially.

Polyester polyols are known e.g. from Ullmanns Encyklopädie der technischen Chemie, 4th edition, Vol. 19, p. 62 to 65. Polyester polyols that are obtained by reaction of dihydric alcohols with divalent carboxylic acids are preferably used. Instead of the free polycarboxylic acids, it is also possible to use the corresponding polycarboxylic acid anhydrides or corresponding polycarboxylic acid esters of lower alcohols or mixtures thereof for producing the polyester polyols. The polycarboxylic acids can be aliphatic, cycloaliphatic, aromatic or heterocyclic and optionally can be substituted e.g. with halogen atoms, and/or can be unsaturated. The following may be mentioned as examples:

Oxalic acid, maleic acid, fumaric acid, succinic acid, glutaric acid, adipic acid, sebacic acid, dodecane diacid, o-phthalic acid, isophthalic acid, terephthalic acid, trimellitic acid, azelaic acid, 1,4-cyclohexane-dicarboxylic acid or tetrahydrophthalic acid, suberic acid, azelaic acid, phthalic acid anhydride, tetrahydrophthalic acid anhydride, hexahydrophthalic acid anhydride, tetrachlorophthalic acid anhydride, endomethylene tetrahydrophthalic acid anhydride, glutaric acid anhydride, maleic acid anhydride, dimeric fatty acids, their isomers and hydrogenation products and esterifiable derivatives, such as anhydrides or dialkyl esters, for example $C_1$-$C_4$-alkyl esters, preferably methyl-, ethyl- or n-butyl esters, of the stated acids are used. Dicarboxylic acids of general formula $HOOC-(CH_2)_y-COOH$, in which y is a number from 1 to 20, preferably an even number from 2 to 20, are preferred, and succinic acid, adipic acid, sebacic acid and dodecane-dicarboxylic acid are especially preferred.

The following may come into consideration as polyhydric alcohols for producing the polyesterols: 1,2-propanediol, ethylene glycol, 2,2-dimethyl-1,2-ethanediol, 1,3-propanediol, 1,2-butanediol, 1,3-butanediol, 1,4-butanediol, 3-methylpentane-1,5-diol, 2-ethylhexane-1,3-diol, 2,4-diethyloctane-1,3-diol, 1,6-hexanediol, poly-THF with a molecular weight between 162 and 4500, preferably 250 to 2000, poly-1,3-propanediol with a molecular weight between 134 and 1178, poly-1,2-propanediol with a molecular weight between 134 and 898, polyethylene glycol with a molecular weight between 106 and 458, neopentyl glycol, hydroxypivalic acid neopentyl glycol ester, 2-ethyl-1,3-propanediol, 2-methyl-1,3-propanediol, 2,2-bis(4-hydroxycyclohexyl) propane, 1,1-, 1,2-, 1,3- and 1,4-cyclohexanedimethanol, 1,2-, 1,3- or 1,4-cyclohexanediol, trimethylolbutane, trimethylolpropane, trimethylolethane, neopentyl glycol, pentaerythritol, glycerol, ditrimethylolpropane, dipentaerythritol, sorbitol, mannitol, diglycerol, threitol, erythritol, adonite (ribitol), arabitol (lyxitol), xylitol, dulcitol (galactitol), maltitol or isomalt, which can optionally be alkoxylated as described above.

Alcohols of general formula $HO-(CH_2)_x-OH$, in which x is a number from 1 to 20, preferably an even number from 2 to 20, are preferred. Ethylene glycol, butane-1,4-diol, hexane-1,6-diol, octane-1,8-diol and dodecane-1,12-diol are preferred. Neopentyl glycol is further preferred.

Consideration may also be given to polycarbonate diols, such as can be obtained for example by reaction of phosgene with an excess of the low-molecular alcohols named as structural components for the polyester polyols.

Lactone-based polyester diols are also suitable, which are homo- or copolymers of lactones, preferably adducts of lactones on suitable bifunctional initiator molecules having hydroxyl end groups. As lactones, consideration is preferably given to those that are derived from compounds of the general formula $HO-(CH_2)_z-COOH$, in which z is a number from 1 to 20 and an H-atom of a methylene unit can also be substituted with a $C_1$- to $C_4$-alkyl residue. Examples are ε-caprolactone, β-propiolactone, γ-butyrolactone and/or methyl-ε-caprolactone, 4-hydroxybenzoic acid, 6-hydroxy-2-naphthalenic acid or pivalolactone and mixtures thereof. Suitable initiator components are e.g. the low-molecular dihydric alcohols mentioned above as structural component for the polyester polyols. The corresponding polymers of ε-caprolactone are especially preferred. Also lower polyester diols or polyether diols can also be used as initiators for producing the lactone polymers. Instead of the polymers of lactones, it is also possible to use the corresponding, chemically equivalent polycondensates of the hydroxycarboxylic acids corresponding to the lactones.

Furthermore, polyetherols that are produced by adding ethylene oxide, propylene oxide or butylene oxide onto H-active components are also suitable as polymers. Polycondensates from butanediol are also suitable.

Furthermore, hydroxyfunctional carboxylic acids can be used, for example dimethylolpropionic acid or dimethylolbutanoic acid.

The polymers can of course also be compounds with primary or secondary amino groups.

They can for example be at least partially hydrolyzed poly-N-vinylformamide or polyalkylene-imines, especially polyethylene-imines.

The production of polymers of N-vinylformamide has long been known (see for example EP 71 050 B1, corresponding to U.S. Pat. No. 4,421,602).

In addition to the nonionic (co)polymers, cationic copolymers of N-vinylformamide are obtained particularly easily by cleaving homopolymers of N-vinylformamide with defined amounts of acid or base hydrolytically to the desired degree of hydrolysis, as described in EP 71 050 A1. The amino groups that form on the polymer chain are more or less protonated depending on the solution pH and therefore endow the polymers with a cationic character.

Nonionic (co)polymers are to be understood, according to the invention, as those (co)polymers containing N-vinylformamide in the form incorporated by polymerization, which regardless of the pH do not contain any charges. They can be for example uncleaved poly-N-vinylformamide or copolymers of N-vinylformamide and neutral monomers.

Also cationic copolymers that contain N-vinylformamide incorporated by polymerization, can be used according to the invention.

The production of cationic copolymers of N-vinylformamide and a water-soluble basic monomer, for example N-trialkylammonium alkylacrylamides, at least partially protonated N-dialkylammonium alkylacrylamides, N-trialkylammonium alkylmethacrylamides, at least partially protonated N-dialkylammonium alkylmethacrylamides, N-trialkylammonium alkylacrylic esters, at least partially protonated N-dialkylammonium alkylacrylic esters, N-trialkylammonium alkylmethacrylic esters, at least partially protonated N-dialkylammonium alkylmethacrylic esters and/or diallyldialkylammonium salts, and use thereof as flocculating and dewatering aids for the treatment of wastewaters and sludges, is described in EPO 464 043 B1 (corresponding to U.S. Pat. No. 5,225,088).

For example, diallyldimethylammonium chloride, diallyldiethylammonium chloride, diallyldimethylammonium methosulfate, diallyldiethylammonium ethosulfate, N-(2-trimethylammonium)ethylacrylamide methosulfate or N-2-(ethyl-dimethyl)ammonium ethylmethacrylamide ethosulfate or mixtures thereof, as water-soluble cationic monomers, can be copolymerized with N-vinylformamide, as described in EP 0 464 043 B1, obtaining cationic copolymers, which are suitable for use in the paints for brush application according to the invention.

The (co)polymer generally contains the following monomers, incorporated by polymerization:

N-vinylformamide:

50-100 wt %, preferably 80-99.5 wt %, especially preferably 90-99 wt % and quite especially preferably 95-99 wt %.

Water-Soluble Cationic Monomer(s):

0-20 wt %, preferably 0.5-10 wt %, especially preferably 1-5 wt % and quite especially preferably 1-5 wt %.

Other Monomer(s):

0-30 wt %, preferably 0-10 wt %, especially preferably 0-5 wt % and quite especially preferably 0 wt %.

As other monomers, ethylenically unsaturated monomers that are known per se by a person skilled in the art can be copolymerized. For example, esters of (meth)acrylic acid with alcohols having 1 to 20 carbon atoms, e.g. methyl (meth)acrylates, ethyl(meth)acrylates, n-butyl(meth)acrylates, 2-ethylhexyl(meth)acrylates, vinylaromatic compounds, e.g. styrene, divinylbenzene, α,β-unsaturated nitriles, e.g. acrylonitrile, methacrylonitrile, vinyl esters, e.g. vinyl acetate, vinyl propionate, halogenated ethylenically unsaturated compounds, e.g. vinyl chloride, vinylidene chloride, conjugated unsaturated compounds, e.g. butadiene, isoprene, chloroprene, monounsaturated compounds, e.g. ethylene, propylene, 1-butene, 2-butene, isobutene, cyclic monounsaturated compounds, e.g. cyclopentene, cyclohexene, cyclododecene, allylacetic acid, vinylacetic acid, monoethylenically unsaturated carboxylic acids with 3 to 8 carbon atoms and water-soluble alkali-metal, alkaline-earth-metal or ammonium salts thereof, for example: acrylic acid, methacrylic acid, dimethylacrylic acid, ethacrylic acid, maleic acid, citraconic acid, methylene-malonic acid, crotonic acid, fumaric acid, mesaconic acid and itaconic acid, maleic acid, N-vinylpyrrolidone, N-vinyllactams, e.g. N-vinylcaprolactam, N-vinyl-N-alkyl-carboxylic acid amides or N-vinylcarboxylic acid amides, e.g. N-vinylacetamide, N-vinyl-N-methylformamide and N-vinyl-N-methylacetamide, vinyl ethers, e.g. methylvinyl ether, ethylvinyl ether, n-propylvinyl ether, isopropylvinyl ether, n-butylvinyl ether, sec-butylvinyl ether, isobutylvinyl ether, tert-butylvinyl ether, 4-hydroxybutylvinyl ether, and mixtures thereof, are suitable.

However, the incorporation of other monomers by polymerization is not essential for the success of the invention, so it can even be omitted.

A frequent, but not the only method for producing the (co)polymers mentioned so far is radical (co)polymerization in a solvent or diluent.

Radical (co)polymerization of said monomers takes place for example in aqueous solution in the presence of polymerization initiators, which in the polymerization conditions break down into radicals. The (co)polymerization can be carried out in a wide temperature range, optionally at reduced or also at increased pressure as a rule at temperatures up to 100° C. The pH of the reaction mixture is usually set in the range from 4 to 10.

However, the (co)polymerization can also be carried out in other ways known per se by a person skilled in the art, e.g. as solution, precipitation, water-in-oil-emulsion or inverse suspension polymerization. Solution polymerization is preferred.

The N-vinylformamide is (co)polymerized using radical polymerization initiators, e.g. azo compounds that break down into radicals, such as 2,2'-azo-bis(isobutyronitrile), 2,2'-azobis(2-amidinopropane) hydrochloride or 4,4'-azobis(4'-cyanopentanoic acid).

The aforementioned compounds are mostly used in the form of aqueous solutions, wherein the lower concentration is determined by the amount of water tolerable in the (co)polymerization and the upper concentration is determined by the solubility of the compound in question in water. In general the concentration is 0.1 to 30 wt %, preferably 0.5 to 20 wt %, especially preferably 1.0 to 10 wt %, relative to the solution.

The amount of the initiators is generally 0.1 to 10 wt %, preferably 0.5 to 5 wt %, relative to the monomers to be (co)polymerized. It is also possible to use several different initiators in the (co)polymerization.

For example water, alcohols, such as methanol, ethanol, n-propanol or isopropanol, n-butanol or isobutanol, or ketones, such as acetone, ethyl methyl ketone, diethyl ketone or isobutyl methyl ketone, can serve as solvent or diluent.

Optionally the (co)polymerization can be carried out in the presence of polymerization regulators, for example hydroxylammonium salts, chlorinated hydrocarbons and thio compounds, e.g. tert-butyl mercaptan, thioglycolic acid ethyl acrylic ester, mercaptoethynol, mercaptopropyltrimethoxysilane, dodecylmercaptan, tert-dodecylmercaptan or alkali metal hypophosphites. During (co)polymerization, these regulators can be used e.g. in amounts from 0 to 0.8 parts by weight, relative to 100 parts by weight of the monomers to be (co)polymerized, by which the molecular weight of the resultant (co)polymer is reduced.

In emulsion polymerization, ionic and/or nonionic emulsifiers and/or protective colloids or stabilizers can be used as surface-active compounds.

Depending on the polymerization conditions, the (co) polymerization gives (co)polymers of a different molecular weight, which is characterized in EP 71 050 B1 and in the following by means of the K-values according to Fikentscher (measured in 0.5 wt % aqueous solution of common salt at 25° C.).

(Co)polymers with a high K-value, e.g. above 80, are preferably produced by (co)polymerizing N-vinylformamide in water. (Co)polymers with a high K-value with high molecular weights are obtained, moreover, for example by (co)polymerizing the monomers in the form of inverse suspension polymerization or by (co)polymerizing the monomers by the method of water-in-oil polymerization.

In the method of inverse suspension polymerization and water-in-oil polymerization, saturated hydrocarbons, for example hexane, heptane, cyclohexane, decalin or aromatic hydrocarbons, such as benzene, toluene, xylene and cumene, are used as the oil phase. In inverse suspension polymerization, the ratio of oil phase to aqueous phase is for example 10:1 to 1:10.

(Co)polymer with a low K-value, e.g. below 80, is obtained by carrying out the (co)polymerization in the presence of polymerization regulators or in a solvent that controls the (co)polymerization, e.g. alcohols, such as methanol, ethanol, n-propanol or isopropanol, or ketones, such as acetone, ethyl methyl ketone, diethyl ketone or isobutyl methyl ketone. K-values with low molecular weights and correspondingly low K-values are obtained, moreover, by the usual methods, i.e. using larger amounts of polymerization initiator or using polymerization regulators or combinations of these measures.

There is no restriction on the molecular weight of the (co)polymers usable according to the invention, but it should not be too high, so that the viscosity of the coating compound is not too high. (Co)polymers with K-values from 10 to 100 are preferred, with K-values from 30 to 80 being especially preferred. The K-values are measured according to Fikentscher in 0.5 wt % aqueous solution of common salt at 25° C.

(Co)polymers containing vinylformamide can be used according to the invention in uncleaved and in at least partially cleaved form. The degree of cleavage is preferably from 10 to 100%, especially preferably from 20 to 98% and quite especially preferably from 30 to 95%. There is no restriction on the nature of cleavage of the formyl group, it can for example take place in the presence of acid or base, and cleavage in the presence of bases, for example sodium hydroxide, potassium hydroxide, alkaline-earth metal hydroxides, ammonia or amines, is preferred.

For acid hydrolysis, about 0.05 to 1.5 equivalents of an acid, such as hydrochloric acid, hydrobromic acid, phosphoric acid, sulfuric acid, is required per formyl group equivalent in the (co)polymer of N-vinylformamide. The pH during acid hydrolysis is in the range from 2 to 0, and is preferably 1 to 0. The hydrolysis proceeds far more quickly than the (co)polymers of other N-vinyl carboxylic acid amides, e.g. of N-methyl-N-vinylformamide, and can therefore be carried out under milder conditions, i.e. at lower temperatures and without a large excess of acids.

Furthermore, hydrolysis of the formyl groups of poly-N-vinylformamide can also be carried out in an alkaline medium, e.g. in the pH range from 11 to 14. This pH is preferably obtained by adding sodium hydroxide solution or potassium hydroxide solution. It is, however, also possible to use ammonia, amines and/or alkaline-earth metal bases. 0.05 to 1.5, preferably 0.4 to 1.0 equivalent of a base is used for alkaline hydrolysis.

Cleavage of the formyl group can be carried out in water, for example.

Cleavage of the formyl group takes place at temperatures in the range from 20 to 200° C., preferably 40 to 180° C. and especially preferably in the temperature range from 70 to 90° C.

The cleavage can even be carried out without acid or base at high temperatures, for example above 100° C., preferably 120 to 180° C., especially preferably 140 to 160° C. in the presence of a solvent, e.g. water. It is preferably carried out in conditions above the critical point, for example with supercritical water.

In hydrolysis, i.e. cleavage of the formyl group from poly-N-vinylformamide in water in the presence of acids or bases, formic acid and/or salts of formic acid are obtained as byproducts.

Polyalkylene-imines, especially polyethylene-imines, are widely available commercially and are obtainable by polymerization of the corresponding monomeric alkylene-imines in the presence of acids, Lewis acids or haloalkanes. The polyethylene-imines can be homopolymers, copolymers or graft polymers, as described for example in U.S. Pat. No. 2,182,306 or U.S. Pat. No. 3,203,910.

Optionally these polymers can be crosslinked subsequently. Useful crosslinking agents are for example those multifunctional compounds that have groups reactive to primary amino groups, for example multifunctional epoxides, such as diglycidyl ether of oligo- or polyethylene oxides or other multifunctional alcohols, for example glycerol or sugars, multifunctional carboxylic acid esters, polyisocyanates, multifunctional acrylic acid or methacrylic acid esters, multifunctional acrylamides or methacrylamides, epichlorohydrin, multifunctional acid halides, multifunctional alcohols, for example glycerol or sugars, divinylsulfones, maleic acid anhydride, o-halogencarbonyl chlorides or multifunctional haloalkanes, especially α,ω-dichloroalkanes.

Polymers with ethylene-imine units are also known from EP 0 411 400 A1, DE 24 34 816 A1 and U.S. Pat. No. 4,066,494.

Examples of polymers with ethylene-imine units are for example
  homopolymers of ethylene-imine,
  polyethylene-imines that are crosslinked with at least bifunctional crosslinking agents,
  polyamidoamines, which are grafted with ethylene-imines and are crosslinked with at least bifunctional crosslinking agents,
  reaction products of polyethylene-imines with monocarboxylic acids, producing amidated polyethylene-imines,
  Michael addition products of polyethylene-imines onto ethylenically unsaturated acids, salts, esters, amides or nitriles of monoethylenically unsaturated acids,
  phosphonomethylated polyethylene-imines,
  carboxylated polyethylene-imines and
  alkoxylated polyethylene-imines.

Polymers that are obtainable by condensation of at least one polycarboxylic acid with at least one polyamine and then by grafting with ethylene-imine and subsequent crosslinking with one of the aforementioned components can also be used. A method for producing said compounds is described for example in DE 24 34 816 A1, in which α,ω-chlorohydrin ethers of oligo- or polyethylene oxides are used as crosslinking agent.

Products of reaction of polyethylene-imines with monocarboxylic acids, obtaining amidated polyethylene-imines, are known from WO 94/12560 A1. Michael addition products of polyethylene-imines with ethylenically unsaturated acids, salts, esters, amides or nitriles of monoethylenically unsaturated acids are known from WO 94/14873 A1. Phosphonomethylated polyethylene-imines are described in detail in WO 97/25367 A1. Carboxylated polyethylene-imines are obtainable, for example, in a Strecker synthesis by reaction of polyethylene-imines with formaldehyde and ammonia/hydrocyanic acid and hydrolysis of the reaction product. Alkoxylated polyethylene-imines can be produced by reaction of polyethylene-imines with alkylene oxides such as ethylene oxide and/or propylene oxide.

Furthermore, polymers containing amino groups are conceivable, as described in WO 97/25367 A1, especially from page 6, line 9 to page 18, line 44, to which reference is expressly made hereby, and in WO 94/12560 A1, there especially page 3, line 23 to page 6, line 27, to which reference is expressly made hereby.

For production of these two-component coating compounds for forming finely structured surfaces, polyisocyanate and polyol or polyamine are mixed together in a molar ratio of isocyanate groups to groups reactive to isocyanate of 0.1:1 to 10:1, preferably 0.2:1 to 5:1, especially preferably 0.3:1 to 3:1, quite especially preferably 0.5:1 to 2:1, especially 0.8:1 to 1.2:1 and in particular 0.9:1 to 1.1:1, which optionally can be mixed with other additives, and applied on the substrate.

Then the coating compound is cured at an ambient temperature of up to 140° C., preferably 20 to 80° C., especially preferably up to 60° C.

Depending on the temperature, as a rule this takes not more than 12 hours, preferably up to 8 hours, especially preferably up to 6, quite especially preferably up to 4 and in particular up to 3 hours.

In an especially preferred embodiment, the polyisocyanate is polyisocyanates of 1,6-hexamethylene diisocyanate containing isocyanurate groups.

In another especially preferred embodiment the polyisocyanate is a mixture of polyisocyanates of 1,6-hexamethylene diisocyanate and of isophorone diisocyanate containing isocyanurate groups.

In an especially preferred embodiment the polyisocyanate is a mixture containing low-viscosity polysiocyanates, preferably polyisocyanates containing isocyanurate groups, with a viscosity of 600-1500 mPa*s, especially below 1200 mPa*s, lower-viscosity urethanes and/or allophanates with a viscosity of 200-1600 mPa*s, especially 600-1500 mPa*s, and/or polyisocyanates containing iminooxadiazinedione groups.

According to the invention, the coating compounds are preferably radiation-curing coating compounds, which are cured with radiation.

Radiation curing means here that the radical polymerization of polymerizable compounds is initiated as a result of electromagnetic and/or corpuscular radiation, for example (N) IR light in the wavelength range of λ=700-1200 nm, preferably 700-900 nm and/or UV light in the wavelength range from λ=200 to 700 nm, preferably λ=200 to 500 nm and especially preferably λ=250 to 400 nm and/or electron radiation in the range from 150 to 300 keV and especially preferably with a radiation dose of at least 80, preferably 80 to 3000 mJ/cm$^2$.

In the case of curing with (N)IR and/or UV light it has to be borne in mind that in this case photoinitiators are present in the coating compound, which can be decomposed to radicals by light of the incident wavelength, and these in their turn can initiate radical polymerization.

In contrast, in curing with electron radiation the presence of these photoinitiators is not necessary.

The radiation-curing coating compound is preferably acrylic acid esters, methacrylic acid esters and/or unsaturated polyester resins.

Unsaturated polyester resins are known per se by a person skilled in the art.

Preferably it is an unsaturated polyester resin, which is made up at least of the components:
  (a1) maleic acid or derivatives thereof,
  (a2) at least one cyclic dicarboxylic acid or derivatives thereof,
  (a3) at least one aliphatic or cycloaliphatic diol.
  Derivatives preferably mean, in the context of this text
    the anhydrides in question in monomeric or also polymeric form,
    mono- or dialkyl esters, preferably mono- or di-$C_1$-$C_4$-alkyl esters, especially preferably mono- or dimethyl esters or the corresponding mono- or diethyl esters,
    other mono- and divinyl esters and
    mixed esters, preferably mixed esters with different $C_1$-$C_4$-alkyl components, especially preferably mixed methylethyl esters.
  $C_1$-$C_4$-alkyl means, in the context of this text, methyl, ethyl, isopropyl, n-propyl, n-butyl, isobutyl, sec-butyl and tert-butyl, preferably methyl, ethyl and n-butyl, especially preferably methyl and ethyl and quite especially preferably methyl.

In the context of the present invention it is also possible to use a mixture of a dicarboxylic acid and one or more derivatives thereof. It is also possible, in the context of the present invention, to use a mixture of several different derivatives of one or more dicarboxylic acids.

Component (a1) is maleic acid or derivatives thereof, preferably maleic acid or maleic acid anhydride.

Component (a2) is at least one, preferably one to four, especially preferably one to three and quite especially preferably exactly one cyclic dicarboxylic acid or derivatives thereof.

A cyclic compound is understood in the context of the present document as a compound that contains at least one, preferably one or two and especially preferably exactly one carbo- or heterocycle, preferably carbocycle. They can be aromatic or alicyclic compounds, wherein the latter comprise both compounds partially unsaturated in the ring and saturated compounds.

The rings are preferably five- to six-membered rings, especially preferably six-membered rings.

Examples of aromatic components (a2) are phthalic acid, isophthalic acid or terephthalic acid; (a2) is preferably selected from the group consisting of phthalic acid and terephthalic acid.

Examples of alicyclic components (a2) are cis- and trans-cyclohexane-1,2-dicarboxylic acid, cis- and trans-cyclohexane-1,3-dicarboxylic acid, cis- and trans-cyclohexane-1,4-dicarboxylic acid, cis- and trans-cyclopentane-1,2-dicarboxylic acid, cis- and trans-cyclopentane-1,3-dicarboxylic acid and cyclohex-1-ene-1,2-dicarboxylic acid. Preferably they are industrial isomeric mixtures of hexahydro- and tetrahydrophthalic acid.

Component (a3) is at least one, preferably one to four, especially preferably one to three, quite especially preferably one or two and in particular exactly one aliphatic or cycloaliphatic diol.

Diols used according to the present invention are for example ethylene glycol, propane-1,2-diol, propane-1,3-diol, butane-1,2-diol, butane-1,3-diol, butane-1,4-diol, butane-2,3-diol, pentane-1,2-diol, pentane-1,3-diol, pentane-1,4-diol, pentane-1,5-diol, pentane-2,3-diol, pentane-2,4-diol, hexane-1,2-diol, hexane-1,3-diol, hexane-1,4-diol, hexane-1,5-diol, hexane-1,6-diol, hexane-2,5-diol, heptane-1,2-diol 1,7-heptanediol, 1,8-octanediol, 1,2-octanediol, 1,9-nonanediol, 1,2-decanediol, 1,10-decanediol, 1,2-dodecanediol, 1,12-dodecanediol, 1,5-hexadiene-3,4-diol, 1,2- and 1,3-cyclopentanediols, 1,2-, 1,3- and 1,4-cyclohexanediols, 1,1-, 1,2-, 1,3- and 1,4-bis(hydroxymethyl)cyclohexane, 1,1-, 1,2-, 1,3- and 1,4-bis(hydroxyethyl)cyclohexane, neopentyl glycol, (2)-methyl-2,4-pentanediol, 2,4-dimethyl-2,4-pentanediol, 2-ethyl-1,3-hexanediol, 2,5-dimethyl-2,5-hexanediol, 2,2,4-trimethyl-1,3-pentanediol, pinacol, diethylene glycol, triethylene glycol, dipropylene glycol, tripropylene glycol, polyethylene glycols HO(CH$_2$CH$_2$O)$_n$—H or polypropylene glycols HO(CH[CH$_3$]CH$_2$O)$_n$—H, in which n is an integer and n>4, polyethylene-polypropylene glycols, wherein the sequence of the ethylene oxide or propylene oxide units can be blockwise or random, polytetramethylene glycols, preferably up to a molar weight of up to 5000 g/mol, poly-1,3-propanediols, preferably with a molar weight up to 5000 g/mol, polycaprolactones or mixtures of two or more representatives of the above compounds.

Diols that are preferably used are ethylene glycol, 1,2-propanediol, 1,3-propanediol, 1,4-butanediol, 1,5-pentanediol, 1,6-hexanediol, 1,8-octanediol, 1,2-, 1,3- and 1,4-cyclohexanediol, 1,3- and 1,4-bis(hydroxymethyl)cyclohexane, and diethylene glycol, triethylene glycol, dipropylene glycol and tripropylene glycol.

The diols can optionally also contain further functionalities such as carbonyl, carboxy, alkoxycarbonyl or sulfonyl, for example dimethylolpropionic acid or dimethylolbutyric acid, and C$_1$-C$_4$-alkyl esters thereof, but preferably the diols do not have any further functionalities.

Especially preferred aliphatic diols are those that have 2 to 6 carbon atoms. Quite especially preferably, the aliphatic diols are selected from the group consisting of diethylene glycol and neopentyl glycol.

Equally preferably, the diol (a2) can be cycloaliphatic diols, especially preferably 1,1-, 1,2-, 1,3- and 1,4-bis(hydroxymethyl)cyclohexane or 2,2-bis(4-hydroxycyclohexyl)propane.

In addition to the structural components (a1), (a2) and (a3), the unsaturated polyester resin (a) can optionally also contain further components:

Optionally, as structural component (a4), at least one other dicarboxylic acid or derivatives thereof can be present as (a1) and (a2). Component (a4) can be for example other acyclic dicarboxylic acids, and those preferred are oxalic acid, malonic acid, succinic acid, glutaric acid, adipic acid, pimelic acid, suberic acid, azelaic acid, sebacic acid, undecane-α,ω-dicarboxylic acid, dodecane-α,ω-dicarboxylic acid, 2-methylmalonic acid, 2-ethylmalonic acid, 2-phenylmalonic acid, 2-methylsuccinic acid, 2-ethylsuccinic acid, 2-phenylsuccinic acid, itaconic acid, 3,3-dimethylglutaric acid or fumaric acid, and malonic acid, succinic acid, glutaric acid and adipic acid are especially preferred.

(a5) Moreover, optionally at least one polycarboxylic acid with a functionality of 3 or more or derivatives thereof can be present.

Examples of this are aconitic acid, 1,3,5-cyclohexanetricarboxylic acid, 1,2,4-benzene-tricarboxylic acid, 1,3,5-benzene-tricarboxylic acid, 1,2,4,5-benzene-tetracarboxylic acid (pyromellitic acid) and mellitic acid and low-molecular polyacrylic acids.

Moreover, a diol other than that described under (a3) can be present as further optional structural component (a6).

Moreover, a polyol with a functionality of 3 or more can be present as further optional structural component (a7).

Examples are glycerol, trimethylolmethane, trimethylolethane, trimethylolpropane, 1,2,4-butanetriol, tris(hydroxymethyl)amine, tris(hydroxyethyl)amine, tris(hydroxypropyl)amine, pentaerythritol, diglycerol, triglycerol or higher condensation products of glycerol, di(trimethylolpropane), di(pentaerythritol), trishydroxymethyl isocyanurate, tris(hydroxyethyl)isocyanurate (THEIC), tris(hydroxypropyl)isocyanurate, inositols or sugars, for example glucose, fructose or sucrose, sugar alcohols e.g. sorbitol, mannitol, threitol, erythritol, adonite (ribitol), arabitol (lyxitol), xylitol, dulcitol (galactitol), maltitol, isomalt, tri- or higher-functional polyetherols based on tri- or higher-functional alcohols and ethylene oxide, propylene oxide and/or butylene oxide.

The composition of the unsaturated polyester resins (a) is as a rule as follows:

(a1) 30-70 mol % relative to all carboxyl groups and derivatives thereof present in (a), preferably 40-60 mol %, (a2) 30-70 mol % relative to all carboxyl groups and derivatives thereof present in (a), preferably 40-60 mol %, (a3) 80-100 mol % relative to all hydroxyl groups present in (a), preferably 100 mol %, (a4) 0-20 mol % relative to all carboxyl groups and derivatives thereof present in (a), preferably 0 mol %, (a5) 0-5 mol % relative to all carboxyl groups and derivatives thereof present in (a), preferably 0 mol %, (a6) 0-20 mol % relative to all hydroxyl groups present in (a), preferably 0 mol % and (a7) 0-5 mol % relative to all hydroxyl groups present in (a), preferably 0 mol %, with the proviso that the sum of all hydroxyl groups is 100 mol % and the sum of all carboxyl groups is 100 mol %, and the stoichiometry of hydroxyl groups to carboxyl groups is from 1:0.85 to 1:1.25, preferably 1:0.9 to 1:1.2 and especially preferably 1:0.95 to 1:1.15.

Preferred unsaturated polyester resins (a) have a glass transition temperature Tg, measured by the DSC method (differential scanning calorimetry) according to ASTM 3418/82 at a heating rate of 20° C./min, of 0° C. or more, preferably 10° C. or more and especially preferably 25° C. or more.

Preferred unsaturated polyester resins (a) have a number-average molecular weight $M_n$ from 1000 to 10 000 g/mol (determined by gel permeation chromatography with polystyrene as standard, solvent tetrahydrofuran), preferably from 1500 to 8000 and especially preferably from 2000 to 5000 g/mol.

Preferably the radiation-curing coating compounds are polyester-, polyether-, carbonate-, epoxy- or urethane(meth) acrylates and (meth)acrylated polyacrylates, which optionally can be partially amine-modified.

These are at least one, for example one to four, preferably one to three, especially preferably one or two and quite especially preferably exactly one, radiation-curing compound with more than 2, preferably 3-10, especially preferably 3-6, quite especially preferably 3-4 and in particular 3 radically polymerizable groups.

Polyester(meth)acrylates are the corresponding esters of α,β-ethylenically unsaturated carboxylic acids, preferably of (meth)acrylic acid, especially preferably of acrylic acid with polyester polyols.

The polyester polyols used can for example be those that were described above for two-component coating compounds.

Polyether(meth)acrylates are the corresponding esters of α,β-ethylenically unsaturated carboxylic acids, preferably of (meth)acrylic acid, especially preferably of acrylic acid with polyetherols.

The polyetherols are preferably polyethylene glycol with a molecular weight between 106 and 2000, preferably 106 to 1500, especially preferably 106 to 1000, poly-1,2-propanediol with a molecular weight between 134 and 1178, poly-1,3-propanediol with a molecular weight between 134 and 1178 and polytetrahydrofurandiol with a number-average molecular weight $M_n$ in the range from about 500 to 4000, preferably 600 to 3000, especially 750 to 2000.

Urethane(meth)acrylates are obtainable for example by reaction of polyisocyanates with hydroxyalkyl(meth)acrylates and optionally chain extenders such as diols, polyols, diamines, polyamines or dithiols or polythiols. Urethane (meth)acrylates dispersible in water without addition of emulsifiers additionally contain ionic and/or nonionic hydrophilic groups, which can be incorporated into the urethane e.g. by structural components such as hydroxycarboxylic acids.

These urethane(meth)acrylates contain as structural components essentially:

(a) at least one organic aliphatic, aromatic or cycloaliphatic di- or polyisocyanate, for example at least one of the polyisocyanates described above for the two-component coating compounds, (b) at least one compound with at least one group that is reactive to isocyanate, preferably one of the monomers bearing hydroxyl groups described above for the polyacrylate polyols, and at least one radically polymerizable unsaturated group and (c) optionally at least one compound with at least two groups that are reactive to isocyanate, for example one of the polyhydric alcohols described above for the polyesterols.

The urethane(meth)acrylates preferably have a number-average molecular weight $M_n$ from 500 to 20 000, especially from 500 to 10 000 and especially preferably 600 to 3000 g/mol (determined by gel permeation chromatography with tetrahydrofuran and polystyrene as standard).

The urethane(meth)acrylates preferably have a content from 1 to 5, especially preferably from 2 to 4 mol of (meth)acrylic groups per 1000 g of urethane(meth)acrylate.

Epoxide(meth)acrylates are obtainable by reaction of epoxides with (meth)acrylic acid. Epoxides that may come into consideration are e.g. epoxidized olefins, aromatic glycidyl ethers or aliphatic glycidyl ethers, preferably those of aromatic or aliphatic glycidyl ethers.

Epoxidized olefins can for example be ethylene oxide, propylene oxide, isobutylene oxide, 1-butene oxide, 2-butene oxide, vinyloxirane, styrene oxide or epichlorohydrin, preferably ethylene oxide, propylene oxide, isobutylene oxide, vinyloxirane, styrene oxide or epichlorohydrin, especially preferably ethylene oxide, propylene oxide or epichlorohydrin and quite especially preferably ethylene oxide and epichlorohydrin.

Aromatic glycidyl ethers are e.g. bisphenol-A-diglycidyl ether, bisphenol-F-diglycidyl ether, bisphenol-B-diglycidyl ether, bisphenol-S-diglycidyl ether, hydroquinone-diglycidyl ether, alkylation products of phenol/dicyclopentadiene, e.g. 2,5-bis[(2,3-epoxypropoxy)phenyl]octahydro-4,7-methano-5H-indene) (CAS No. [13446-85-0]), tris[4-(2,3-epoxypropoxy)phenyl]methane isomers) CAS No. [66072-39-7]), phenol-based epoxy novolacs (CAS No. [9003-35-4]) and cresol-based epoxy novolacs (CAS No. [37382-79-9]).

Aliphatic glycidyl ethers are for example 1,4-butanediol-diglycidyl ether, 1,6-hexanediol-diglycidyl ether, trimethylolpropane-triglycidyl ether, pentaerythritol-tetraglycidyl ether, 1,1,2,2-tetrakis[4-(2,3-epoxypropoxy)phenyl]ethane (CAS No. [27043-37-4]), diglycidyl ether of polypropylene glycol (α,ω-bis(2,3-epoxypropoxy)poly(oxypropylene) (CAS No. [16096-30-3]) and of hydrogenated bisphenol A (2,2-bis[4-(2,3-epoxypropoxy)cyclohexyl]propane, CAS No. [13410-58-7]).

The epoxide(meth)acrylates preferably have a number-average molecular weight $M_n$ from 200 to 20 000, especially preferably from 200 to 10 000 g/mol and quite especially preferably from 250 to 3000 g/mol; the content of (meth) acrylic groups is preferably 1 to 5, especially preferably 2 to 4 per 1000 g of epoxide(meth)acrylate (determined by gel permeation chromatography with polystyrene as standard and tetrahydrofuran as eluent).

(Meth)acrylated polyacrylates are the corresponding esters of α,β-ethylenically unsaturated carboxylic acids, preferably of (meth)acrylic acid, especially preferably of acrylic acid with polyacrylate polyols, obtainable by esterification of polyacrylate polyols with (meth)acrylic acid.

The polyacrylate polyols can be for example those that were described above for the two-component coating compounds.

Carbonate(meth)acrylates are also obtainable with various functionalities.

The number-average molecular weight $M_n$ of the carbonate(meth)acrylates is preferably less than 3000 g/mol, especially preferably less than 1500 g/mol, especially preferably less than 800 g/mol (determined by gel permeation chromatography with polystyrene as standard, solvent tetrahydrofuran).

The carbonate(meth)acrylates are easily obtainable by transesterification of carbonic acid esters with polyhydric, preferably dihydric alcohols (diols, e.g. hexanediol) and subsequent esterification of the free OH groups with (meth)acrylic acid or also transesterification with (meth)acrylic acid esters, as described e.g. in EP 0 092 269 A1. They can also be obtained by reaction of phosgene, urea derivatives with polyhydric, e.g. dihydric alcohols.

(Meth)acrylates of polycarbonate polyols are also conceivable, such as the reaction product of one of the aforementioned di- or polyols and a carbonic acid ester and a (meth)acrylate containing hydroxyl groups.

Suitable carbonic acid esters are e.g. ethylene-, 1,2- or 1,3-propylene carbonate, dimethyl, diethyl or dibutyl carbonate.

Suitable (meth)acrylates containing hydroxyl groups are for example 2-hydroxyethyl(meth)acrylate, 2- or 3-hydroxypropyl(meth)acrylate, 1,4-butanediol-mono(meth)acrylate, neopentyl glycol mono(meth)acrylate, glycerol mono- and di(meth)acrylate, trimethylolpropane-mono- and di(meth)acrylate and pentaerythritol-mono-, -di- and -tri(meth)acrylate.

Especially preferred carbonate(meth)acrylates are those of the formula:

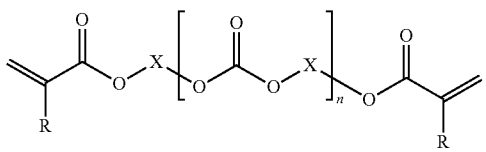

in which R stands for H or CH$_3$, X stands for a C$_2$-C$_{18}$ alkylene group and n stands for an integer from 1 to 5, preferably 1 to 3.

R preferably stands for H and X preferably stands for C$_2$- to C$_{10}$-alkylene, for example 1,2-ethylene, 1,2-propylene, 1,3-propylene, 1,4-butylene or 1,6-hexylene, especially preferably for C$_4$- to C$_8$-alkylene. Quite especially preferably X stands for C$_6$-alkylene.

Preferably the carbonate(meth)acrylates are aliphatic carbonate(meth)acrylates.

In a preferred embodiment the radiation-curing coating compound is made up as follows:
at least one polyester-, polyether-, carbonate-, epoxy- and/or urethane(meth)acrylate or unsaturated polyester resin,
optionally at least one reactive thinner,
optionally at least one photoinitiator,
optionally at least one solvent,
optionally at least one stabilizer,
optionally at least one additive, selected from the group consisting of activators, fillers, pigments, dyes, thickeners, thixotropic agents, surfactants, viscosity modifiers, plasticizers and chelating agents.

For example a radiation-curing coating compound can have the following composition:
40 to 100 wt % of at least one polyester-, polyether-, carbonate-, epoxy- or urethane(meth)acrylate or an unsaturated polyester resin,
0 to 60 wt % of at least one reactive thinner,
0 to 5 wt % of at least one photoinitiator,
0 to 20 wt % of at least one solvent,
0 to 5 wt % of at least one stabilizer,
0 to 5 wt % of at least one additive, selected from the group consisting of activators, fillers, pigments, dyes, thickeners, thixotropic agents, surfactants, viscosity modifiers, plasticizers and chelating agents,
with the proviso that the total always comes to 100 wt %.

In an individual case it may be sensible to use smaller amounts of at least one polyester-, polyether-, carbonate-, epoxy- or urethane(meth)acrylate or of an unsaturated polyester resin than the stated 40 wt % in the radiation-curing coating compound, especially when the at least one reactive thinner fulfils the requirements on viscosity and elastic modulus without needing the presence of a polyester-, polyether-, carbonate-, epoxy- or urethane(meth)acrylate or an unsaturated polyester resin. In this case the reactive thinner can make up to 80, sometimes up to 90 or even up to 100 wt % of the radiation-curing coating compound or of the radiation-curing components within the coating compound. Correspondingly, the proportion of the polyester-, polyether-, carbonate-, epoxy- or urethane(meth)acrylate or of the unsaturated polyester resin can make up not more than 20, not more than 10 or even 0 wt %.

Preferred radiation-curing coating compounds are those that have a double bond density of not more than 14 mol/kg, preferably not more than 10 mol/kg, especially preferably not more than 9 mol/kg, quite especially preferably not more than 8 and in particular not more than 7 mol/kg.

As a rule, however, at least a double bond density of 0.1 mol/kg is necessary, preferably at least 0.5 mol/kg, especially preferably at least 1 mol/kg, quite especially preferably at least 2 and in particular at least 2.5 mol/kg.

Double bond density means the amount of polymerizable groups, for example vinyl ether, acrylic acid and methacrylic acid groups, preferably acrylic acid and methacrylic acid groups per kg of binder, wherein the components polyester-, polyether-, carbonate-, epoxy- or urethane(meth)acrylate, unsaturated polyester resin and reactive thinner are counted as binders.

As explained above, a photoinitiator is necessary when, in the method according to the invention, the coating compound is cured with (N)IR and/or UV radiation, but not when curing is carried out with electron radiation.

A reactive thinner means those compounds that have a viscosity at 25° C. between 1 and 500 mPas, preferably between 1 and 200 mPas and especially preferably between 1 and 100 mPas. As a rule these reactive thinners have not more than six, preferably up to four, especially preferably up to three, quite especially preferably one to three and especially two or three radiation-curing groups.

These can be for example multifunctional (meth)acrylic acid esters:

Examples of multifunctional polymerizable compounds are ethylene glycol diacrylate, 1,2-propanediol diacrylate, 1,3-propanediol diacrylate, 1,4-butanediol diacrylate, 1,3-butanediol diacrylate, 1,5-pentanediol diacrylate, 1,6-hexanediol diacrylate, 1,8-octanediol diacrylate, neopentyl glycol diacrylate, 1,1-, 1,2-, 1,3- and 1,4-cyclohexanedimethanol-diacrylate, 1,2-, 1,3- or 1,4-cyclohexanediol diacrylate.

Examples of multifunctional polymerizable compounds are trimethylolpropane triacrylate, ditrimethylolpropane-penta- or -hexaacrylate, pentaerythritol-tri- or -tetraacrylate, glycerol di- or -triacrylate, and di- and polyacrylates of sugar alcohols, for example sorbitol, mannitol, diglycerol, threitol, erythritol, adonite (ribitol), arabitol (lyxitol), xylitol, dulcitol (galactitol), maltitol or isomalt.

Further examples of (meth)acrylates are compounds of formula (IIa) to (IId),

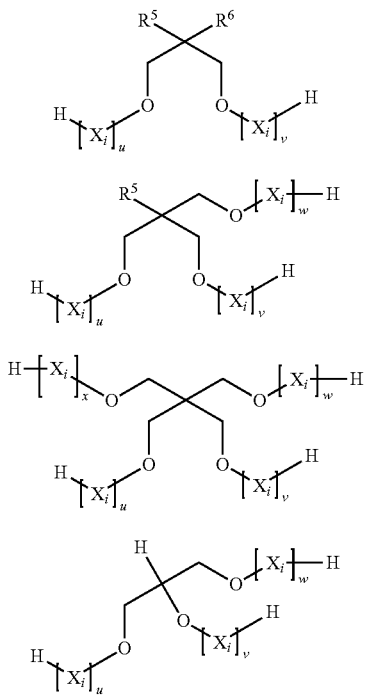

in which

R$^5$ and R$^6$ stand independently of one another for hydrogen or C$_1$-C$_{18}$-alkyl optionally substituted with aryl, alkyl, aryloxy, alkyloxy, heteroatoms and/or heterocycles, u, v, w, x each stand independently of one another for an integer from 1 to 10, preferably 1 to 5 and especially preferably 1 to 3 and each X$_i$ for i=1 to u, 1 to v, 1 to w and 1 to x independently of one another can be selected from the group —CH$_2$—CH$_2$—O—, —CH$_2$—CH(CH$_3$)O—, —CH(CH$_3$)CH$_2$—O—, —CH$_2$—C(CH$_3$)$_2$—O—, —C(CH$_3$)$_2$—CH$_2$—O—, —CH$_2$—CHVin-O—, —CHVin-CH$_2$—O—, —CH$_2$—CHPh-O— and —CHPh-CH$_2$—O—, preferably from the group —CH$_2$—CH$_2$—O—, —CH$_2$—CH(CH$_3$)O— and —CH(CH$_3$)CH$_2$—O—, and especially preferably —CH$_2$—CH$_2$—O—, in which Ph stands for phenyl and Vin stands for vinyl.

In the above, C$_1$-C$_{18}$-alkyl optionally substituted with aryl, alkyl, aryloxy, alkyloxy, heteroatoms and/or heterocycles denotes for example methyl, ethyl, propyl, isopropyl, n-butyl, sec-butyl, tert-butyl, pentyl, hexyl, heptyl, octyl, 2-ethylhexyl, 2,4,4-trimethylpentyl, decyl, dodecyl, tetradecyl, heptadecyl, octadecyl, 1,1-dimethylpropyl, 1,1-dimethylbutyl, 1,1,3,3-tetramethylbutyl, preferably methyl, ethyl or n-propyl, quite especially preferably methyl or ethyl.

Preferably they are (meth)acrylates of one- to twenty-fold and especially preferably three- to ten-fold ethoxylated, propoxylated or mixed ethoxylated and propoxylated and in particular exclusively ethoxylated neopentyl glycol, trimethylolpropane, trimethylolethane or pentaerythritol.

Preferred multifunctional polymerizable compounds are ethylene glycol diacrylate, 1,2-propanediol diacrylate, 1,3-propanediol diacrylate, 1,4-butanediol diacrylate, 1,6-hexanediol diacrylate, dipropylene glycol diacrylate, trimethylolpropane triacrylate, pentaerythritol-tetraacrylate and triacrylate of one- to twenty-fold alkoxylated, especially preferably glycerol or ethoxylated trimethylolpropane.

Quite especially preferred multifunctional polymerizable compounds are 1,4-butanediol diacrylate, 1,6-hexanediol diacrylate, trimethylolpropane triacrylate, pentaerythritol-tetraacrylate and triacrylate of one- to twenty-fold ethoxylated trimethylolpropane.

Monovalent (meth)acrylates are also conceivable, for example (2-phenoxyethyl acrylate) or higher-ethoxylated phenoxyacrylates, ethyldiglycol acrylate, 4-tert-butylcyclohexyl acrylate, trimethylolpropaneformal monoacrylate, isobornyl acrylate, tetrahydrofurfurylacrylate, 2-(2-ethoxyethoxy)ethyl acrylate, and lauryl, stearyl, isodecyl, octyl and decyl acrylate.

Esters of α,β-ethylenically unsaturated carboxylic acids are also conceivable, preferably of (meth)acrylic acid with alcohols that have 1 to 20 carbon atoms, preferably optionally hydroxyl-substituted alkanols having 1 to 20 carbon atoms, e.g. methyl(meth)acrylates, ethyl(meth)acrylates, n-butyl(meth)acrylates, 2-ethylhexyl(meth)acrylates, 2-hydroxyethyl(meth)acrylate, 2-hydroxypropyl(meth)acrylate or 4-hydroxybutyl(meth)acrylate.

Furthermore, esters of (meth)acrylic acid with cycloalkanols or bicycloalkanols are conceivable, wherein the cycloalkanol or bicycloalkanol has from 3 to 20 carbon atoms, preferably 5 to 10 carbon atoms and optionally can be substituted with one or more C$_1$- to C$_4$-alkyl residues.

Examples of cycloalkanol and bicycloalkanol are cyclopentanol, cyclohexanol, cyclooctanol, cyclododecanol, 4-methyl cyclohexanol, 4-isopropyl cyclohexanol, 4-tert-butyl cyclohexanol (preferably of cis configuration), dihydrodicyclopentadienyl alcohol and norbornyl alcohol. Cyclohexanol and 4-tert-butyl cyclohexanol are preferred.

UV-photoinitiators can for example be photoinitiators that are known by a person skilled in the art, e.g. those mentioned in "Advances in Polymer Science", Volume 14, Springer Berlin 1974 or in K. K. Dietliker, Chemistry and Technology of UV- and EB-Formulation for Coatings, Inks and Paints, Volume 3; Photoinitiators for Free Radical and Cationic Polymerization, P. K. T. Oldring (Eds), SITA Technology Ltd, London.

Consideration may be given for example to phosphine oxides, benzophenones, α-hydroxy-alkyl-aryl-ketones, thioxanthones, anthraquinones, acetophenones, benzoins and benzoin ethers, ketals, imidazoles or phenylglyoxylic acids and mixtures thereof.

Phosphine oxides are for example mono- or bisacylphosphine oxides, as described e.g. in EP 7 508 A2, EP 57 474 A2, DE 196 18 720 A1, EP 0 495 751 A1 or EP 0 615 980 A2, for example 2,4,6-trimethylbenzoyldiphenylphosphine oxide, ethyl-2,4,6-trimethylbenzoylphenylphosphinate or bis(2,6-dimethoxybenzoyl)-2,4,4-trimethylpentylphosphine oxide.

Benzophenones are for example benzophenone, 4-aminobenzophenone, 4,4'-bis(dimethylamino)benzophenone, 4-phenylbenzophenone, 4-chlorobenzophenone, Michler's ketone, o-methoxybenzophenone, 2,4,6-trimethylbenzophenone, 4-methylbenzophenone, 2,4-dimethylbenzophenone, 4-isopropylbenzophenone, 2-chlorobenzophenone, 2,2'-dichlorobenzophenone, 4-methoxybenzophenone, 4-propoxybenzophenone or 4-butoxybenzophenone, α-hydroxy-alkyl-aryl ketones are for example 1-benzoylcyclohexan-1-ol (1-hydroxy-cyclohexyl-phenyl ketone), 2-hydroxy-2,2-dimethylacetophenone, (2-hydroxy-2-methyl-1-phenyl-propan-1-one), 1-hydroxyacetophenone, 1-[4-(2-hydroxyethoxy)phenyl]-2-hydroxy-2-methyl-1-propan-1-one or polymer that contains 2-hydroxy-2-methyl-1-(4-isopropen-2-yl-phenyl)propan-1-one incorporated by polymerization.

Xanthones and thioxanthones are for example 10-thioxanthenone, thioxanthen-9-one, xanthen-9-one, 2,4-dimethylthioxanthone, 2,4-diethylthioxanthone, 2,4-diisopropyl-thioxanthone, 2,4-dichlorothioxanthone or chloroxanthenone, Anthraquinones are for example β-methylanthraquinone, tert-butylanthraquinone, anthraquinone carboxylates, benz[de]-anthracen-7-one, benz[a]anthracene-7,12-dione, 2-methylanthrax-quinone, 2-ethylanthraquinone, 2-tert-butylanthraquinone, 1-chloro-anthraquinone or 2-amylanthraquinone.

Acetophenones are for example acetophenone, acetonaphthoquinone, valerophenone, hexanophenone, α-phenylbutyrophenone, p-morpholinopropiophenone, dibenzosuberone, 4-morpholinobenzophenone, p-diacetylbenzene, 4'-methoxyacetophenone, α-tetralon, 9-acetylphenanthrene, 2-acetylphenanthrene, 3-acetylphenanthrene, 3-acetylindole, 9-fluorenone, 1-indanone, 1,3,4-triacetylbenzene, 1-acetonaphthone, 2-acetonaphthone, 2,2-dimethoxy-2-phenylacetophenone, 2,2-diethoxy-2-phenylacetophenone, 1,1-dichloroacetophenone, 1-hydroxyacetophenone, 2,2-diethoxyacetophenone, 2-methyl-1-[4-(methylthio)phenyl]-2-morpholinopropan-1-one, 2,2-dimethoxy-1,2-diphenylethan-2-one or 2-benzyl-2-dimethylamino-1-(4-morpholinophenyl)butane-1-one.

Benzoins and benzoin ethers are for example 4-morpholino-deoxybenzoin, benzoin, benzoin-isobutyl ether, benzoin-tetrahydropyranyl ether, benzoin-methyl ether, benzoin-ethyl ether, benzoin-butyl ether, benzoin-isopropyl ether or 7-H-benzoin-methyl ether.

Ketals are for example acetophenone dimethylketal, 2,2-diethoxyacetophenone, or benzylketals, such as benzyldimethylketal.

Phenylglyoxylic acids are described for example in DE 198 26 712 A1, DE 199 13 353 A1 or WO 98/33761A1.

Other photoinitiators that can be used are for example benzaldehyde, methyl ethyl ketone, 1-naphthaldehyde, triphenylphosphine, tri-o-tolylphosphine or 2,3-butanedione.

Typical mixtures comprise for example 2-hydroxy-2-methyl-1-phenyl-propan-2-one and 1-hydroxy-cyclohexyl-phenyl ketone, bis(2,6-dimethoxybenzoyl)2,4,4-trimethylpentylphosphine oxide and 2-hydroxy-2-methyl-1-phenyl-propan-1-one, benzophenone and 1-hydroxy-cyclohexyl-phenyl ketone, bis(2,6-dimethoxybenzoyl)2,4,4-trimethylpentylphosphine oxide and 1-hydroxy-cyclohexyl-phenyl ketone, 2,4,6-trimethylbenzoyldiphenylphosphine oxide and 2-hydroxy-2-methyl-1-phenyl-propan-1-one, 2,4,6-trimethylbenzophenone and 4-methylbenzophenone or 2,4,6-trimethylbenzophenone and 4-methylbenzophenone and 2,4,6-trimethylbenzoyldiphenyl-phosphine oxide.

Those preferred among these photoinitiators are 2,4,6-trimethyl-benzoyldiphenylphosphine oxide, ethyl-2,4,6-trimethylbenzoyl-phenylphosphinate, bis(2,4,6-trimethyl-benzoyl)phenylphosphine oxide, benzophenone, 1-benzoylcyclohexan-1-ol, 2-hydroxy-2,2-dimethylacetophenone and 2,2-dimethoxy-2-phenylacetophenone.

Furthermore, at least one stabilizer can be present.

Suitable stabilizers comprise typical UV-absorbers such as oxanilides, triazines and benzotriazole (the latter obtainable as Tinuvin® brands from Ciba-Spezialitätenchemie) and benzophenones. These can be used alone or together with suitable radical scavengers, for example sterically hindered amines such as 2,2,6,6-tetramethylpiperidine, 2,6-di-tert-butylpiperidine or derivatives thereof, e.g. bis-(2,2,6,6-tetramethyl-4-piperidyl)sebacate. Stabilizers are usually employed in amounts from 0.1 to 5.0 wt %, relative to the solid components contained in the preparation.

Furthermore, the coating compounds usable in the method according to the invention can additionally contain 0 to 10 wt % of further additives.

Activators, fillers, pigments, dyes, thickeners, thixotropic agents, surfactants, viscosity modifiers, plasticizers or chelating agents can be used as further typical paint additives.

Furthermore, one or more thermally activatable initiators can be added, e.g. potassium peroxodisulfate, dibenzoyl peroxide, cyclohexanone peroxide, di-tert-butyl peroxide, azobisisobutyronitrile, cyclohexylsulfonylacetyl peroxide, diisopropyl percarbonate, tert-butyl peroctoate or benzopinacol, and for example those thermally activatable initiators that have a half-life at 80° C. of more than 100 hours, such as di-tert-butyl peroxide, cumene hydroperoxide, dicumyl peroxide, tert-butyl perbenzoate, silylated pinacols, which are commercially available e.g. under the trade name ADDID 600 from the company Wacker or amine-N-oxides containing hydroxyl groups, such as 2,2,6,6-tetramethylpiperidin-N-oxyl, 4-hydroxy-2,2,6,6-tetramethylpiperidin-N-oxyl, etc.

Further examples of suitable initiators are described in "Polymer Handbook", 2nd ed., Wiley & Sons, New York.

As thickeners, in addition to radically (co)polymerized (co)polymers, usual organic and inorganic thickeners such as hydroxymethylcellulose or bentonite may come into consideration.

For example ethylenediamine acetic acid and salts thereof and β-diketones can be used as chelating agents.

Suitable fillers comprise silicates, e.g. silicates obtainable by hydrolysis of silicon tetrachloride such as Aerosil® from the company Degussa, siliceous earth, talc, aluminum silicates, magnesium silicates, calcium carbonates etc.

When said fillers or other solid particles are added to the coating compounds, it is necessary to ensure that these have particle sizes that are smaller than the microstructures that are to be formed, preferably so much smaller that these particles do not affect the formation of the microstructures.

Moreover, the coating compounds can contain a solvent, for example butyl acetate, ethyl acetate, methoxypropyl acetate, toluene, xylene, fluorinated aromatics, aliphatic and aromatic hydrocarbon mixtures.

Preferably, however, the coating compounds are applied free from solvent.

Coating of the substrates with the coating compounds takes place by usual methods known by a person skilled in the art, wherein a coating compound is applied on the substrate to be coated in the desired thickness and is optionally dried. This operation can be repeated one or more times if desired. Application on the substrate can take place in a known manner, e.g. by spraying, applying with a trowel, applying with a knife, brushing, roller application, application by flooding, laminating, back-spraying or coextrusion. The coating thickness is as a rule in the range from about 3 to 1000 g/m² and preferably 10 to 200 g/m².

Application of the coating compound on glass, for example quartz glass, is conceivable.

The substrate layer preferably consists of a thermoplastic polymer, especially polymethyl methacrylates, polybutyl methacrylates, polyethylene terephthalates, polybutylene terephthalates, polyvinylidene fluorides, polyvinyl chlorides, polyesters, polyolefins, acrylonitrile ethylene propylene diene styrene copolymers (A-EPDM), polyetherimides, polyether ketones, polyphenylene sulfides, polyphenylene ethers or mixtures thereof.

We may further mention polyethylene, polypropylene, polystyrene, polybutadiene, polyesters, polyamides, polyethers, polycarbonate, polyvinylacetal, polyacrylonitrile, polyacetal, polyvinyl alcohol, polyvinyl acetate, phenolic resins, urea resins, melamine resins, alkyd resins, epoxide resins or polyurethanes, block or graft copolymers thereof and blends thereof.

We may preferably mention ABS, AES, AMMA, ASA, EP, EPS, EVA, EVAL, HDPE, LDPE, MABS, MBS, MF, PA, PA6, PA66, PAN, PB, PBT, PBTP, PC, PE, PEC, PEEK, PEI, PEK, PEP, PES, PET, PETP, PF, PI, PIB, PMMA, POM, PP, PPS, PS, PSU, PUR, PVAC, PVAL, PVC, PVDC, PVP, SAN, SB, SMS, UF, UP plastics (acronyms according to DIN 7728) and aliphatic polyketones.

Especially preferred substrates are polyolefins, e.g. PP (polypropylene), which can optionally be isotactic, syndiotactic or atactic and optionally nonoriented or can be oriented by uniaxial or biaxial stretching, SAN (styrene-acrylonitrile copolymers), PC (polycarbonates), PMMA (polymethyl methacrylates), PBT (poly(butylene terephthalate)s), PA (polyamides), ASA (acrylonitrile-styrene-acrylic ester copolymers) and ABS (acrylonitrile-butadiene-styrene copolymers), and physical mixtures thereof (blends). PP, SAN, ABS, ASA and blends of ABS or ASA with PA or PBT or PC are especially preferred.

PET, PP, PE and polymethyl methacrylate (PMMA) or impact-modified PMMA are quite especially preferred.

The thickness of the substrate is preferably 50 μm to mm. A layer thickness of 100 to 1000 μm, especially 100 to 500 μm, is especially preferred.

In the next step, a fine structure is formed by a die that is the negative of a fine structure. It goes without saying that the die must at least correspond to the aspect ratio to be achieved according to the invention, i.e. its aspect ratio must be no smaller than that required. During this step, the die can be pressed against the coating compound applied on the substrate. This can take place stepwise, for example by stamping or embossing, but also continuously, for example by means of rolls and rollers. Optionally this operation can be supported by applying a reduced pressure or an increased pressure or a pressure roll on the back of the substrate, so that fine structures of the die are also replicated.

In another embodiment the substrate contains the die, which has the negative of a microstructure. In this case the substrate is preferably a structure of elastomers, such as polydimethylsiloxane, or cured photoresists. By applying the coating compound on the die, the coating compound fills up the die of the microstructure. This can for example be supported by low pressure.

After application on the die, a further substrate can be applied on the coating compound. The structured coating compound is then separated together with this substrate from the die. This substrate corresponds to the substrate for the first embodiment described above. In this way, a finely structured surface is obtained on this substrate.

After application of the coating compound, this is optionally dried and cured with electron radiation or exposure to light under an oxygen-containing atmosphere or preferably under an inert gas, optionally at temperatures up to the level of the drying temperature.

The drying and/or curing can be carried out before and/or after separating the finely structured surface from the die.

In another embodiment the drying and/or curing is carried out before separation. However, further drying or curing steps can also follow after separation from the die.

This is limited by the thermal stability of the substrate.

Radiation curing is carried out with high-energy light, e.g. (N)IR, VIS, UV light or electron radiation. The radiation curing can take place at elevated temperatures.

Furthermore, a method for coating substrates is disclosed, in which the coating compound according to the invention or formulations containing same, optionally with thermally curing resins added, is applied on the substrate, dried, and after forming of the fine structure is then cured with electron radiation or exposure to UV light under an oxygen-containing atmosphere or preferably under an inert gas, optionally at temperatures up to the level of the drying temperature.

Suitable sources of radiation for radiation curing are e.g. low-pressure, medium-pressure, and high-pressure mercury lamps and fluorescent tubes, pulsed lamps, metal halide lamps, LEDs, electronic flash units, with which radiation curing is possible without photoinitiator, or excimer lamps. Radiation curing takes place through the action of high-energy radiation, i.e. UV radiation or daylight, preferably light in the wavelength range λ=200 to 700 nm, especially preferably λ=200 to 500 nm and quite especially preferably λ=250 to 400 nm, or by irradiation with high-energy electrons (electron radiation; 150 to 300 keV). The radiation sources are for example high-pressure mercury vapor lamps, lasers, pulsed lamps (flashlight), halogen lamps or excimer lamps. The radiation dose usually sufficient for crosslinking in UV-curing is in the range from 80 to 3000 mJ/cm$^2$.

Of course, several radiation sources can also be used for curing, e.g. two to four.

These can also each emit in different wavelength ranges.

Irradiation can optionally also take place with exclusion of oxygen, e.g. under inert gas atmosphere.

Suitable inert gases are preferably nitrogen, noble gases, carbon dioxide, or combustible gases. Moreover, irradiation can take place with the coating compound covered with transparent media. Transparent media are e.g. plastic films, glass or liquids, e.g. water. Irradiation in the manner described in DE 199 57 900 A1 is especially preferred.

In a preferred embodiment, the curing in step c) takes place by irradiation through the substrate.

It is necessary for the permeability of the substrate for the radiation used to be suitable for the photoinitiator used.

For example, PET is permeable to radiation with a wavelength below 300 nm. For example 2,4,6-trimethylbenzoyl-diphenylphosphine oxide, ethyl-2,4,6-trimethylbenzoylphenylphosphinate and bis-(2,4,6 trimethylbenzoyl) phenylphosphine oxide may come into consideration as photoinitiators that produce radicals with this radiation.

If the substrate contains the die and another substrate is applied, irradiation can also take place through this second substrate.

The polymers described are characterized by particularly high structure fidelity. This is essential for precise duplication of the die.

Structure fidelity means that the structuring of the surface obtained is reproduced by the polymer at high resolution. This relates in particular to the sharpness of the edges and any surface structuring. There may, however, be slight stretching of the structure normally to the substrate surface. Thus, the structure may be stretched somewhat in this direction through the pulling-away of the die (for example by 20 to 50%). The structures have an aspect ratio of width to height from 1:10 to 10:1, preferably between 3:1 and 1:3.

Preferred aspect ratios have already been described for the method for producing finely structured coated surfaces. These are at least 0.5, preferably at least 0.7, especially preferably at least 0.9, quite especially preferably at least 1, especially at least 1.3 and in particular at least 1.5.

Independently of that, the upper limit for the aspect ratio is preferably 100, 50, 20, 15, 10 or 5.

In the last step d), the cured coating is separated from the die. If the substrate contains the die, it may be advantageous to apply a substrate on the cured coating prior to separation, optionally using an adhesion-promoting layer.

The die can consist of various materials. They can be soft materials, for example polydimethylsiloxane (PDMS). However, they can also be hard materials, for example metals, preferably nickel.

In another embodiment, the die is a die of a hierarchic fine structure, preferably a hierarchic microstructure. These are structures that contain elements with various orders of magnitude, e.g. a structuring in the order of magnitude of several micrometers, for example 2 to 20 µm, on which a structuring in the range of less than a micrometer, for example 200 nm to 1 µm, is superposed (hierarchy). Generally the smaller structure is contained in the larger structure. Thus, the coating has for example depressions or projections in the order of magnitude of several micrometers, e.g. as a cylinder, or truncated cone, which optionally can have a concave generated surface, which in their turn have depressions or projections on their end faces, which naturally are much smaller. Such structures are generally characterized by the difference in order of magnitude relative to at least one of their dimensions, preferably in at least one direction parallel to the surface of the substrate. As a rule the order of magnitude of a periodic structuring can be established by the pitch of this structure, i.e. the shortest distance until the structure repeats. The order of magnitude of the structure is found from the shortest pitch. Preferred hierarchic structures have a difference of the orders of magnitude of the individual hierarchic stages by a factor from 2 to 1000, preferably from 2 to 100, especially preferably between 2 and 20.

Moreover, the method can comprise the production of a die for producing fine structures on surfaces. Advantageously the fine structures are microstructures.

First a photoresist is applied on at least one die substrate. Die substrates that can be used are preferably precious metals, oxide glasses, mono- or polycrystalline die substrates, semiconductors, metals with or without a passivated surface, plastics or generally substrates with high resistance to the subsequent procedures. Especially these are Pt, Au, GaAs, $In_yGaAs$, $Al_xGaAs$, Si, glass, graphite, diamond, mica, $SrTiO_3$ and doped modifications thereof. The usable die substrates can be both planar, flat die substrates and those with planar, curved (convex or concave) surfaces.

A smooth die substrate can be coated with a photoresist e.g. by spin-coating. The thickness of the film can then be between 10 nm and 1000 µm. Thicknesses from 1 µm to 500 µm are preferred, especially preferred between 5 µm and 50 µm. The thickness of the layer determines the maximum height of the later structure of the die. With especially fine structures the layer thickness can even be between 10 nm and 1 µm.

In addition, an adhesion-promoting or antireflective material, e.g. Wide 15 B (Brewer Science), can be applied on the die substrate.

A photoresist is a material whose solubility in a solvent varies depending on the incident radiation dose. The photoresists used can be commercially available photoresists that are known in the prior art. The solubility of the irradiated regions may increase (positive photoresists) or decrease (negative photoresist). This may also apply to the solubility of the photoresist after drying and/or stoving steps.

It can for example be a photoresist based on DNQ (diazonaphthoquinone) (e.g. AZ9260 from AZ Electronic Materials). However, it can also be an epoxide-based photoresist such as SU-8 (Microchem. Corp.).

Optionally, a drying step can also be carried out to increase the viscosity of the applied photoresist. This can take place simply by storage at room temperature, for example at humidity of the air above 40% relative humidity, or by stoving processes, preferably on a hot-plate.

In the next step, the photoresist is exposed selectively to visible light, UV radiation, X-rays or electron radiation.

Exposure can take place conventionally by masking or preferably by interference (interference lithography). In this, interference of several coherent radiation sources produces the desired intensity distribution in the irradiated composition. This can take place through the interference of at least two, preferably two to four electromagnetic waves whose wavelength is in the sensitive range of the material used. The exposure to light can also be carried out several times. What is decisive is that after exposure to light, the desired areal dose distribution has been achieved. Thus, the exposure to light can also take place several times with different substrate position and/or orientation. With interference of several light sources, in particular regular patterns can be produced. For example, through interference of three light sources it is possible to produce a hexagonal intensity pattern.

Using interference lithography it is possible to irradiate areas of more than 1 m² in one step.

In a further embodiment, the structure is embossed in the photoresist by impressing a master, e.g. a stamp (microreplication). The master can in its turn be obtained by casting a die produced by the method of the patent application.

Optionally, another layer of a photoresist can be applied on the layer, and this in its turn is provided with a structure by selective exposure to light or by embossing.

The method is suitable in particular for producing hierarchic structures. For this, at each repetition, a structure of another order of magnitude is produced.

Advantageously, with each repetition, a structure is produced with increasing order of magnitude. This has the result that dies are obtained for structures that comprise superimposed structures of decreasing order of magnitude, i.e. for example cylindrical pedestals with, arranged on their end faces, in their turn cylindrical projections with a far smaller order of magnitude.

The layers obtained are then developed, i.e. either the exposed portion is dissolved from the film (positive photoresist) or the unexposed photoresist is dissolved from the film (negative photoresist). The inscribed patterns and structures represent depressions in the photoresist. The structures can be periodic or aperiodic. The structures can have lateral structural dimensions in the range between 30 nm and 50 µm and a structure height of up to 100 µm, for example between 50 nm and 100 µm.

Development takes place in relation to the photoresist used, e.g. potassium hydroxide solution. The strength of development and also the profile form and/or depth of the finished structure can be set by the concentration of the developer solution and the development time.

Through precise adjustment of the drying steps before exposure and of the development parameters, with DNQ/novolac resists a broadened plateau can be formed on the structure. This so-called T-topping in the context of photoresist has a particularly advantageous effect on the adhesion properties.

Advantageously, all applied layers are developed together, preferably all layers structured by exposure to light are developed simultaneously. In this way, the hierarchically structured depressions are obtained with one development step.

Further steps, such as additional drying steps and coating steps, can also be included.

The method is suitable in particular for producing hierarchic structures with a pedestal structure. For this, in the first steps the negative of a fine structure or microstructure is produced by interference lithography and/or microreplication. In the structured surface produced by die copying, this region forms the contact structure of the structured surface, i.e. the region of the structured surface that exerts an influence on adhesion through contacting.

The method now makes it possible, in a last step, to apply the contact structure on a pedestal structure in a simple way. As a result, the adhesiveness of the surface can be improved.

To produce a pedestal structure, it may first be necessary to dry or cure the layers of the die for the contact structure.

Then another layer of photoresist is applied, in which the pedestal structure is to be irradiated. The thickness of the layer applied determines the subsequent height of the pedestal. Advantageously it is more than twice as thick as the layers of the contact structure, advantageously more than 5 times as thick (measured during application of the photoresist).

In the next step the photoresist is exposed by means of interference lithography. Advantageously, a hexagonal intensity pattern is used during this.

The order of magnitude of the pedestal structure is selected in such a way that it is at least 1.5 times, preferably more than twice as large as the largest order of magnitude of the contact structure. This means, for example in the case of cylindrical structures as contact structure and pedestal structure, that the diameter of the pedestal structure is at least times as large as the largest diameter of a structure of the contact structure.

After exposure, the layers are cured and/or heat-treated.

Advantageously, the method is suitable for producing structures with an aspect ratio (height to diameter) between 1:10 and 10:1, preferably between 3:1 and 1:3, and the aspect ratios described for the finely structured surface. These aspect ratios apply to the respective step in the hierarchy.

In the last step, all layers are developed together. The die is formed during this. The die is preferably used in the method described above for producing structured surfaces.

The die obtained can also be replicated in an elastomer, e.g. silicone, polydimethylsiloxane (PDMS), Sylgard® 184, elastic polyurethane, PolyOptic® 1470 from PolyConForm, or nickel.

In the process described above, it is also possible to work exclusively with interference exposure.

Advantageously, a negative photoresist is used.

The method can also be carried out with a combination of interference lithography and microreplication. For example, the negative of the contact structure can be produced by embossing.

For this, for example a die substrate can be coated with an adhesion promoter. Then the die substrate is coated with a positive photoresist (e.g. based on DNQ/novolac). After drying, this layer is exposed to light and the structure obtained is developed. The structure obtained is copied with an elastomer. In order to obtain the correct positive of the structure it may be necessary for the elastomer obtained to be copied again with another elastomer.

This replicated structure can be used as a stamp for forming the die for the negative of the contact structure.

Then, as already described, further structures are applied on the embossed structure, and preferably the pedestal structure is produced.

The use of an embossing step for producing the contact structure has the advantage that such a stamp produced from an elastomer can be used for many embossing operations. In this way the die production process can be speeded up considerably.

The method described has the advantage that it only requires a few steps and the layers can be applied and structured easily, one after another. Then all layers can be developed together.

With this method, the dies for hierarchic structures can also be produced easily. This is achieved in particular because owing to development together at the end of the process, it is not essential to align the negative of the contact structure on the pedestal structure.

An epoxide photoresist such as SU-8 can be used as the negative photoresist.

Advantageously, the dies are inertized before use. This can be done by coating with substances that apply inertizing groups on the surface. This can be done by ionic or polar bonds (for example hydrogen bridges, carboxylic acid groups, amines, alkylamines, amides, imines, imides, ketones, thiols, cyanides, ethers), dipole-dipole interactions (for example aromatic groups) or covalent bonds (for example ester, ether, Si—O— bonds).

The inertizing groups are groups that have little interaction with other surfaces. These are for example unsubstituted or mostly substituted hydrocarbon groups. These groups can also contain unsaturated or aromatic hydrocarbon groups.

Examples of unsubstituted groups are for example linear or branched hydrocarbons with more than 5 carbon atoms, preferably between 5 and 30 carbon atoms. They can also be aromatic groups, i.e. groups that have one or more aromatic systems.

Advantageously, inertizing groups have fluorine atoms, advantageously more than 50% of the positions for hydrogen atoms are substituted with fluorine atoms, preferably more than 60%, especially preferably more than 70%. Preferably they are perfluorinated groups, which can however have 0 to 4 carbon atoms that are not fluorinated, e.g. 1H,1H,2H,2H-perfluoro groups. The compounds can be perfluorinated carboxylic acids. Silanes that have corresponding groups and additionally at least one hydrolyzable group, which can form a covalent bond with the die, are preferred. Examples of said silanes are $CF_3CH_2CH_2SiCl_2$ $(CH_3)$, $CF_3CH_2CH_2SiCl(CH_3)_2$, $CF_3CH_2CH_2Si(CH_3)$ $(OCH_3)_2$, $CF_3CH_2CH_2SiX_3$, $C_2F_5CH_2CH_2SiX_3$, $C_4F_9CH_2CH_2SiX_3$, n-$C_6F_{13}CH_2CH_2SiX_3$, n-$C_8F_{17}CH_2CH_2SiX_3$, n-$C_9F_{21}CH_2CH_2SiX_3$ (X=$OCH_3$, $OC_2H_5$ or Cl); i-$C_3F_{10}$—$CH_2CH_2CH_2$—$SiCl_2(CH_3)$, n-$C_6F_{13}$—$CH_2CH_2$—$SiC(OCH_2CH_3)_2$, n-$C_6F_{13}$—$CH_2CH_2$—$SiCl_2(CH_3)$ and n-$C_6F_{13}$—$CH_2CH_2$—$SiCl$ $(CH_3)_2$. $CF_3CH_2CH_2SiX_3$, $C_2F_5CH_2CH_2SiX_3$, $C_4F_9CH_2CH_2SiX_3$, n-$C_6F_{13}CH_2CH_2SiX_3$, n-$C_8F_{17}CH_2CH_2SiX_3$, n-$C_9F_{21}CH_2CH_2SiX_3$ (X=$OCH_3$, $OC_2H_5$ or Cl) are especially preferred.

The invention further relates to a structured surface of a solid body, wherein the surface has projections in a regular arrangement with spacing in the range from 5 µm to 50 µm. The projections can be of any shape. Thus, it can be a one-dimensional arrangement. This means that the projections have a markedly greater extension in a direction along the surface, than in the other directions. This is for example the case when the surface is structured with grooves. The projections of the surface have on their surface, in their turn, projections in a regular arrangement with spacing in the range from 0.1 µm to 3 µm.

Advantageously, the projections have a boundary in each direction.

In another embodiment the projections are cylindrical shapes, cones, truncated cones, circular disks or combinations thereof.

Said shapes can for example also be cones, on whose vertex there is a circular disk, which is preferably oriented parallel to the surface. A mushroom-shaped structure is obtained in this way. Advantageously, the structure has, relative to the maximum extensions of a projection, an aspect ratio of height to diameter between 1:10 and 10:1, preferably between 3:1 and 1:3 or 2:1 and 1:2. Such structures are also called T-toppings.

The orders of magnitude, i.e. height and width, of the projections are in the range from 1 µm to 50 µm, especially preferably in the range from 2 to 20 µm.

Solid bodies with a structured surface of this kind can be used in all areas where adhesion between surfaces has to be controlled. Such surfaces can be provided as adherent surfaces in all areas of technology where joints are to be produced between various objects. They can replace suction, Velcro and magnetic holders.

These surfaces are easy to produce and therefore can also be applied over large areas on surfaces, for example also by gluing a correspondingly structured film on said surface.

Areas for application of these structured solids are for example in transport engineering, structural engineering, medical engineering, textile technology, sports technology, household article technology.

Further details and features can be seen from the following description of preferred practical examples in conjunction with the subclaims. The respective features can be implemented on their own or several in combination. The possibilities for solving the problem are not limited to the practical examples. Thus, for example, ranges of values always comprise all—unstated—intermediate values and all conceivable partial ranges.

The practical examples are shown schematically in the drawings. Identical reference numbers in the individual diagrams designate the same or functionally identical or functionally corresponding elements. In detail, the drawings show:

DETAILED DESCRIPTION OF INVENTION

Figure 1:
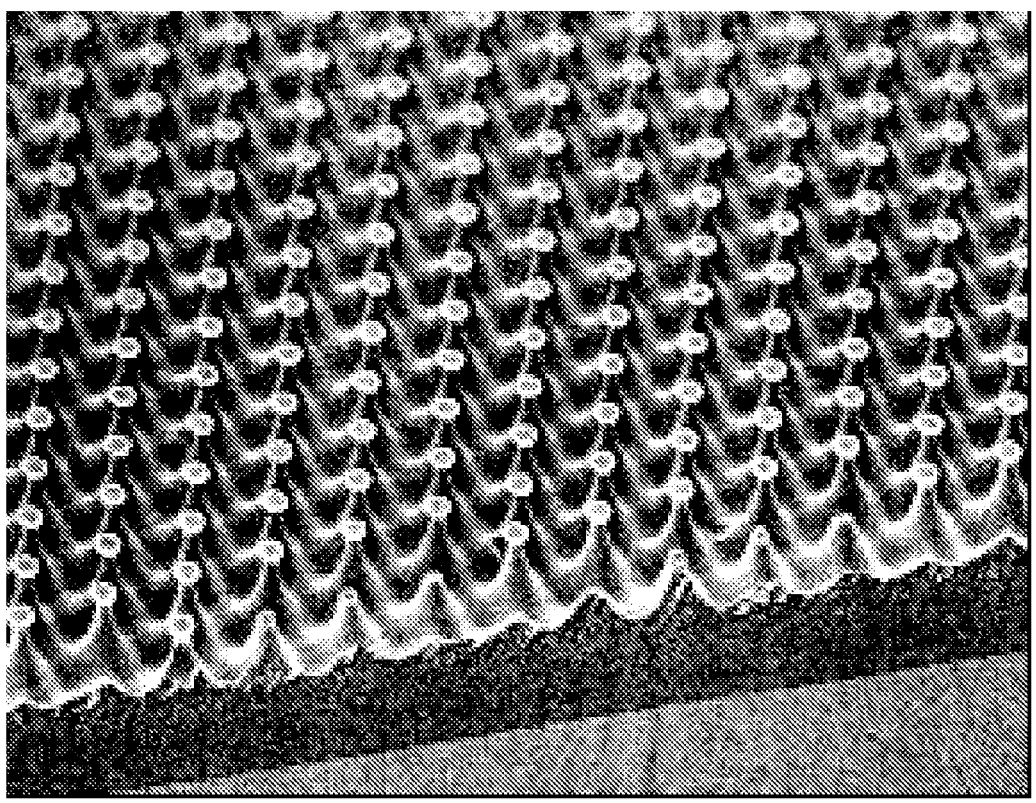
FIG. 1 SEM (scanning electron microscope) image of a structure produced S1.

FIG. 1 shows a surface structured with structure S1, which is structured with a hexagonal arrangement of projections. The projections have a decreasing diameter similar to a cone, and at the top this cone does not form a point, but a broadened end face parallel to the surface, similar to a mushroom (T-topping). However, the diameter of the end face is smaller than the base of the cone. However, it can also be larger. The material of the structure is polydimethylsiloxane Sylgard® 184 (Dow Corning). The structures have a height of approx. 10 µm, a tip diameter of about 2.2 µm and a distance from the mid-point of the structure of about 7.5 µm. This gives, for this structure, an active contact area of about 8% (packing density).

Figure 2:
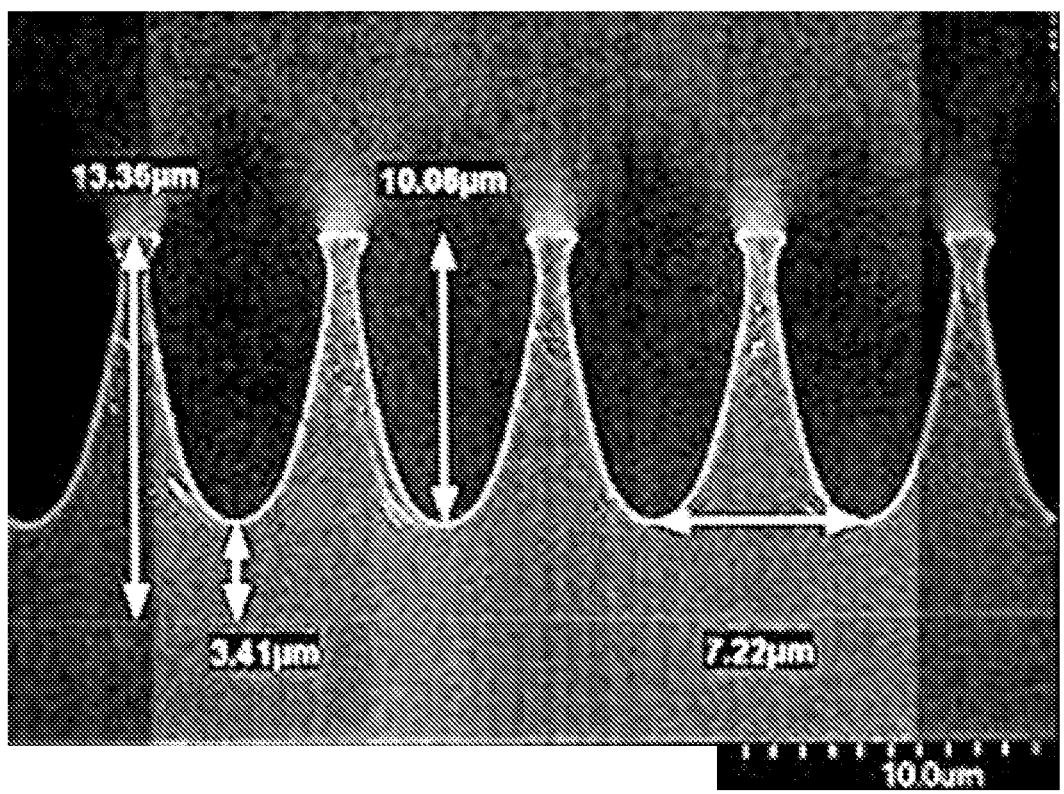
FIG. 2 SEM image of a cross-section of structure S2.

FIG. 2 shows a cross-section of a surface structured with structure S2. The cross-section is similar to the cross-section of a projection of structure S1. However, the structure does not have any conical projections, but the structures shown in cross-section extend perpendicularly to the plane of FIG. 2 over the whole surface. The surface has a linear structure. The linear structures have a height of about 10 µm, a tip width of 1.8 µm and a linear structure spacing of about 7.2 µm. This gives a packing density of about 25%. The structures were produced from polydimethylsiloxane Sylgard® 184 (Dow Corning).

Figure 3:
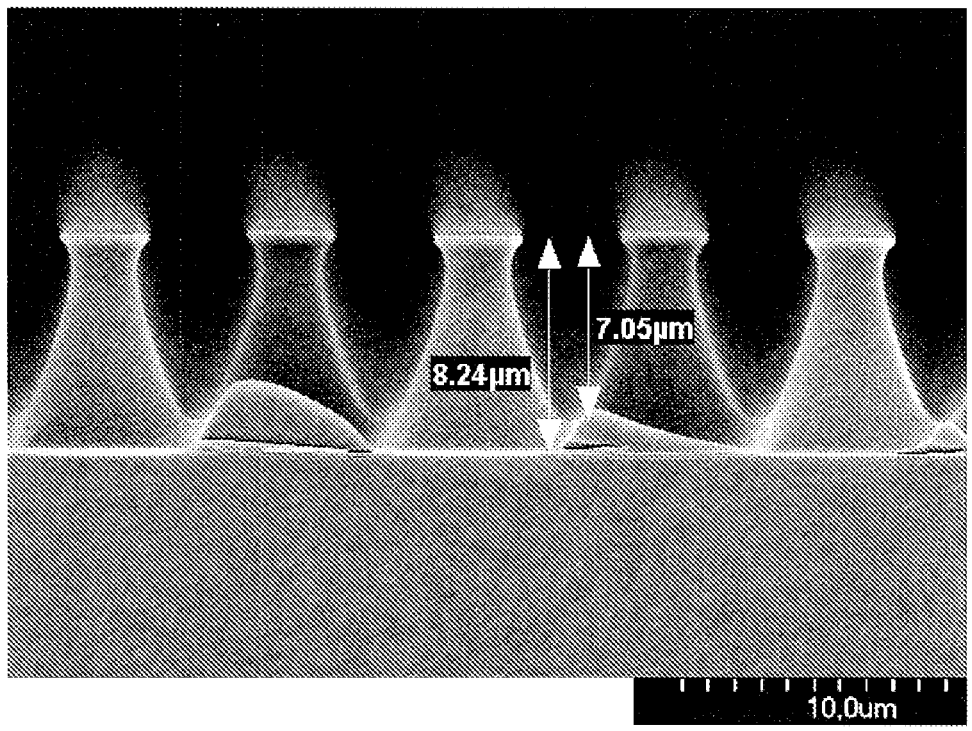
FIG. 3 SEM image of a cross-section of structure S3.

FIG. 3 shows a surface structured with structure S3. Once again it is a mushroom-like structure with conical pedestals.

Figure 4A:
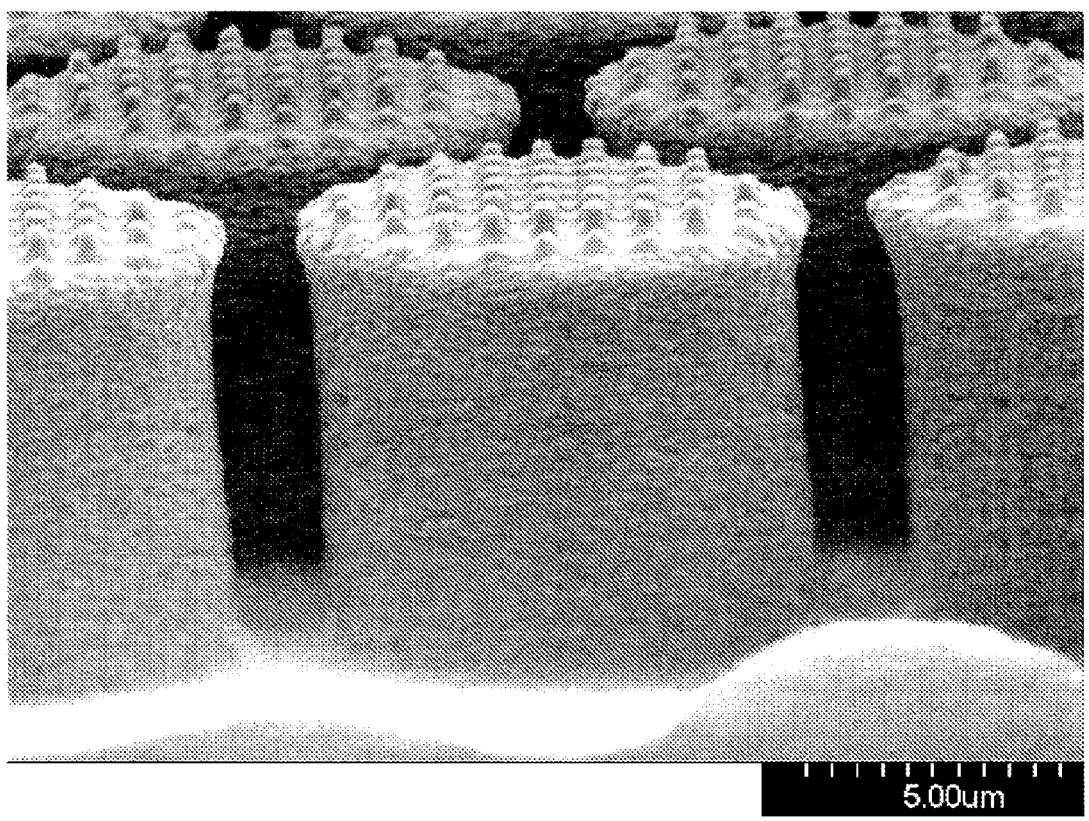
FIG. 4*a* SEM image of a hierarchic structure S4.
Figure 4B:
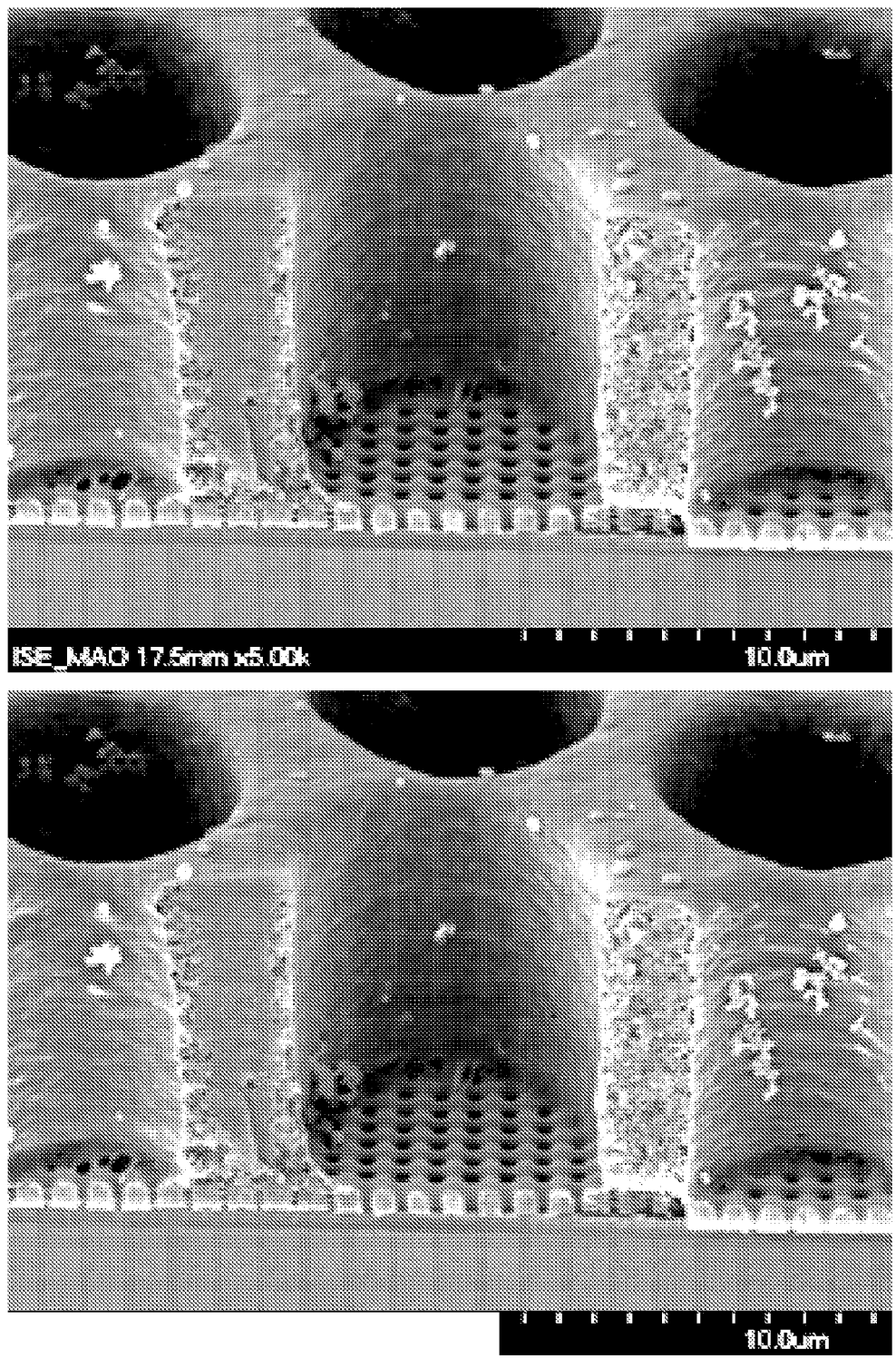
FIG. 4*b* SEM image of the die for structure S4.

FIG. 4a shows a surface structured with structure S4. This is characterized in particular by the 10-μm diameter, substantially cylindrical pedestals, which have a further structure on their end face. The pedestals have an order of magnitude of approx. 12 μm, whereas the order of magnitude of the structure on the end face is approx. 1 μm. The structure was produced from PDMS (Elastosil® 604). The aspect ratio of height to width of the projections is about 1:1. FIG. 4b shows the die for structure S4.

Figure 5:
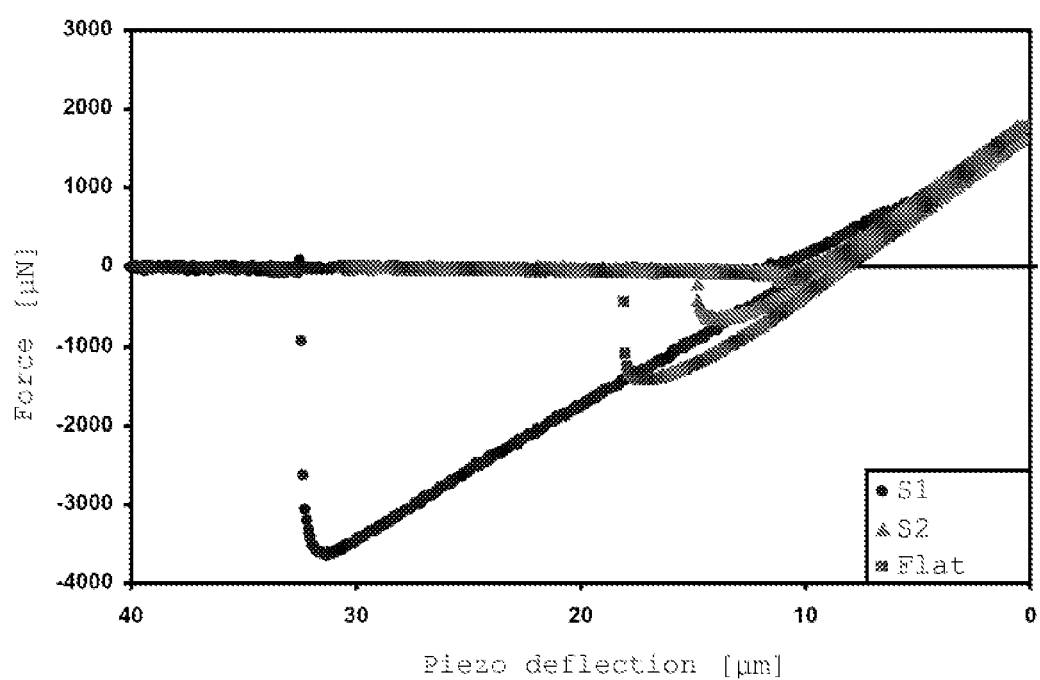
FIG. 5 Adhesion measurements on specimens with different structure geometry.

FIG. 5 shows adhesion measurement on specimens with structures S1 and S2 (in each case made of PDMS) against the flat (unstructured) surface. It can be seen that the linear structure even has reduced adhesion, compared with the unstructured surface. In contrast, structure S1 shows an increase in adhesion by a factor of 3, compared to the unstructured specimen. Calculated on the basis of the contact area, a value of about 150 kPa is found for the adhesion per unit area of this specimen.

Figure 5A:
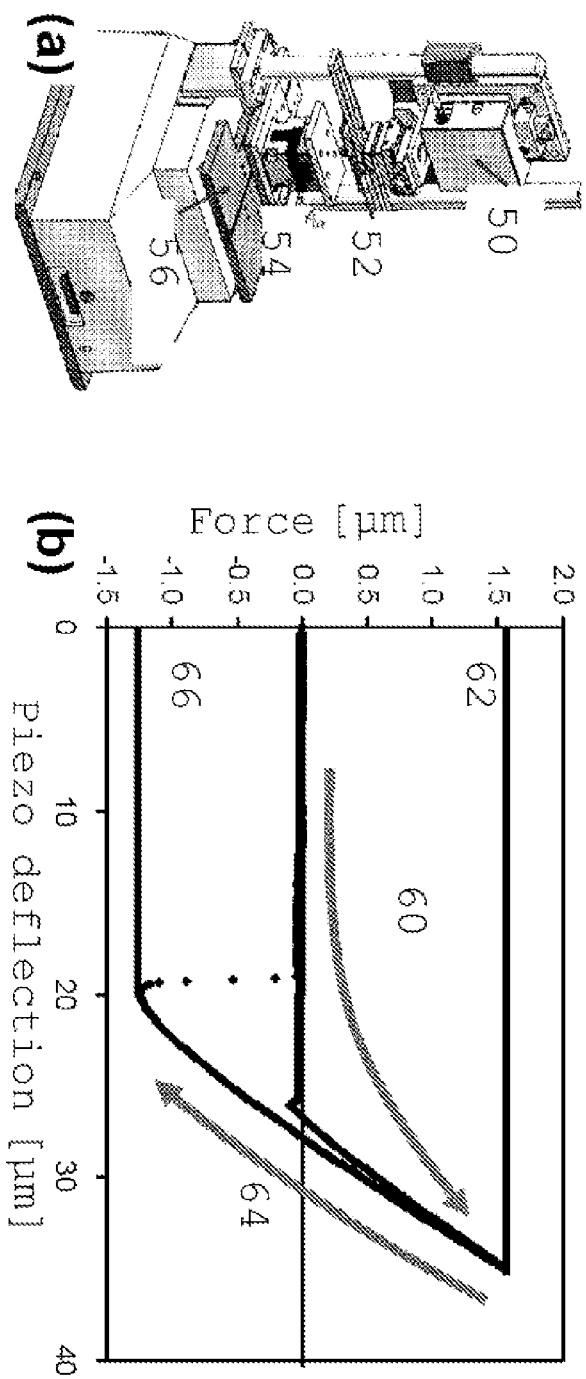
FIG. 5*a* Schematic representation of the adhesion measuring device (a); typical measurement (b)

FIG. 5a shows the device for measuring adhesion (FIG. 5a a)), and a typical force/deflection diagram for a measurement (FIG. 5a b)). This device has a laser interferometer (miniature interferometer SP120, SIOS GmbH, Germany; accuracy +/−50 nm) 50, which measured the deflection of a glass spring (spring constant 276.9±1.4 N/m) with measurement substrate 52. The substrate is positioned on a piezoelement (Hexapod, PI Physik Instrumente, Germany) 54, which is mounted on a 6-axis table 56. For measurement, the substrate to be measured is brought in contact with the measurement substrate and the glass spring and the deflection of the glass spring is measured with the interferometer. The force can be measured from the deflection using the spring constant. Variously formed articles can be used as measurement substrate. They can be tips or spheres of various materials.

FIG. 5a (b) shows a typical measurement diagram. In the course of the measurement the substrate is pressed against the measurement substrate 60. This leads to deflection of the glass spring. The substrate can be pressed against the measurement substrate up to a certain preload 62. Then the substrate is moved back in the opposite direction 64. If there is adhesion between substrate and measurement substrate, the measurement substrate remains adhering to the specimen and there is deflection of the spring in the opposite direction until the specimen is detached (pull-off force, 66).

Figure 6:
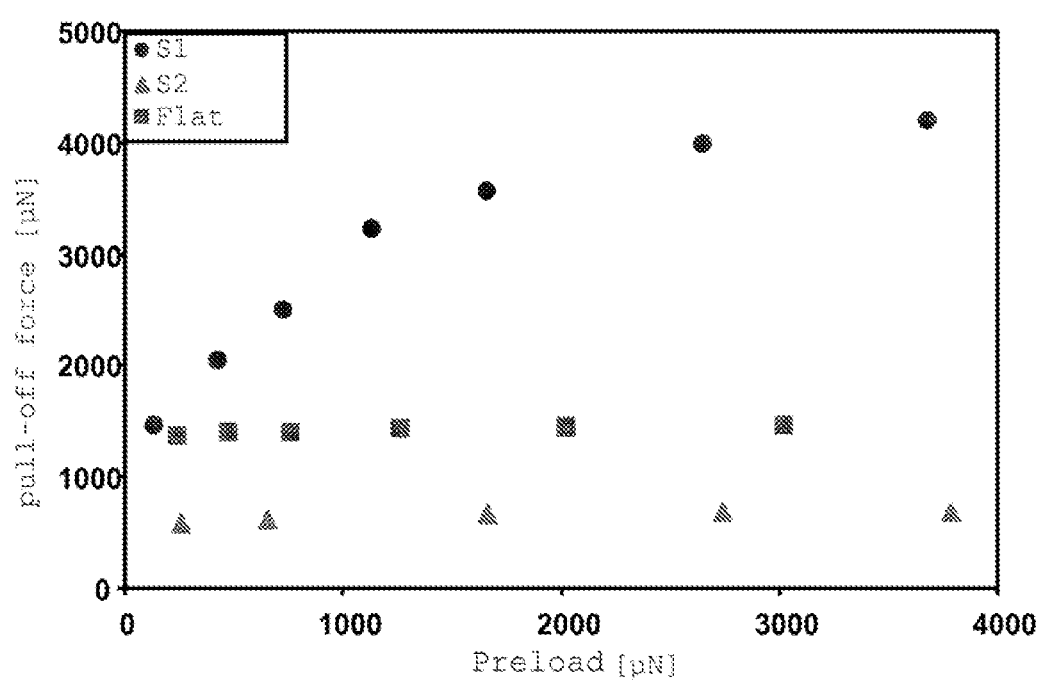
FIG. 6 Preload relationship of the adhesive force for different structures.

FIG. 6 shows the dependence of the adhesion of the specimens (designated as "pull-off force") from FIG. 5 on the preload. The linear structures S2 and the unstructured control specimen show no dependence on the preload to a first approximation, whereas structure S1 shows a definite dependence. For high preloads there is a marked improvement of the surface structured with structure S1 compared to the unstructured surface.

It can be seen from the measurements that the structure geometry is of great importance for the adhesion of the structure. For it to be possible to produce these structures simply, the polymers must be able to replicate such structures in high definition.

Mixtures of various acrylates were used as polymers in the examples:

2-Phenoxyethyl acrylate (POEA)

Dipropylene glycol diacrylate (DPGDA)

Amine-modified polyester acrylate (PESA), obtainable by reacting a polyesterol with a molecular weight of about 600 g/mol, made up of dipropylene glycol and adipic acid (equimolar), with 1.2 equivalents (carboxylic acid groups per hydroxyl group) of acrylic acid, followed by reaction of the unreacted acrylic acid with 1 equivalent (epoxy groups per carboxylic acid group) of bisphenol-A-diglycidyl ether and activation of the acrylate groups with 2 wt % of ethylene diamine.

Reaction product of 2 equivalents of acrylic acid with butanediol diglycidether (BDGEA)

Trimethylolpropane-formal monoacrylate (TMPFMA)

Product of reaction of a polyester diol from adipic acid and neopentyl glycol with molecular weight approx. 500 g/mol with 2 equivalents of isophorone diisocyanate and 2 equivalents of hydroxyethyl acrylate (UA 1).

Product of reaction of trimethylolpropane with 3 equivalents of ethylene oxide and 3 equivalents of acrylic acid (ETMPTA)

Product of reaction of trimethylolpropane with 3 equivalents of ethylene oxide and 3 equivalents of acrylic acid and activation of the acrylate groups with 4 wt % diethanolamine (ETMPTA-A).

Reaction of a caprolactone diol with a molecular weight of approx. 400 g/mol with isophthalic acid to a polyester diol with an OH number of 36 mg KOH/g and reaction of the polyester diol with 2 equivalents each of isophorone diisocyanate and hydroxyethyl acrylate (UA 2).

| Example | POEA [wt %] | DPGDA [wt %] | PESA [wt %] | Viscosity [mPas] | Elastic modulus [MPa] | Double Bond density [mol/kg] |
|---|---|---|---|---|---|---|
| Blend 1 | 50 | 12.5 | 37.5 | 79 | 9 | 6.0 |
| Blend 2 | 70 | 8.5 | 21.5 | 30 | 4 | 5.1 |
| Blend 3 | 10 | 22.5 | 67.5 | 593 | 17 | 4.8 |
| Blend 4 | 90 | 2.5 | 7.5 | 13 | 1 | 5.2 |

| Example | UA 1 [wt %] | EDGA [wt %] | POEA [wt %] | UA 2 [wt %] | Viscosity [mPas] | Elastic modulus [MPa] | Double bond density [mol/kg] |
|---|---|---|---|---|---|---|---|
| Blend 5 | 50 | 50 | | | 39 | 4 | 3.4 |
| Blend 6 | | | 65 | 35 | 91 | 3 | 3.6 |

| Example | BDGEA [wt %] | TMPFMA [wt %] | ETMPTA-A [wt %] | ETMPTA [wt %] | POEA [wt %] | Viscosity [mPas] | Elastic modulus [MPa] | Double bond density [mol/kg] |
|---|---|---|---|---|---|---|---|---|
| Blend 7 | 50 | 50 | | | | 39 | 4 | 5.5 |
| Blend 8 | | | 10 | 10 | 80 | 91 | 3 | 5.4 |

The viscosities of the coating compounds range from 10 mPas to 600 mPas. The elastic modulus of the cured coating compounds is between 1 and 20 MPa.

Advantageously, the coating compound has a content of
5 to 80 wt %, preferably 10 to 50 wt % or 15 to wt % POEA;
5 to 35 wt %, preferably 7 to 30 wt % or 15 to wt % DPGDA;
10 to 80 wt %, preferably 15 to 75 wt % or 50 to 75 wt % PESA;
with the proviso that the values, plus possible additives already described, add up to 100 wt %.

Figure 19:
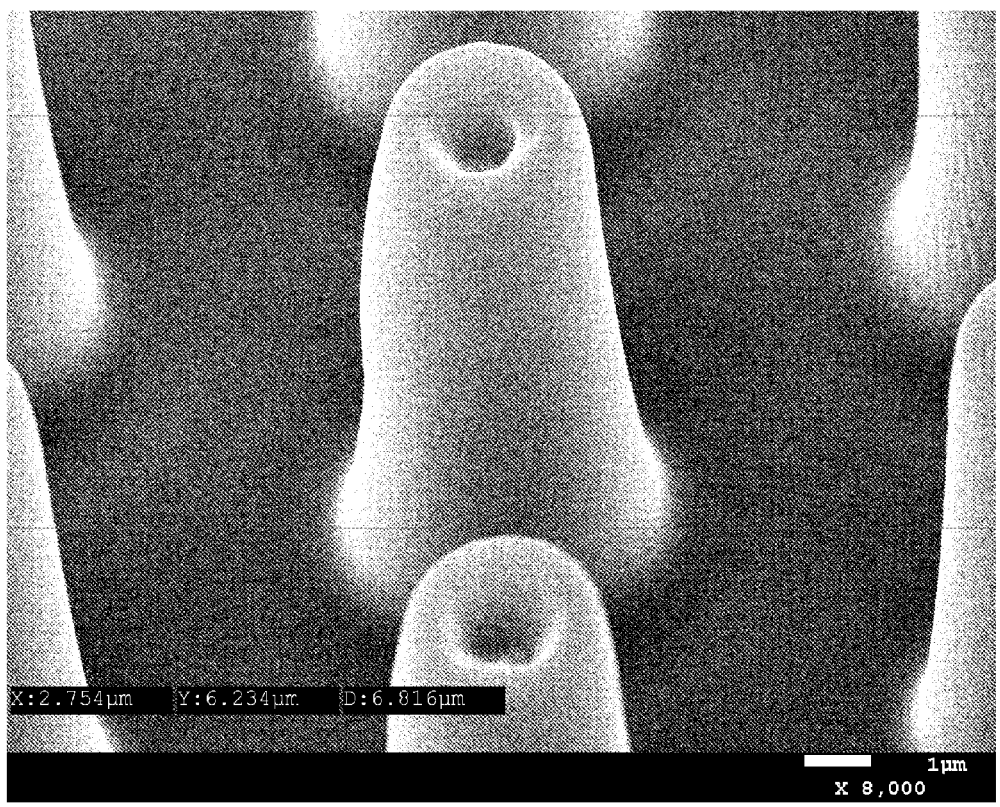
FIG. 19 shows a structure that was obtained by applying a coating compound from mixture 8 on a die.
Figure 20:
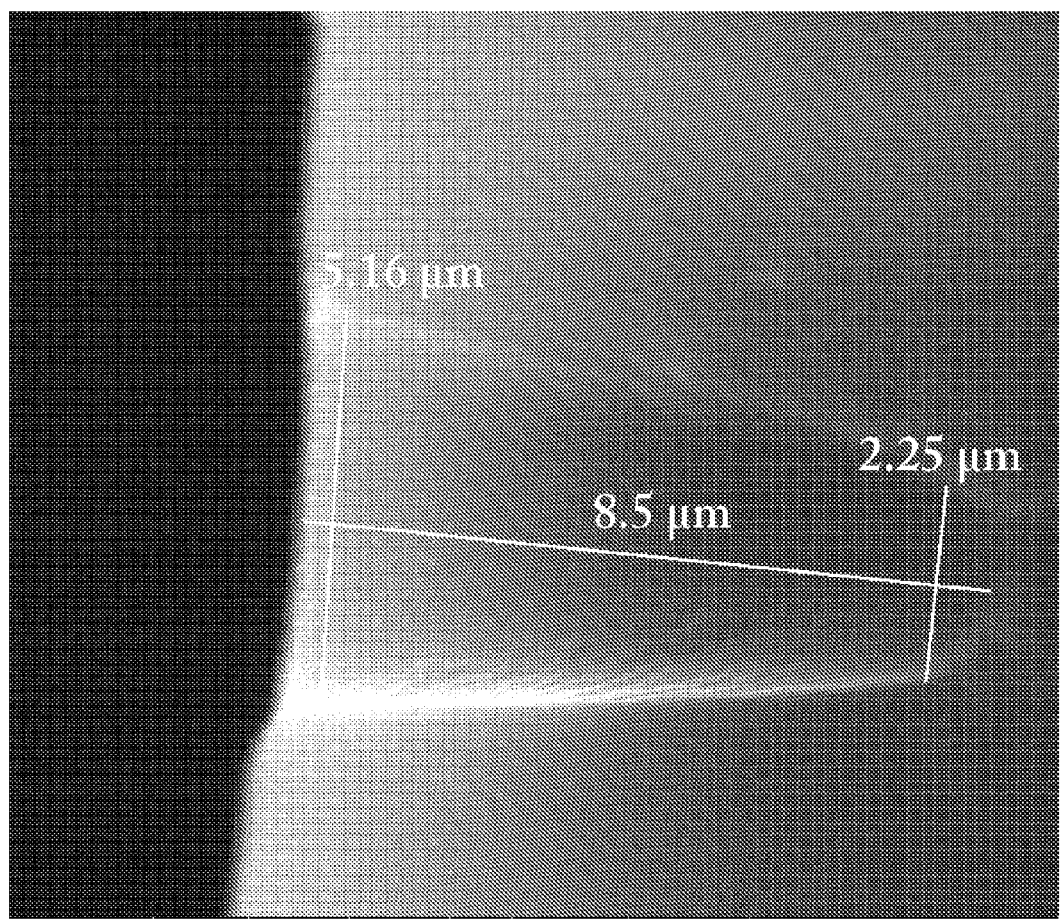
FIG. 20 shows a segment of FIG. 19 in cross-section.

FIG. 19 shows a structure that was obtained by applying a coating compound from mixture 8 (viscosity before UV-curing: 91 mPas, elastic modulus: 3 MPa, double bond density: 5.4) on a die, a segment of which is shown in cross-section in FIG. 20. It was exposed to UV light for 5 minutes.

COMPARATIVE EXAMPLE

A dispersion of a polyacrylate, obtained by polymerization of 58 wt % of n-butyl acrylate, 40 wt % of methyl methacrylate and 2 wt % of acrylic acid (glass transition temperature of the polyacrylate: 0° C.), to which 30 wt % of ETMPTA and 3.5% of Lucirin® TPO-L (ethyl-2,4,6-trimethylbenzoylphenyl phosphinate, photoinitiator from BASF SE, Ludwigshafen) had been added, was coated in a thickness of 20 µm on a substrate. The viscosity of this mixture was 10 kPas.

A die made of PDMS was pressed onto this uncured coating at 2.0 bar and a speed of 0.1 m/min, followed by exposure to UV light for 5 minutes at a distance of 35 cm for curing.

Figure 21:
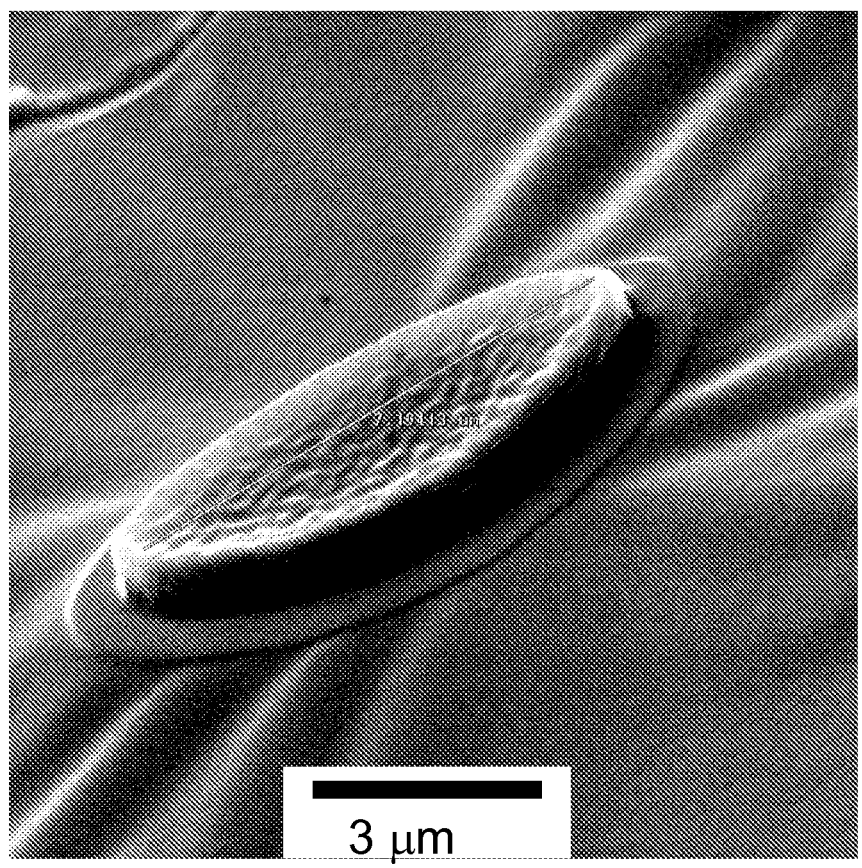
FIG. 21 shows a structure obtained with a coating compound.
Figure 22:
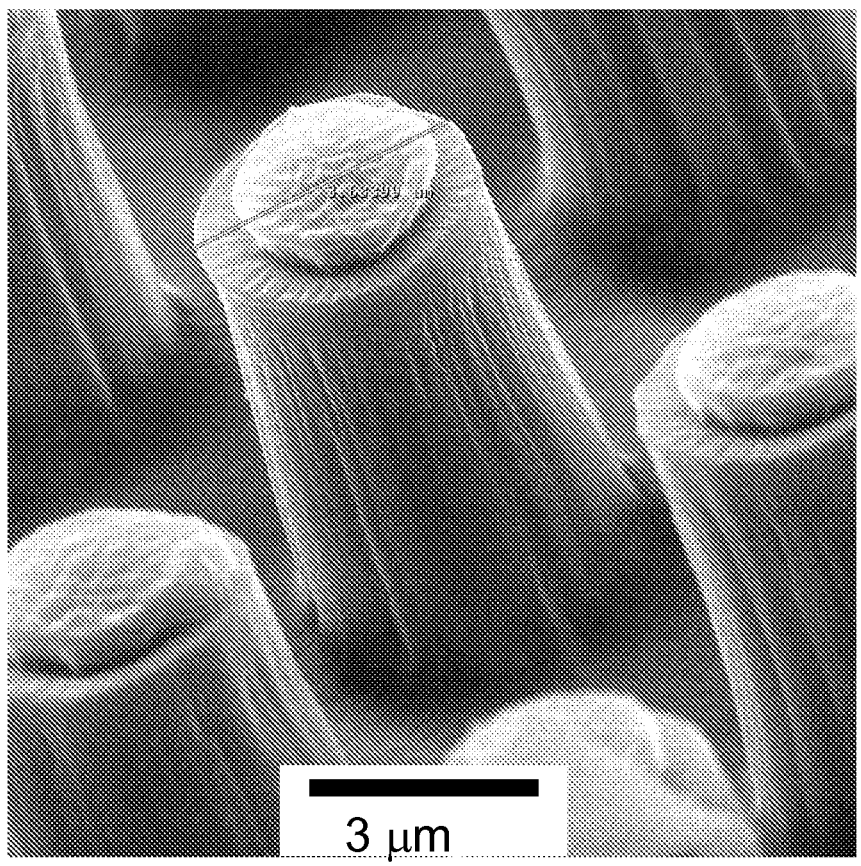
FIG. 22 shows a structure obtained with a coating compound mixture 1.

FIG. 21 shows the structure obtained with this coating compound, and FIG. 22 shows the structure that was obtained with a coating compound mixture 1 with a viscosity of 79 mPas, an elastic modulus of 9 MPa and a double bond density of 6.0 mol/kg.

It can be seen that with a high-viscosity coating compound, the die structure cannot be replicated adequately, whereas with a coating compound that has a viscosity according to the invention, the shape of the die can be reproduced well.

Figure 7:
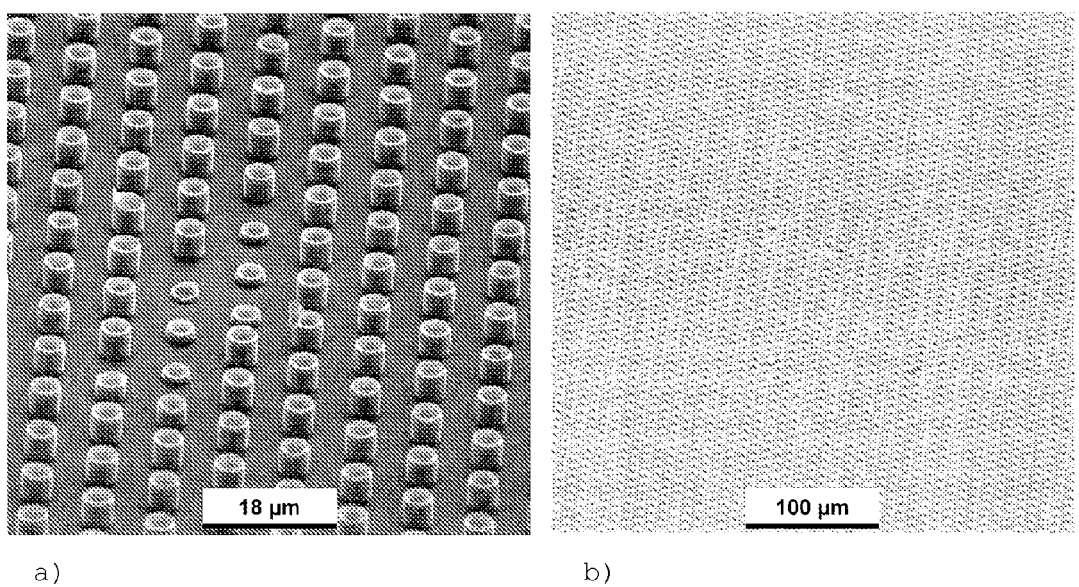
FIG. 7 SEM images of the structure produced S5.
Figure 8:
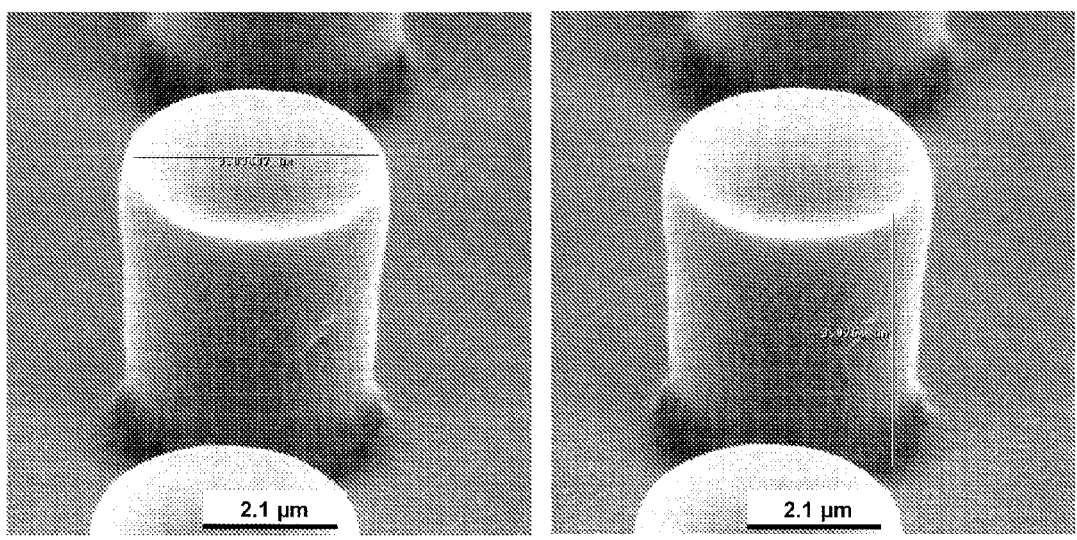
FIG. 8 SEM images of the structure produced S5; the height of the projection is 3.80 µm, the diameter 3.83 µm.

FIG. 7 shows structure S5 that was obtained by applying the polymer blend mixture 3 on a die made of nickel, which had a regular hexagonal arrangement of cylindrical structures. It was exposed to UV light for 5 minutes. FIG. 8 shows a detail from FIG. 7.

Figure 9:
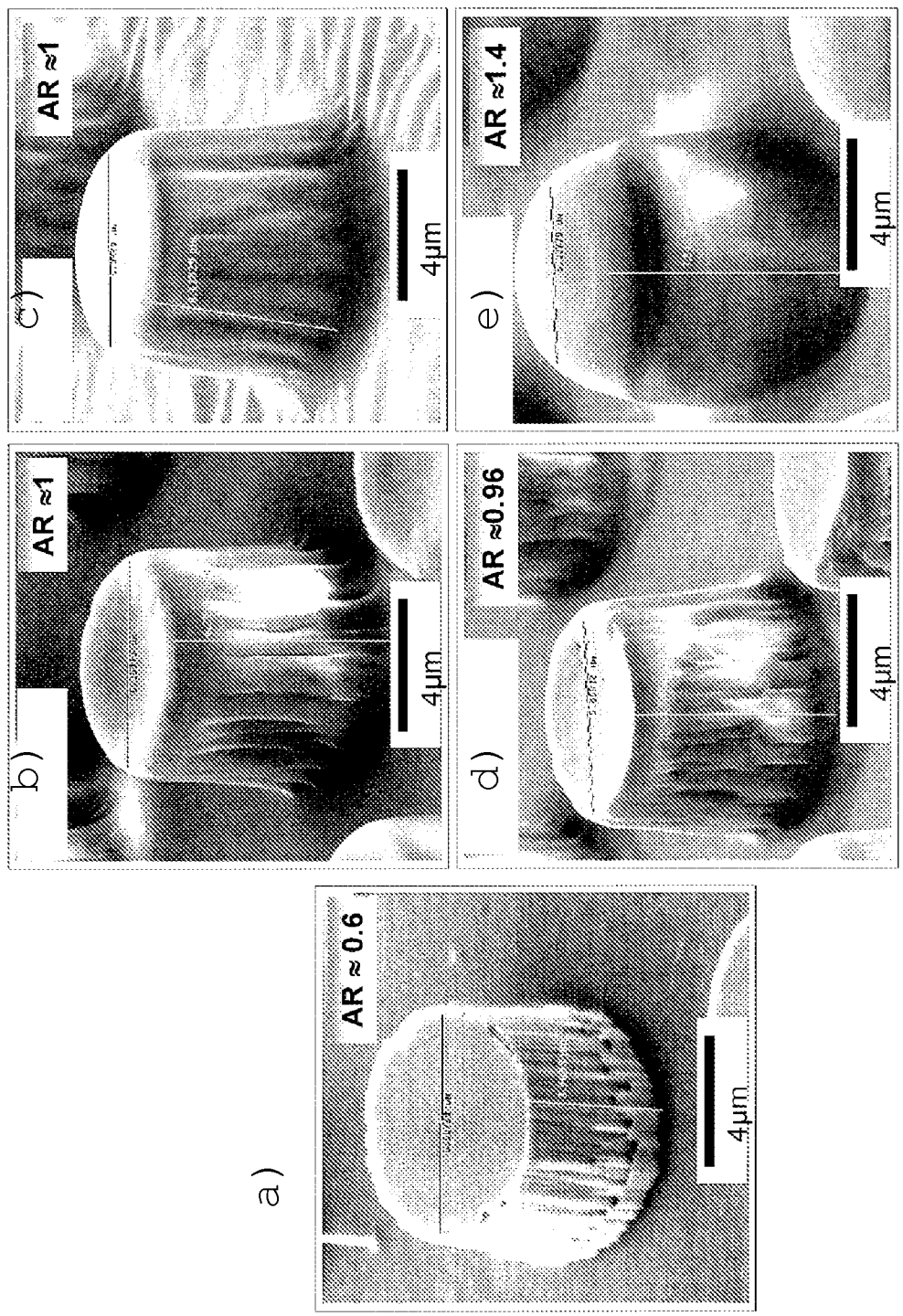
FIG. 9 SEM images of structures produced with various polymer blends for investigating the replication accuracy for structure S7.
Figure 10:
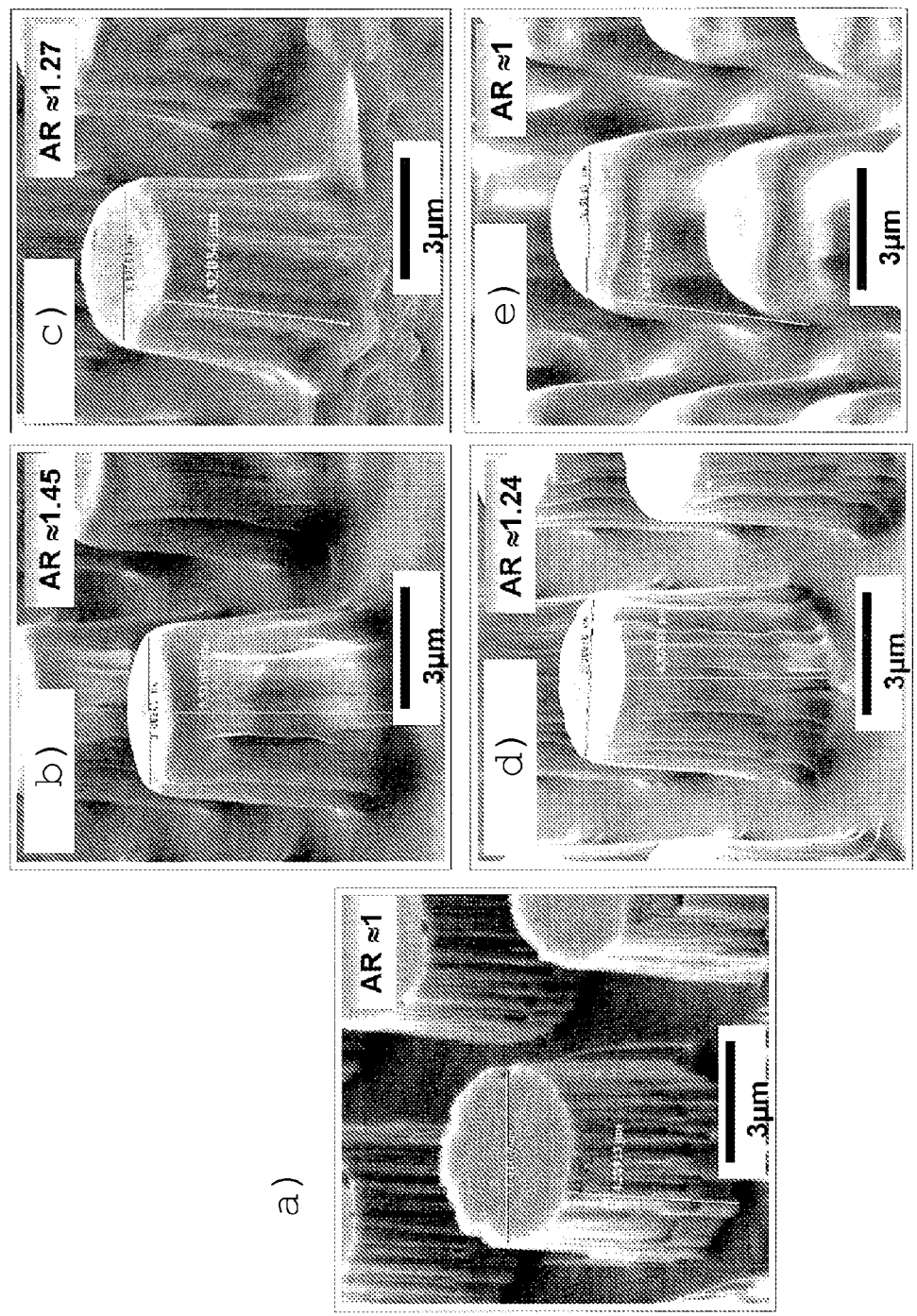
FIG. 10 SEM images of structures produced with various polymer blends for investigating the replication accuracy for structure S8.
Figure 11:
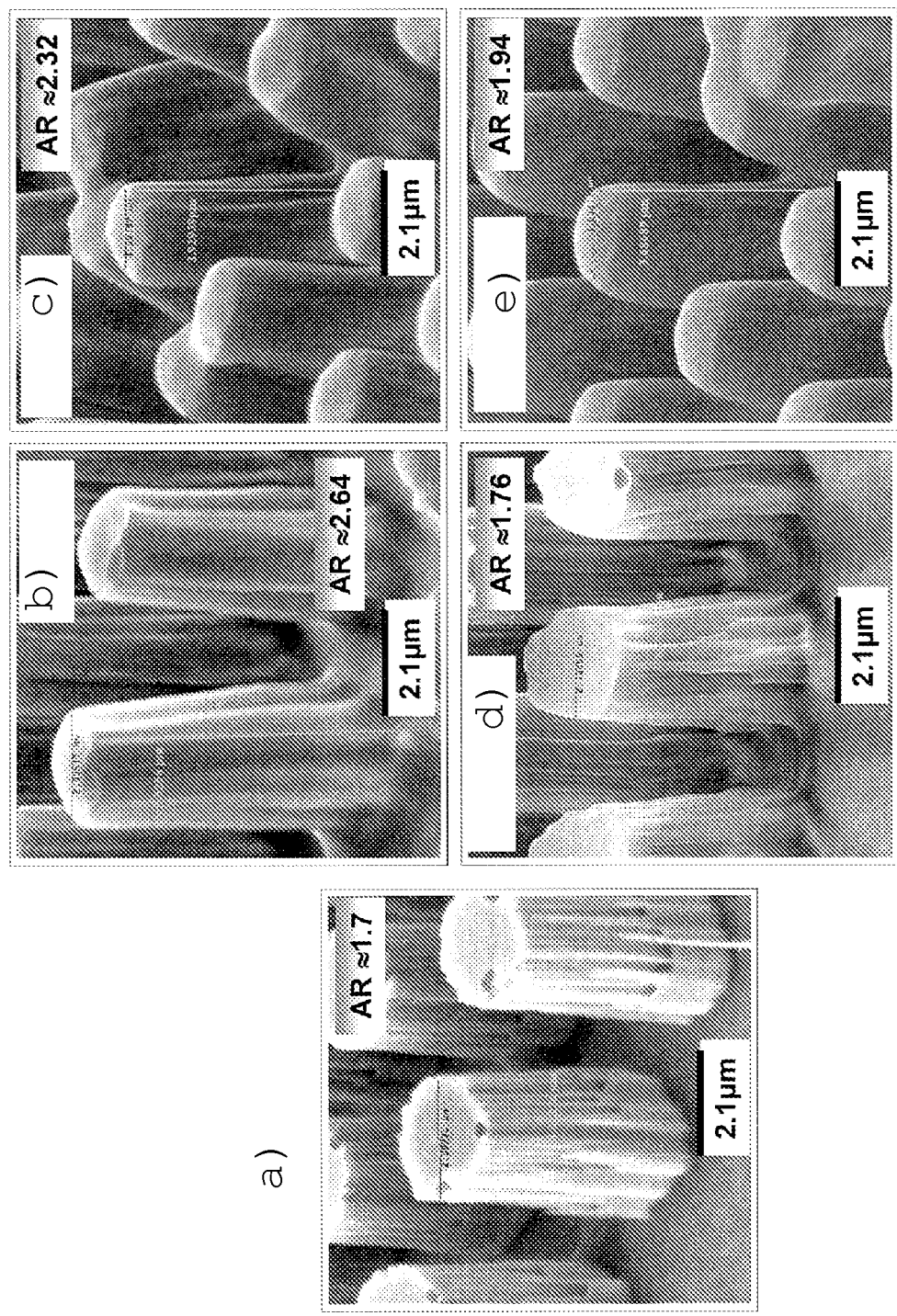
FIG. 11 SEM images of structures produced with various polymer blends for investigating the replication accuracy for structure S9.

FIGS. 9 to 11 show investigations of the replication quality of different polymers/polymer blends. The aspect ratio (AR), i.e. the ratio of the height of the structure to the diameter, is also shown.

The structures were produced in each case with a die made of PDMS by applying the radiation-curing coating compound. As reference as a) in each case a copy of the corresponding die is produced with PDMS (designated as "Original structure").

The structures produced are cylindrical structures with straight end face and a ratio of height to diameter on the end face between 0.6 and 1.7 measured on the reference copy in PDMS (shown as AR). This could have resulted from stretching of the structures during detachment from the die.

It can be seen from the figures that the polymer blend mixture 4 shows the lowest replication quality. The polymer blends mixture 1 and mixture 2 show an average replication quality. The best replication quality is found with mixture 3.

The production process appears to lead to a slight lengthening of the structures. The aspect ratio can increase by approx. 20 to 70%. However, it can be seen that the lateral grooves and edges of the structure also have good resolution for mixtures 1, 2 and 3.

Figure 12:
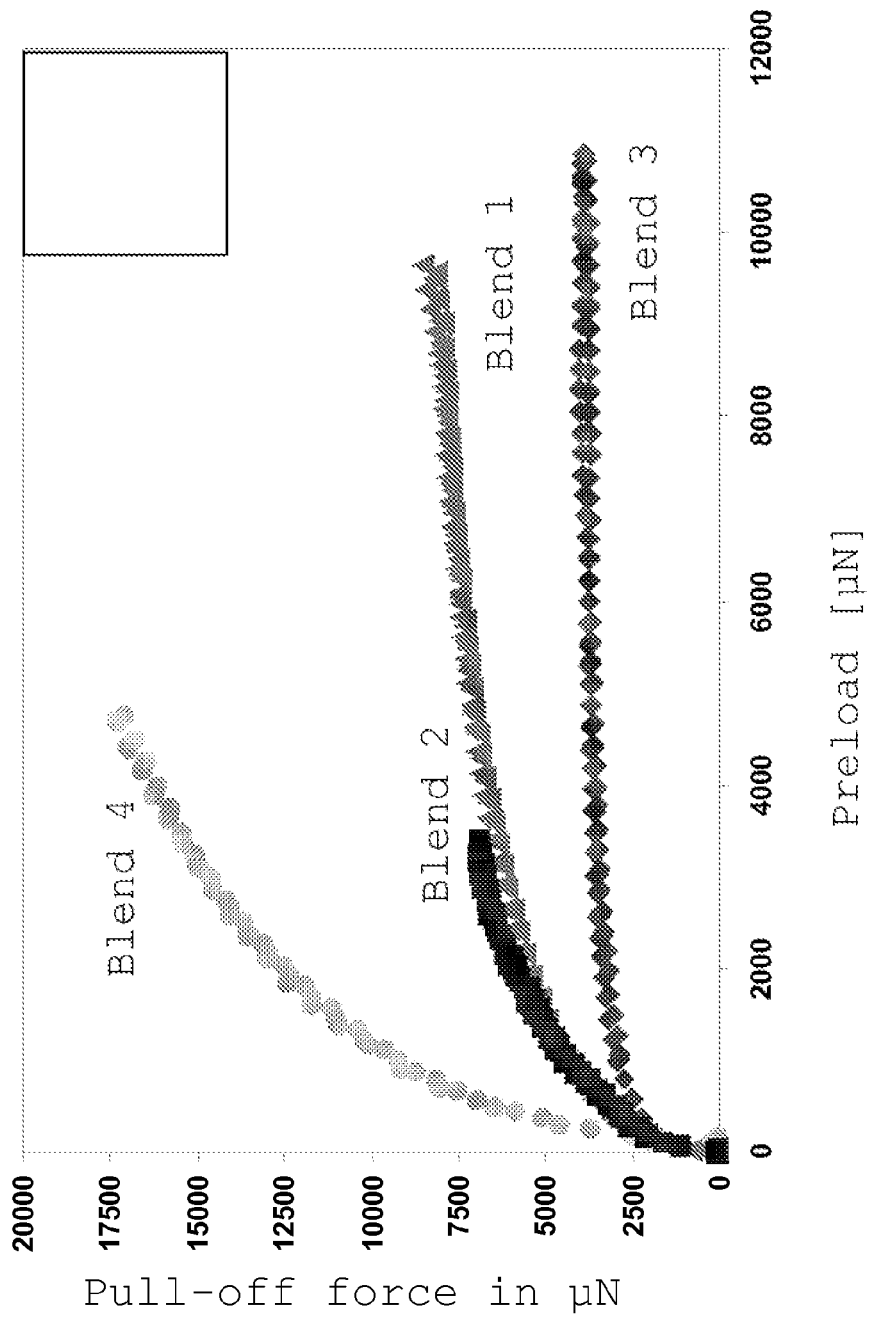
FIG. 12 Measurement of the basic adhesion of different polymers/polymer blends.

FIG. 12 shows measurement of the adhesion of unstructured surfaces of various polymers/polymer blends as a function of the preload. It can be seen that with increasing preload the adhesion is distributed as follows: blend 4>blend 1~blend 2>blend 3. Compared with the replication properties, it can be seen that basic adhesion decreases with increasing replication quality.

Figure 13:
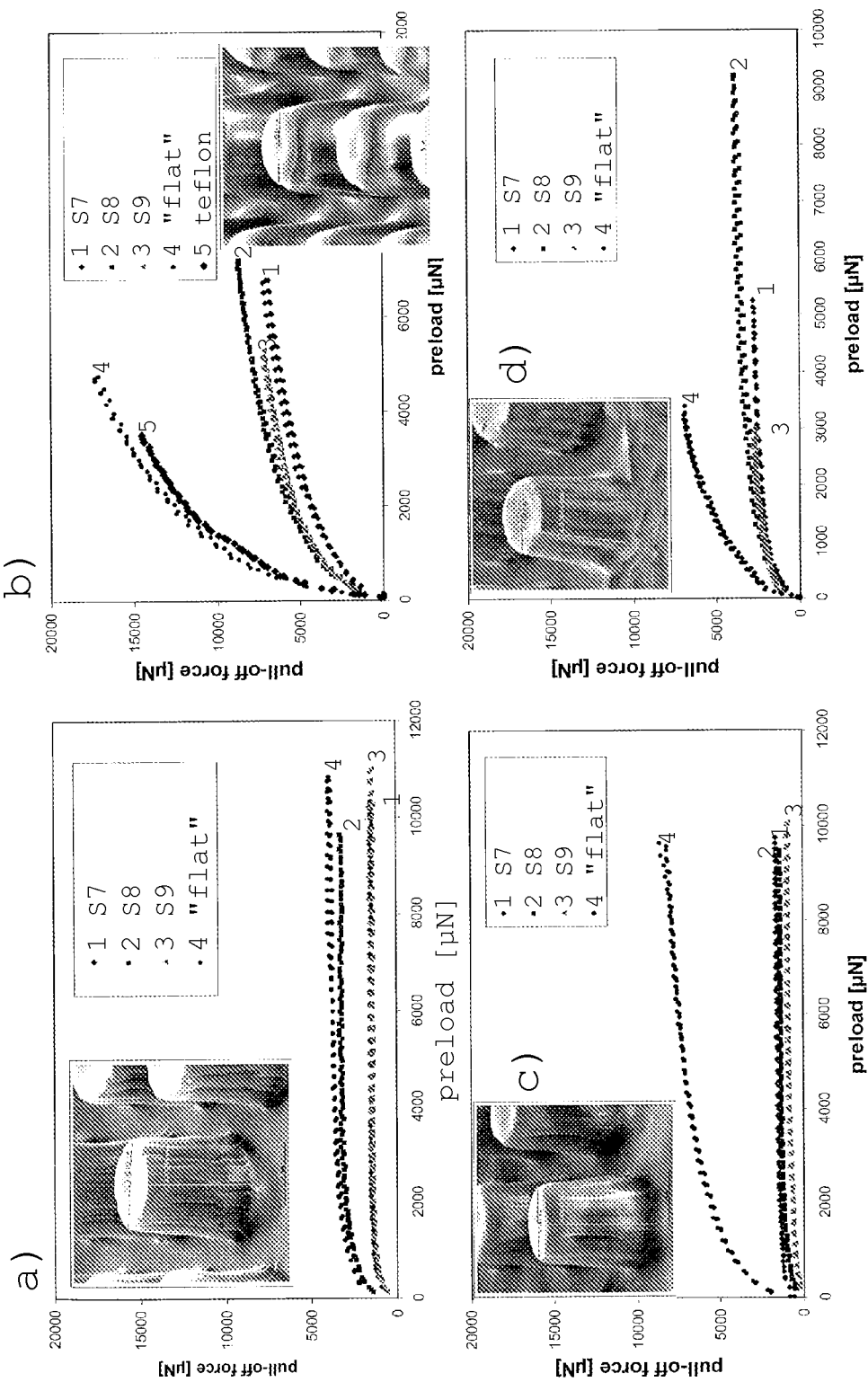
FIG. 13 Adhesion measurements of different polymer blends with different structures for determining structure fidelity (structure S7: 1; structure S8: 2; structure S9: 3; flat substrate: 4; Teflon: 5)

FIG. 13 shows the adhesion measurements of the various structures for different polymers/polymer blends. In each case the preload in µN is plotted against the pull-off force in µN. Thus, a) shows blend 3, b) blend 4, c) blend 1 and d) blend 2. "Flat" denotes an unstructured surface. These results correspond to the data from FIG. 12. "Teflon" denotes measurement against a surface coated with Teflon. Measurement on an unstructured PDMS surface gave a value of 1400 µN.

Figure 14:
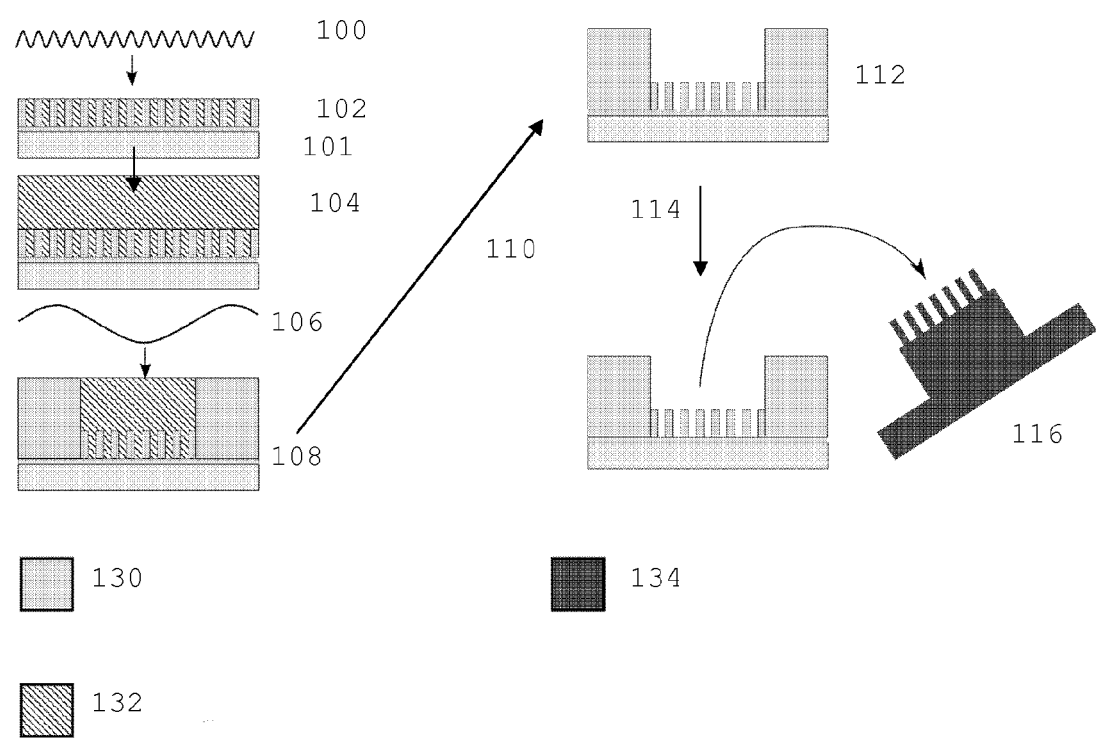
FIG. 14 Schematic representation of the production of a die by multiple interference lithography.

FIG. 14 shows a flowsheet for the production of a die for producing a fine structure on a surface 112. First an adhesion-promoting layer is optionally applied on a die substrate 101. A negative photoresist 102, e.g. SU-8, is applied on this layer. This can take place by spraying, by knife application, roller application or casting and optionally spin-coating. The layer thickness can be between 50 nm and 5 µm, preferably between 200 nm and 2 µm. Advantageously it is selected in such a way that the contact structure obtained from this layer has a height between 0.3 µm and 1 µm.

The layer is then dried. This can involve storage at room temperature or stoving processes, e.g. at 60° C. to 120° C. in a stove or on a hot-plate. The treatment time can be between 30 seconds and up to two hours.

Then the negative of the contact structure, or a partial structure of the contact structure, is exposed to light in this layer. This is performed for example with a 2-beam interference setup. This can result in a wave-like intensity distribution 100. It can also be exposed several times in order to obtain an arrangement with depressions arranged regularly in each direction. Advantageously it is exposed twice, turning the specimen through 90° between exposures. An arrangement of projections in a square grid can be achieved in this way. The pitch of this exposure is advantageously below 5 µm, preferably below 2 µm, but above 0.1 µm. In FIG. 14 the shaded regions (pattern 132) show unexposed photoresist and the regions with pattern 130 show exposed photoresist.

In the next step the layers are heat-treated. This can be carried out for example in a stove or on a hot-plate, e.g. at 90° C. to 130° C. The treatment can take between 30 seconds and up to two hours.

Optionally the last steps can be repeated, to apply another negative of a contact structure.

The structure obtained is not developed yet; another layer of negative photoresist 104 is applied. Advantageously it is the same photoresist as for the negative of the contact structure. The pedestal structure is to be exposed later in this layer. This layer is applied in a thickness of over 2 µm, preferably over 3 µm, up to a thickness of 30 µm, preferably up to 20 µm and especially preferably up to 15 µm. Advantageously it is applied in a thickness such that the pedestal structure obtained has a height between 3 and 10 µm.

The layer is dried similarly to the layers that have been applied up to now.

Then the negative of the pedestal structure, or a partial structure of the pedestal structure, is exposed in this layer. This takes place for example with a 3-beam interference setup. In this way a hexagonal intensity pattern can be produced. It can also be exposed several times and the orientation of the specimen can be varied. The pitch of this exposure 106 is advantageously below 20 μm, preferably below 15 μm, especially preferably below 10 μm, but it can even be below 7 μm. Advantageously it is greater than 2 μm, preferably greater than 3 μm. As a rule it is 2- to 10-times larger than the largest pitch for exposure of the contact structure (or of the negative of the contact structure). As a result of this exposure, which also has an effect on the still undeveloped lower layers of photoresist, larger completely exposed regions are produced in the photoresist layers. A pedestal structure 108 is obtained in this way.

In the next step the layers are heat-treated. This can take place for example in a stove or on a hot-plate, e.g. at 90° C. to 130° C. The treatment can last between 30 seconds and up to two hours.

In the next step 110, all layers are developed at the same time. The developer is selected depending on the photoresist used, and is known by a person skilled in the art. In the case of SU-8, for example mr-dev 600 from microresist technology GmbH can be used. As a result, the die 112 for a fine structure is obtained in one step.

Then the die obtained can be copied in an elastomer 116, e.g. PDMS (step 114). This elastomer can also be used for producing further dies by embossing or replication. However, it is also suitable in particular for the method for structuring surfaces described above. If the photoresist is not suitable as material, the replica 116 obtained can also be used for producing a die for a fine structure.

The die shown in FIG. 4b was produced by the method described above. For this, first the structure with the smaller pitch was exposed in a photoresist layer (SU 8). For this, the specimen was exposed twice in a 2-beam interference setup, the specimen being turned through 90° C. between exposures. The cross lattice of the resultant projections can clearly be seen in the diagram. The pitch of the exposure was 1 μm. Then the pedestal structure was exposed in a second applied photoresist layer. A 3-beam interference setup was used in this case. The resultant pedestal structure therefore has a hexagonal arrangement. The pitch of the exposure was 10 μm. The difference between the two arrangements can be seen clearly in FIG. 4b. After the exposures, the shape could be obtained in just one development step. FIG. 4a shows a replica of the die in PDMS (ElastosilRT604).

Figure 15:
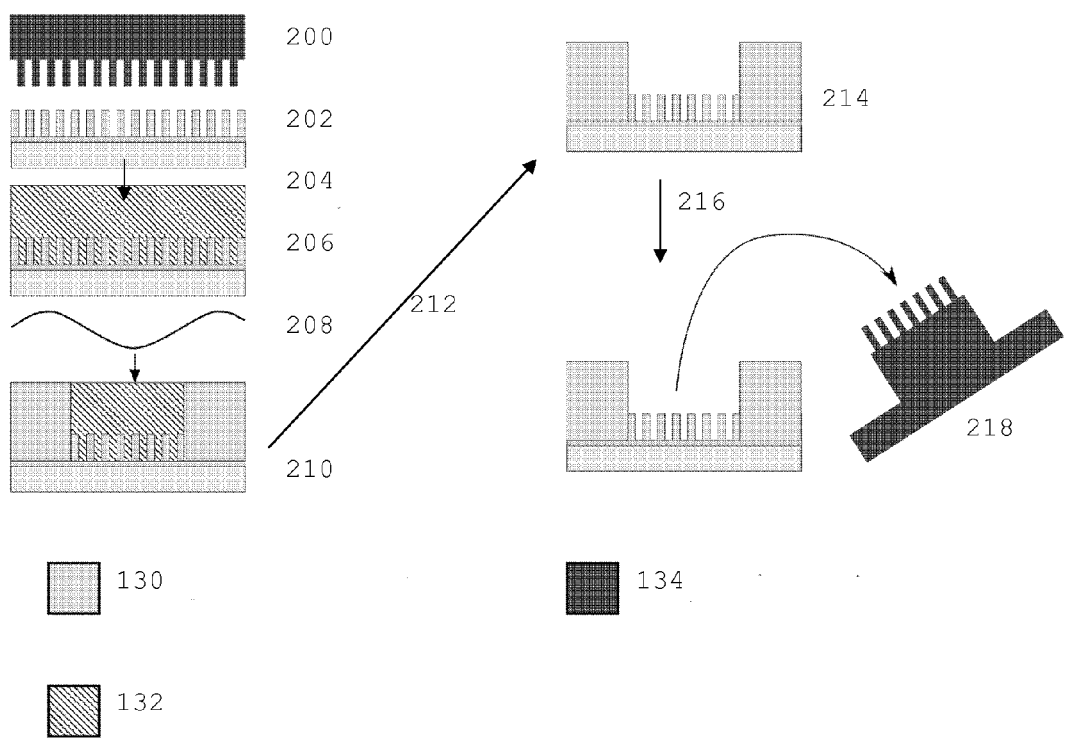
FIG. 15 Schematic representation of the production of a die by a combination of microreplication and interference lithography.

FIG. 15 shows another variant of the method described above. In contrast to exposure of the negative of the contact structure, the negative of the contact structure is embossed in the applied photoresist 202 by means of a stamp 200 and the embossed photoresist is then cured. Then the negative of the pedestal structure is applied as described above. Thus, another layer of photoresist is applied for the pedestal structure 204. This photoresist 206 also fills the already embossed structure 202. Then it is exposed with a larger pitch 208, to form the pedestal structure 210 in the photoresist. Then, as already described, all photoresist layers are developed at the same time (step 212). The die 214 of the fine structure is obtained. This can be replicated with an elastomer 218, as already described (step 216).

The master for embossing the negative contact structure can be obtained as follows. First a substrate, like the substrates for the die, is coated with a photoresist, preferably a positive photoresist. It may be necessary to apply an adhesion promoter on the substrate beforehand.

Then the coating is heat-treated.

In the next step, as already described, the contact structure is exposed to light. This can be carried out for example with a 2-beam interference setup, exposing twice and turning the specimen through 90° between exposures.

Then the structure is developed. This can be carried out for example with potassium hydroxide solution. By using a positive photoresist, during development there is formation of the negative of the structure that is obtained when using a negative photoresist.

The structure obtained is replicated in a first elastomer, e.g. silicone, for example Sylgard® 184 from Dow Corning. Other materials can also be used, e.g. nickel.

To get from the replicated structure to the master for embossing the negative of the contact structure, the structure obtained in the last step must be replicated once again.

Once again an elastomer can be used for this, e.g. elastic polyurethane, for example PolyOptic® 1470 from PolyConForm. The two elastomers must not react with each other during polymerization and must also be detachable from one another afterwards.

The replicated structure obtained in the last step is the master for embossing the negative of the contact structure.

Figure 16:
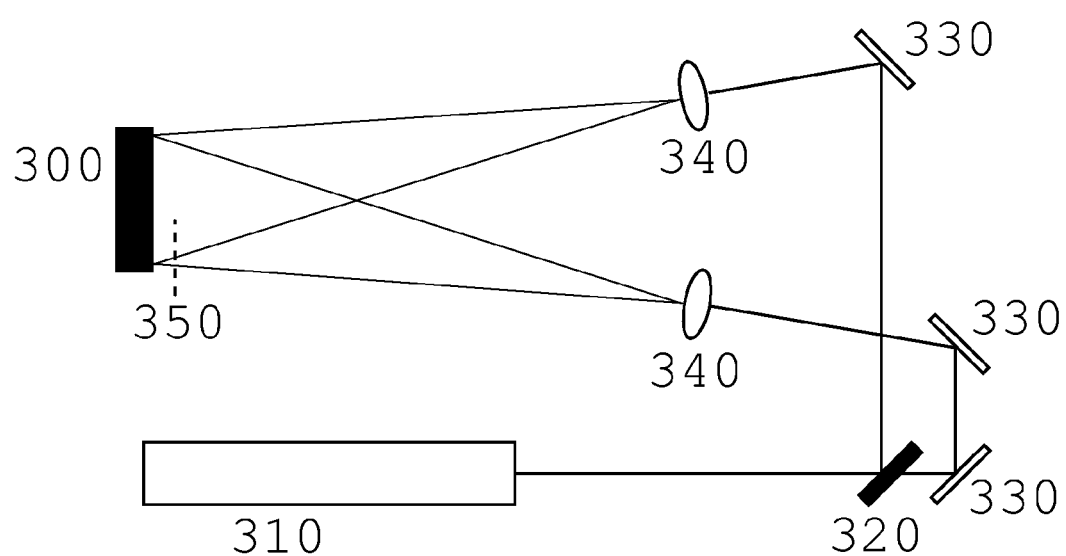
FIG. 16 Schematic representation of a 2-beam interference setup.

FIG. 16 shows a schematic representation of a 2-beam interference setup. In this, two beams are superposed on a die substrate 300 coated with photoresist. For this, a laser 310 is split by a beam splitter 320 into two beams preferably of equal intensity and is led over several mirrors 330. By means of two lenses 340, the two beams are fanned out and led onto the surface of the substrate. In the region where the two beams 350 overlap there is interference of the two beams. In this way a corresponding interference pattern can be obtained on the surface of the die substrate. When two beams are used, there is formation of lines, as shown for example in FIG. 2. To obtain demarcated projections, the specimen can be exposed several times, with rotation of the die substrate. For example, when the specimen is turned through 90° C. and then exposed again, a criss-cross pattern can be obtained. The distance between die substrate and lenses determines, in addition to the wavelength, the order of size of the exposed structure.

Figure 17:
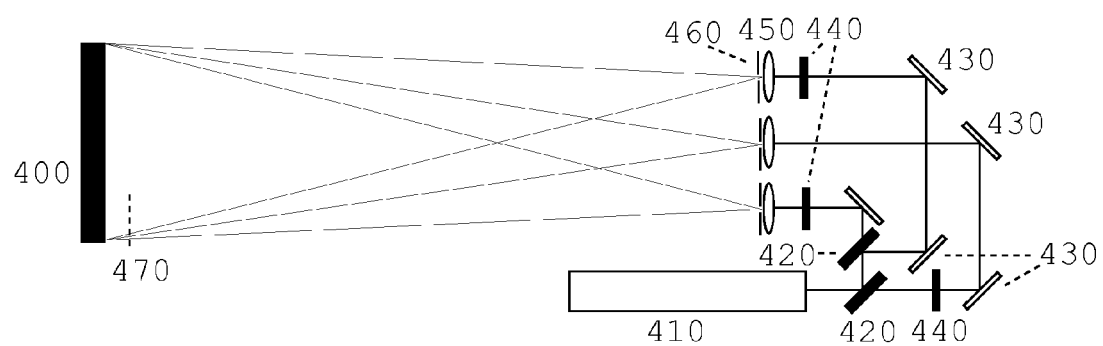
FIG. 17 Schematic representation of a 3-beam interference setup.
Figure 18:
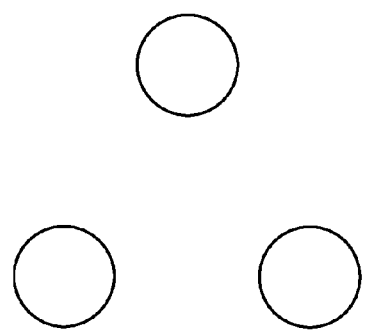
FIG. 18 Example for a lens arrangement for a 3-beam interference setup.

FIG. 17 shows a schematic representation of a 3-beam interference setup. In this, a total of three beams are superimposed on a die substrate 400 coated with photoresist. For this, a laser beam (e.g. argon laser 363 nm) is split by a combination of two beam splitters 420 into a total of three beams of equal intensity. The first beam splitter splits in the intensity ratio 2:1 and the second splits the stronger beam from the first beam splitter in the ratio 1:1. The beams are led by several mirrors 430 and λ/2-plates (440, to compensate polarization effects) onto three lenses 450. The lenses fan out the three beams. It is also possible for diaphragms 460 to be arranged in front of the lenses. By superimposing the three beams, interference occurs in region 470. A corresponding intensity distribution is exposed on the die substrate. The three lenses do not have to be located in one plane. Thus, one lens can be arranged away from the line joining the other two lenses. Thus, the lenses 450 can for example be arranged in the form of an equilateral triangle, as shown in FIG. 18. The distance of the lenses from the die substrate allows simple adjustment of the order of size of the structure.

Measurement of Adhesion:

For determination of adhesion, a sapphire sphere with diameter of 2.5 mm was pressed against the specimens at a speed of 2 μm/s. The input parameter is the "piezo displacement". This gives the displacement of the specimen during the measurement. The deflection of a measuring spring, on which the sapphire sphere is fastened, is obtained as the output signal. By calibration, it is thus possible to determine the forces arising during the measurement. In FIG. 5, positive forces correspond to a load applied on the specimen, whereas negative forces describe the adhesion. For measurements of adhesion as a function of the preload, the sphere was pressed against the specimen up to the corresponding preload (corresponding to deflection of the measuring spring*spring constant). The adhesion force (pull-off force) can be obtained from the deflection of the measuring spring on retracting the sphere.

Measurement of Elastic Modulus:

The indentation modulus of the cured blends was measured with a TI950 Nanoindenter instrument (Hysitron Inc., Minneapolis, Minn., USA). A Berkovich tip was used. The specimen preload was 500 nN. Before each measurement, the tip was brought in contact with the specimen for 10 minutes with the given preload to stabilize the system and to minimize thermal drift. The indentations were carried out under displacement control with a three-part load curve: first, a first linear load at 200 nm/s to a depth of penetration of 2000 nm (indentation time 10 s), followed by a holding time of 30 s at maximum load and then load reduction at 200 nm/s (retraction time 10 s). The area of the Berkovich tip was estimated by measurement on a quartz standard (Quartz fused) with a depth of penetration from 30 to 140 nm. The calculated tip diameter of the Berkovich tip was between 50 and 60 nm. Twenty tests were carried out per specimen. The Oliver-Pharr method was used for calculating the elastic modulus of the cured specimens.

Example 1

Production of the Dies from Polydimethylsiloxane (PDMS) ("Original Structure")

A composition was prepared from PDMS Sylgard 184 base and PDMS Sylgard 184 cure agent in the ratio of 10:1 (both from Dow Corning, Midland, Mich.). The mixture was degassed for one hour under vacuum to prevent bubble formation. The mixture was applied on a structured silicon surface (structures on the wafer were produced by photolithography and "reactive ion etching-Elmar") and were cured for 14 hours at 95° C.

Example 2

The surface of the PDMS die from example 1 was treated with a self-assembled monolayer (SAM) of trichloro(1H,1H,2H,2H-perfluorooctyl)silane to ensure good detachability of the die from the structured surface produced.

Example 3

The structured nickel surface was purchased from Temicon Company. It has microstructures with a diameter of 4 μm and a length of 15 μm.

Example 4

The surface of the die from example 3 was activated with plasma and then modified with trichloro(1H,1H,2H,2H-perfluorooctyl)silane, to ensure easy detachment of the die.

Example 5

Production of the Structures by Forming

Soft forming was carried out with the PDMS die from example 2. A frame of PET film with a thickness of 75 μm was applied on the die. The thickness of this PET film is proportional to the thickness of the unembossed portion of the subsequent polyacrylate layer. The UV-curing polyacrylate blends (blends 1, 2, 3 and 4) were cast in the region of the die delimited by the frame. Then a PET film was pressed against the blends. This PET film serves later as substrate for the structured surface. The polyacrylate blends were irradiated with UV light for 5 minutes and then detached from the die. The light source used was a short-wave 1000 W Hg (Xe) lamp (Lot-Oriel instruments). The intensity of the UV lamp was 28.4 mW at a distance between specimen and lamp of 4 cm. With a spectral irradiation density of 144.676 mW/cm$^2$ for 300 s, an optical energy of 43402.8 mJ/cm$^2$ was transferred to the surface. The die and the polyacrylate layer were in contact during irradiation. The structures produced are shown in FIGS. 9 to 11. In the case of a), castings were produced from PDMS.

Example 6

Production of Fine Structures by Forming with Hard Die

The method was carried out with the nickel die from example 3. A frame of PET film with a thickness of 75 μm was applied as spacer on the die. The thickness of the film is proportional to the thickness of the later unembossed portion of the polyacrylate layer. A UV-curing polyacrylate blend (blend 2) was cast in the region of the matrix surrounded by the frame. Then a PET film was pressed against the liquid mass. This film also serves later as supporting substrate of the structured coating. After 5 minutes, the PET film and the cured polyacrylate blend were detached from the die. The light source used for exposure was a short-wave 1000 W Hg (Xe) lamp (Lot-Oriel instruments). The intensity of the UV lamp was 28.4 mW at a distance between specimen and lamp of 4 cm. At a spectral irradiation density of 144.676 mW/cm$^2$ for 300 s, an optical energy of 43402.8 mJ/cm$^2$ was transferred to the substrate. The polyacrylate layer and the die were in contact during exposure.

Example 7

The die for structure S1 was produced using interference lithography in the 3-wave setup for hexagonal structures (hexagonal arrangement). For this, three beams are superimposed to produce an interference pattern. This allows sharp hexagonal structures to be produced. The three beams, from three lenses, impinge at a defined angle on the surface to be exposed. This angle defines the pitch of the resultant pattern. The three lenses can be arranged in the form of an equilateral triangle, giving a symmetrical pattern. The distance of the substrate from the lenses and the distance of the latter determines the angle and therefore the pitch of the intensity distribution of the interference. For example, at a distance of the lenses along the sides of the triangle of 18.4 cm and a distance from the substrate of 3.5 m, a target pitch of 8 μm can be obtained (wavelength of the laser 363.8 nm). The photoresist used was a photoresist AZ9260 from the company AZ Electronic Materials. Potassium hydroxide solution was used for development. A replica in PDMS is shown in FIG. 1.

Example 8

The die for structure S2 was produced as in example 7. However, in order to obtain lines, only a 2-wave setup with simple exposure was used. FIG. 2 shows a replica in PDMS.

Example 9

The production of the dies for structure S3 was similar to example 7, but with interference lithography in the 2-wave setup with double exposure with rotation of the specimen through 90°. A criss-cross grid structure of the projections is obtained in this way.

Example 10

A die made of nickel (similar to example 3; hole diameter 5 μm; depth 15 μm) was fitted on a roll of a roll-to-roll printing machine. Blend 3 was applied in a thickness of 400 μm on a PET film and brought in contact with the die without pressure. The blend was exposed to light for 5 minutes while in contact with the die. A 1000 W arc lamp (Thermo-Oriel instruments) was used. The intensity of the UV lamp was 20.3 mW at a distance between specimen and lamp of 4 cm. At a spectral irradiation density of 103.41 mW/cm² for 300 s, an optical energy of 31023.94 mJ/cm² was transferred to the surface. The structures shown in FIGS. 7 and 8 were obtained. Although the die was cleanly replicated, there was only incomplete filling of the die.

Example 11

Figure 23:
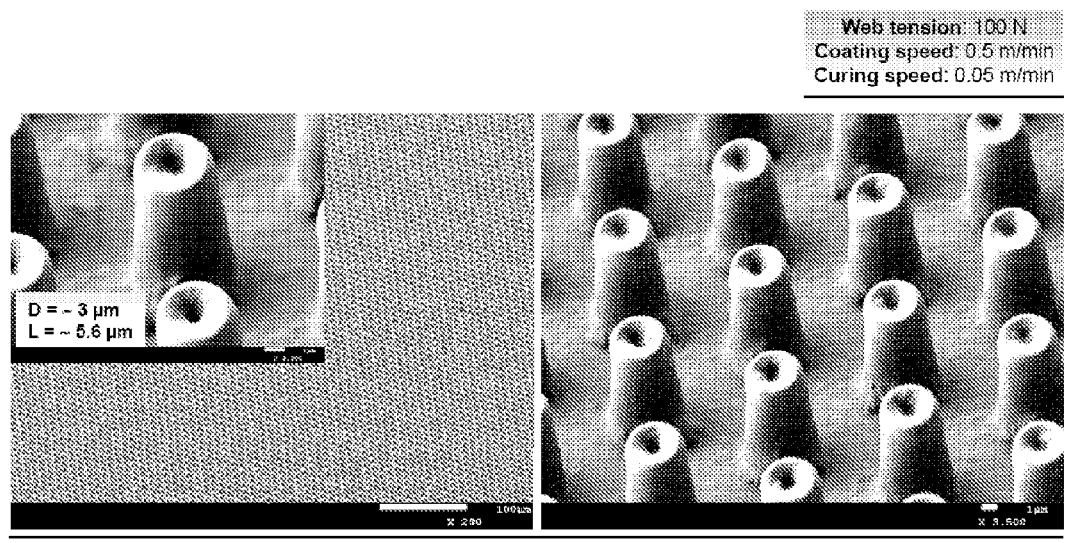
FIG. 23 shows a structure produced (blend 5).
Figure 24:
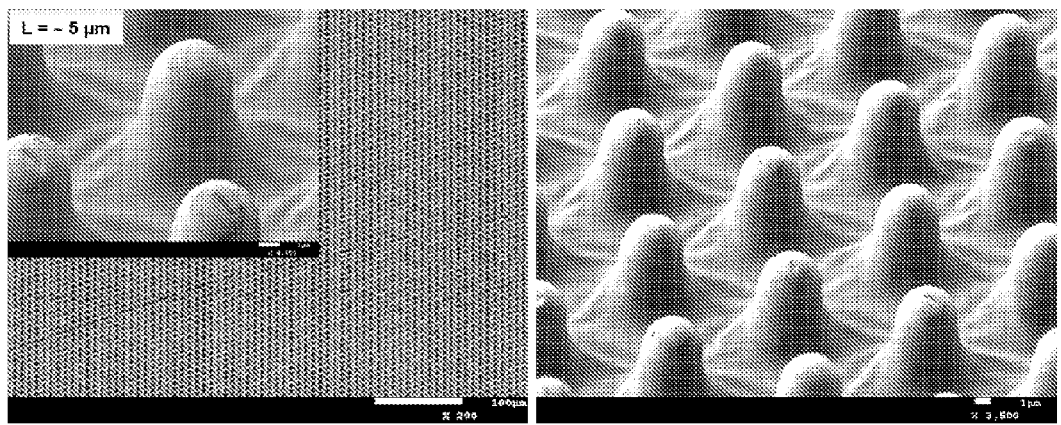
FIG. 24 shows a structure produced (blend 6).

The possible shear loading of a strip of a structured PET film was measured. For this, structures were produced with two specimens blend 5; printing process with 5 min UV-curing (viscosity before UV-curing: 39 mPas, elastic modulus: 4 MPa) and blend 6; printing process with 5 min UV-curing (viscosity before UV-curing: 91 mPas, elastic modulus: 3 MPa). FIGS. 23 (blend 5) and 24 (blend 6) show the structures produced.

A strip of these two structured PET films of 1*3.5 cm withstands a shear loading of 570 g (glass plate). In a first test, the structure from the material blend 5 was also able to withstand 730 g for a short time.

Further application tests gave the following results:

A PET film (Milinex 505, approx. 85μ) with the structures of blends 5 and 6 were applied by roller in a test climate of 23° C. and 50% relative humidity on sheet steel or glass on an area of 25×25 mm, left for 10 min and the shear strength was determined with a test specimen of 1 kg. The time in hours to detachment of the test specimen was measured. The nature of fracture of the glued area was also determined (here: adhesive fracture, i.e. complete detachment of the glued area from the substrate).

|  | Shear strengths in hours | | | |
|---|---|---|---|---|
|  | Steel | | Glass | |
| Structured blend 5 | 2.1 | A | 20.5 | A |
| Structured blend 6 | 2.8 | A | 34.1 | A |

A = adhesive fracture

Figure 25:
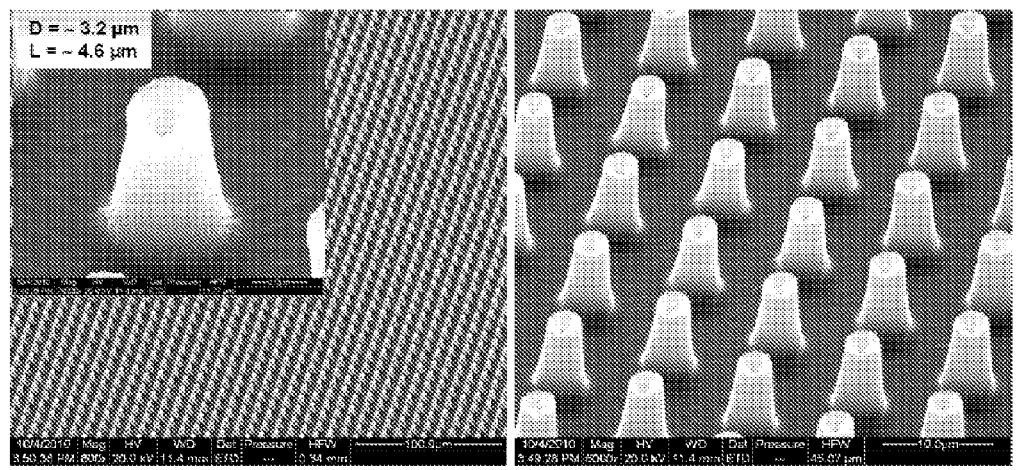
FIG. 25 shows a structure produced (blend 7).
Figure 26:
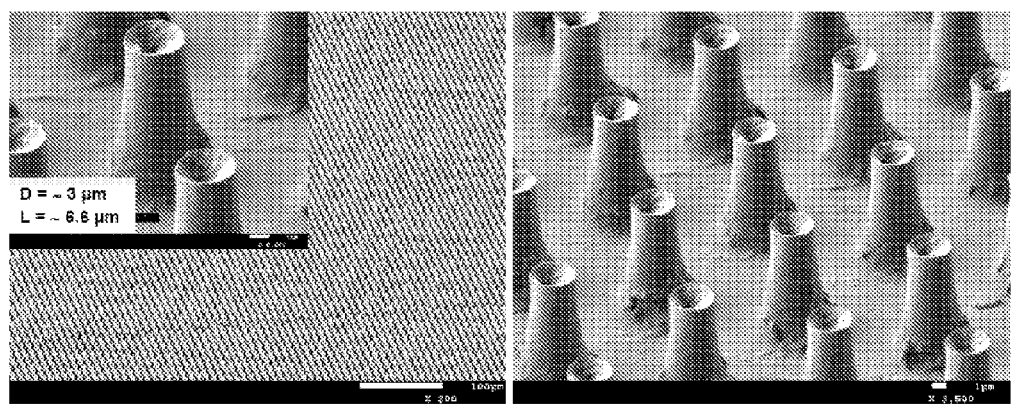
FIG. 26 shows a structure produced (blend 8).

Structures could also be printed with blends 7 and 8. FIGS. 25 (blend 7) and 26 (blend 8) show the structures obtained.

REFERENCE SYMBOLS 50 laser interferometer
52 glass spring and measurement substrate
54 piezoelement
56 6-axis table
60 approach
62 preload
64 specimen retraction ("retreat")
66 specimen detachment force ("pull-off force")
100 intensity distribution of exposure to light
101 die substrate
102 layer of negative photoresist
104 layer of negative photoresist
106 intensity distribution (pitch) of exposure
108 pedestal structure
110 development of all layers
112 die with fine structure
114 replication of the die
116 replicated elastomer
130 exposed photoresist
132 unexposed photoresist
134 elastomer
200 stamp
202 embossed layer of photoresist
204 photoresist
206 embossed layer of photoresist
208 intensity distribution of exposure
210 pedestal structure
212 development of all layers
214 die with fine structure
216 replication of the die
218 replicated elastomer
300 die substrate
310 laser
320 beam splitter
330 mirror
340 lens
350 interference region
400 die substrate
410 laser
420 beam splitter
430 mirror
440 λ/2-plate
450 lens
460 diaphragm
470 interference region

TABLE 1

| Specimen | Height (measured from base) [μm] | Diameter (measured on the end face) [μm] | Aspect Ratio (AR) |
|---|---|---|---|
| Structure S7 (FIG. 9) | | | |
| a) "Original structure" | 3.97 | 6.61 | ~0.60 |
| b) Blend 1 | 6.29 | 6.35 | ~1 |
| c) Blend 2 | 6.12 | 5.84 | ~1 |
| d) Blend 3 | 5.65 | 5.87 | ~0.96 |
| e) Blend 4 | 7.55 | 5.39 | ~1.4 |
| Structure S8 (FIG. 10) | | | |
| a) "Original structure" | 4.29 | 4.41 | ~1 |
| b) Blend 1 | 5.53 | 3.80 | ~1.45 |
| c) Blend 2 | 4.92 | 3.88 | ~1.27 |
| d) Blend 3 | 4.94 | 3.98 | ~1.24 |
| e) Blend 4 | 3.92 | 3.58 | ~1 |
| Structure S9 (FIG. 11) | | | |
| a) "Original structure" | 4.07 | 2.40 | ~1.7 |
| b) Blend 1 | 5.5 | 2.09 | ~2.64 |
| c) Blend 2 | 3.93 | 1.68 | ~2.32 |
| d) Blend 3 | 3.82 | 2.19 | ~1.76 |
| e) Blend 4 | 3.67 | 1.89 | ~1.94 |

References
EP 1 513 904 B1
DE 100 01 135 A1
DE 10 2007 021 249 A1
WO 01/49776 A2

TABLE 1-continued

| Specimen | Height (measured from base) [μm] | Diameter (measured on the end face) [μm] | Aspect Ratio (AR) |
|---|---|---|---|

WO 2009/053714 A1
DE 100 13 186 A1
DE 100 13 187 A1
EP 71 050 B1
EP 71 050 A1
U.S. Pat. No. 4,421,602
EP 0 464 043 B1
U.S. Pat. No. 5,225,088
EP 0 411 400 A2
DE 24 34 816 A1
U.S. Pat. No. 4,066,494
WO 94/12560 A1
WO 94/14873 A1
WO 97/25367
EP 7 508 A2
EP 57 474 A2
DE 196 18 720 A1
EP 0 495 751 A1
EP 0 615 980 A2
DE 198 26 712 A1
DE 199 13 353 A1
WO 98/33761 A1
DE 199 57 900 A1
EP 0 092 269 A1
EP 0 464 043 B1
WO 97/25367 A1

"Advances in Polymer Science", Volume 14, Springer Berlin 1974 K. K. Dietliker, Chemistry and Technology of UV- and EB-Formulation for Coatings, Inks and Paints, Volume 3; Photoinitiators for Free Radical and Cationic Polymerization, P. K. T. Oldring (Eds), SITA Technology Ltd, London D. A. Wicks, Z. W. Wicks, Progress in Organic Coatings, 36, 148-172 (1999)

D. A. Wicks, Z. W. Wicks, Progress in Organic Coatings, 41, 1-83 (2001)

D. A. Wicks, Z. W. Wicks, Progress in Organic Coatings, 43, 131-140 (2001).

Polymer Handbook, 2nd ed., Wiley & Sons, New York

The invention claimed is:

1. A method for producing finely structured coated surfaces with an aspect ratio of at least 0.5 for influencing adhesion comprising:
   a) applying at least one coating compound on at least one substrate, wherein the at least one coating compound comprises a radiation-curing coating compound having a double bond density of not more than 7 mol/kg, said radiation-curing coating compound comprising a polyester-, polyether-, carbonate-, epoxy- or urethane(meth) acrylate; or an unsaturated polyester resin;
   b) forming a fine structure by a die, which has a negative of the fine structure, wherein
      b1) the die is pressed against the coating compound on the substrate or
      b2) the substrate from step a) contains the die;
   c) curing the resultant finely structured coating compound, obtaining a substantially cured coating;
   d) separating the finely structured coating from the die, wherein steps d) and c) can also be carried out in any order, and
   wherein the coating compound, in a solvent-free state before application on the substrate, has a viscosity below 10 Pa·s, and
   wherein the cured coating has an elastic modulus of at least 1 and up to 100 MPa.

2. The method as claimed in claim 1, wherein the radiation-curing coating compounds comprise polyester-, polyether-, carbonate-, epoxy- or urethane(meth)acrylates, which are partially amine-modified.

3. The method as claimed in claim 1, wherein the radiation-curing coating compound comprises
   at least one polyester-, polyether-, carbonate-, epoxy- or urethane(meth)acrylate or unsaturated polyester resin,
   optionally at least one reactive thinner,
   optionally at least one photoinitiator,
   optionally at least one solvent,
   optionally at least one stabilizer, and
   optionally at least one additive, selected from the group consisting of activators, fillers, pigments, dyes, thickeners, thixotropic agents, surfactants, viscosity modifiers, plasticizers and chelating agents.

4. The method as claimed in claim 1, wherein the substrate is selected from the group consisting of polyethylene terephthalate, polypropylene, polyethylene and polymethyl methacrylate.

5. The method as claimed in claim 1, wherein the die is a die with a hierarchic fine structure.

6. A method for producing finely structured coated surfaces according to claim 1, wherein the surface has projections and/or depressions with at least one dimension in a range of 100 nm to 750 μm.

7. A method for producing finely structured coated surfaces according to claim 1, wherein the at least one coating compound comprises a radiation-curing coating compound having a double bond density of at least 0.1 mol/kg.

8. The method as claimed in claim 1, wherein the coating compound, in a solvent-free state before application on the substrate, has a viscosity below 1 Pa·s.

9. The method as claimed in claim 1, wherein the radiation-curing coating compound has a double bond density of 4.8 to 7 mol/kg.

10. The method as claimed in claim 1, wherein the radiation-curing coating compound comprises polyester (meth)acrylates that are esters of α,β-ethylenically unsaturated carboxylic acids with polyester polyols.

11. The method as claimed in claim 1, wherein the radiation-curing coating compound comprises polyether (meth)acrylates that are the esters of acrylic acid with polyetherols.

12. The method as claimed in claim 1, wherein the cured coating has an elastic modulus of 2 to 20 MPa.

13. The method as claimed in claim 1, wherein the coating compound, in a solvent-free state before application on the substrate, has a viscosity of 10 mPa·s to 600 mPa·s.

14. The method as claimed in claim 1, wherein the radiation-curing coating compound comprises carbonate- or urethane(meth)acrylates; or unsaturated polyester resins.

15. A method according to claim 1, wherein the surface has projections and/or depressions with at least one dimension in a range of 250 μm to 750 μm.

16. The method as claimed in claim 1, wherein said radiation-curing coating compound comprising a polyester-, carbonate-, epoxy- or urethane(meth)acrylate; or an unsaturated polyester resin.

17. The method as claimed in claim 1, wherein the substrate is selected from the group consisting of polypropylene, polyethylene, and polymethyl methacrylate.

* * * * *